United States Patent
Igarashi et al.

(10) Patent No.: US 10,062,642 B2
(45) Date of Patent: Aug. 28, 2018

(54) SEMICONDUCTOR DEVICE WITH INDUCTIVELY COUPLED COILS

(71) Applicant: Renesas Electronics Corporation, Tokyo (JP)

(72) Inventors: Takayuki Igarashi, Kanagawa (JP); Takuo Funaya, Kanagawa (JP)

(73) Assignee: Renesas Electronics Corporation, Tokyo (*) Notice: Subject to any disclaimer, the term of this patent is extended or adjusted under 35 U.S.C. 154(b) by 0 days.

(21) Appl. No.: 15/616,151

(22) Filed: Jun. 7, 2017

(65) Prior Publication Data
US 2017/0317024 A1 Nov. 2, 2017

Related U.S. Application Data

(63) Continuation of application No. 14/418,116, filed as application No. PCT/JP2014/051982 on Jan. 29, 2014, now Pat. No. 9,711,451.

(51) Int. Cl.
*H01L 27/08* (2006.01)
*H01L 23/522* (2006.01)
(Continued)

(52) U.S. Cl.
CPC .... *H01L 23/5227* (2013.01); *H01L 23/49503* (2013.01); *H01L 23/49541* (2013.01);
(Continued)

(58) Field of Classification Search
CPC ........... H01L 23/5227; H01L 23/49541; H01L 24/06; H01L 27/1203; H01L 23/53214;
(Continued)

(56) References Cited

U.S. PATENT DOCUMENTS 6,982,477 B2 1/2006 Adan
8,004,054 B2 8/2011 Nakashiba
(Continued)

FOREIGN PATENT DOCUMENTS

JP 2001-036017 A 2/2001
JP 2003-309184 A 10/2003
(Continued)

OTHER PUBLICATIONS

Extended European Search Report dated Feb. 13, 2018, in European Patent Application No. 14824341.3.

*Primary Examiner* — Allen Parker
*Assistant Examiner* — Ismail Muse
(74) *Attorney, Agent, or Firm* — Shapiro, Gabor and Rosenberger, PLLC

(57) ABSTRACT

Characteristics of a semiconductor device are improved. A semiconductor device includes a coil CL1 and a wiring M2 formed on an interlayer insulator IL2, a wiring M3 formed on an interlayer insulator IL3, and a coil CL2 and a wiring M4 formed on the interlayer insulator IL4. Moreover, a distance DM4 between the coil CL2 and the wiring M4 is longer than a distance DM3 between the coil CL2 and the wiring M3 (DM4>DM3). Furthermore, the distance DM3 between the coil CL2 and the wiring M3 is set to be longer than a sum of a film thickness of the interlayer insulator IL3 and a film thickness of the interlayer insulator IL4, which are positioned between the coil CL1 and the coil CL2. In this manner, it is possible to improve an insulation withstand voltage between the coil CL2 and the wiring M4 or the like, where a high voltage difference tend to occur. Moreover, a transformer formation region 1A and a seal ring formation region 1C surrounding a peripheral circuit formation region 1B are formed so as to improve the moisture resistance.

18 Claims, 43 Drawing Sheets

(51) Int. Cl.
- *H01L 25/16* (2006.01)
- *H01L 23/495* (2006.01)
- *H01L 23/528* (2006.01)
- *H01L 27/06* (2006.01)
- *H01L 27/12* (2006.01)
- *H01L 23/00* (2006.01)
- *H01L 23/532* (2006.01)

(52) U.S. Cl.
CPC .... *H01L 23/49575* (2013.01); *H01L 23/5283* (2013.01); *H01L 23/53214* (2013.01); *H01L 24/06* (2013.01); *H01L 24/49* (2013.01); *H01L 25/167* (2013.01); *H01L 27/0688* (2013.01); *H01L 27/1203* (2013.01); *H01L 23/53223* (2013.01); *H01L 24/45* (2013.01); *H01L 2224/02166* (2013.01); *H01L 2224/05554* (2013.01); *H01L 2224/45124* (2013.01); *H01L 2224/48137* (2013.01); *H01L 2224/48227* (2013.01); *H01L 2224/49171* (2013.01); *H01L 2224/49175* (2013.01); *H01L 2924/13055* (2013.01)

(58) Field of Classification Search
CPC ............... H01L 27/0688; H01L 25/167; H01L 23/5283; H01L 23/49575; H01L 23/49503; H01L 24/49; H01L 2224/48227; H01L 2224/02166
See application file for complete search history.

(56) References Cited

U.S. PATENT DOCUMENTS

| | | | |
|---|---|---|---|
| 8,704,334 | B2 | 4/2014 | Nakashiba |
| 9,711,451 | B2 * | 7/2017 | Igarashi .............. H01L 23/5227 |
| 2004/0195692 | A1 | 10/2004 | Adan |
| 2005/0230837 | A1 | 10/2005 | Taghizadeh-Kaschani |
| 2006/0234459 | A1 | 10/2006 | Tani |
| 2009/0102059 | A1 | 4/2009 | Ishii |
| 2009/0140359 | A1 | 6/2009 | Nakashiba |
| 2009/0302420 | A1 | 12/2009 | Nakashiba |
| 2009/0309688 | A1 | 12/2009 | Kawano |
| 2010/0230783 | A1 | 9/2010 | Nakashiba |
| 2010/0265024 | A1 | 10/2010 | Nakashiba |
| 2011/0002076 | A1 | 1/2011 | Sakai |
| 2011/0148549 | A1 | 6/2011 | Kanschat et al. |
| 2011/0266649 | A1 * | 11/2011 | Nakashiba ........... H01L 23/5227 257/508 |
| 2011/0278696 | A1 | 11/2011 | Nakashiba |
| 2012/0020419 | A1 | 1/2012 | Kaeriyama |
| 2014/0225221 | A1 | 8/2014 | Nakashiba |

FOREIGN PATENT DOCUMENTS

| | | |
|---|---|---|
| JP | 2004-281838 A | 10/2004 |
| JP | 2004-311655 A | 11/2004 |
| JP | 2009-141011 A | 6/2009 |
| JP | 2009-295804 A | 12/2009 |
| JP | 2009-302418 A | 12/2009 |
| JP | 2011-014719 A | 1/2011 |
| JP | 2013-239731 A | 11/2013 |
| WO | WO 2010/113383 A1 | 10/2010 |

* cited by examiner

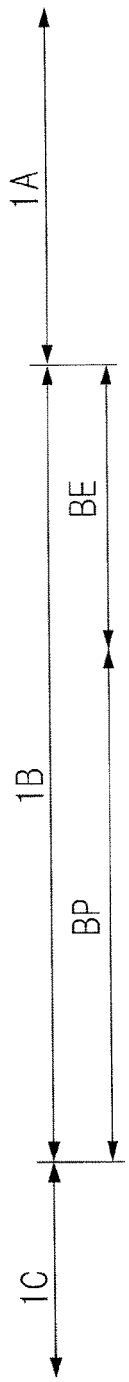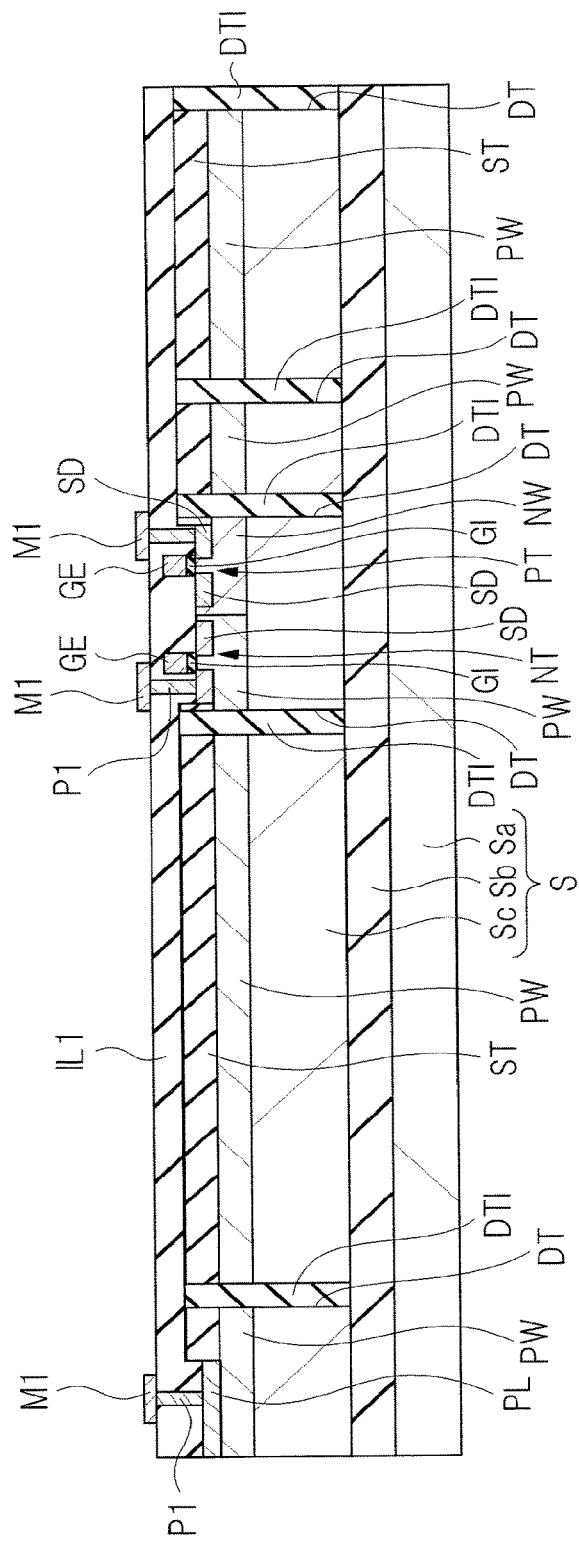
FIG. 13

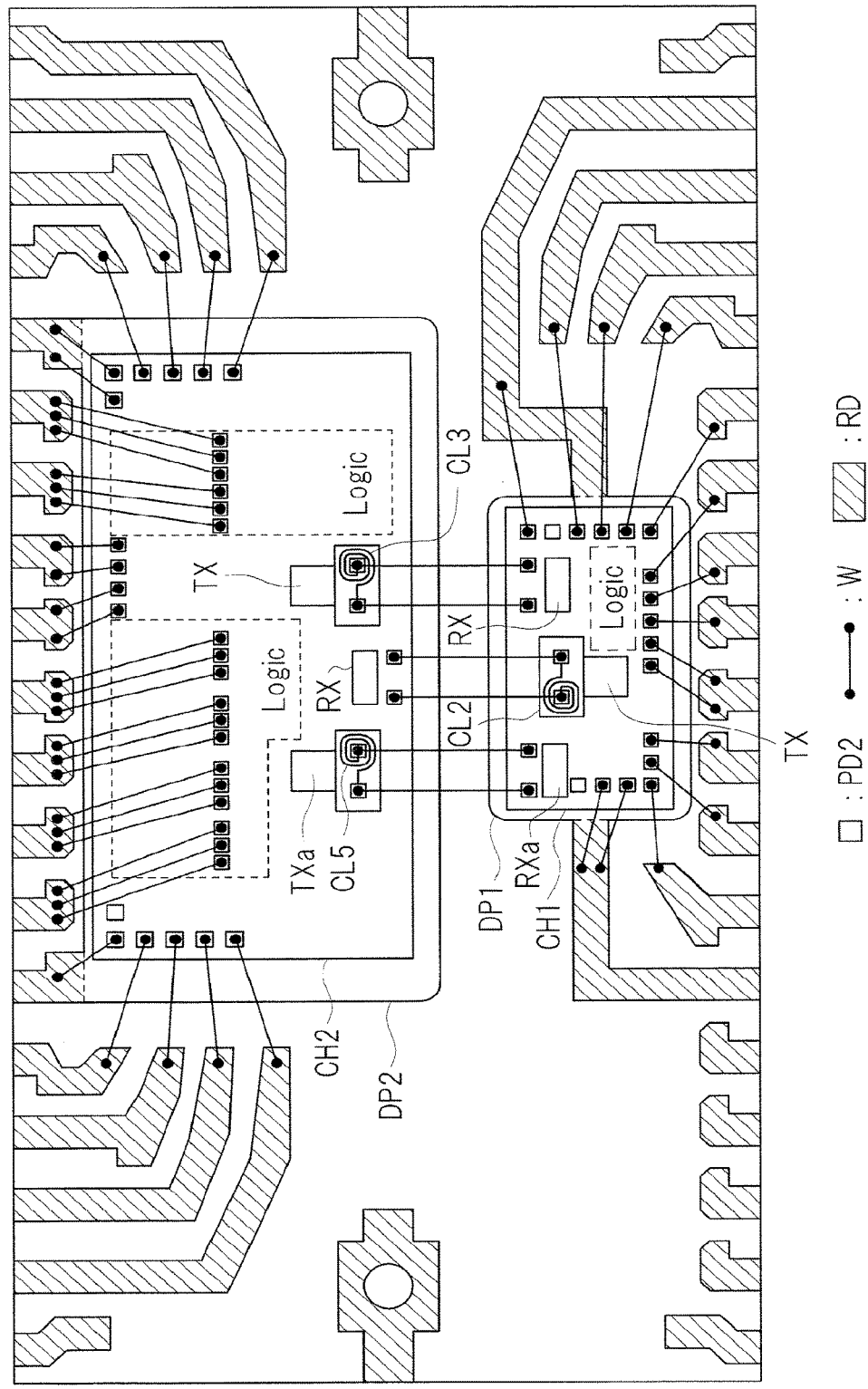

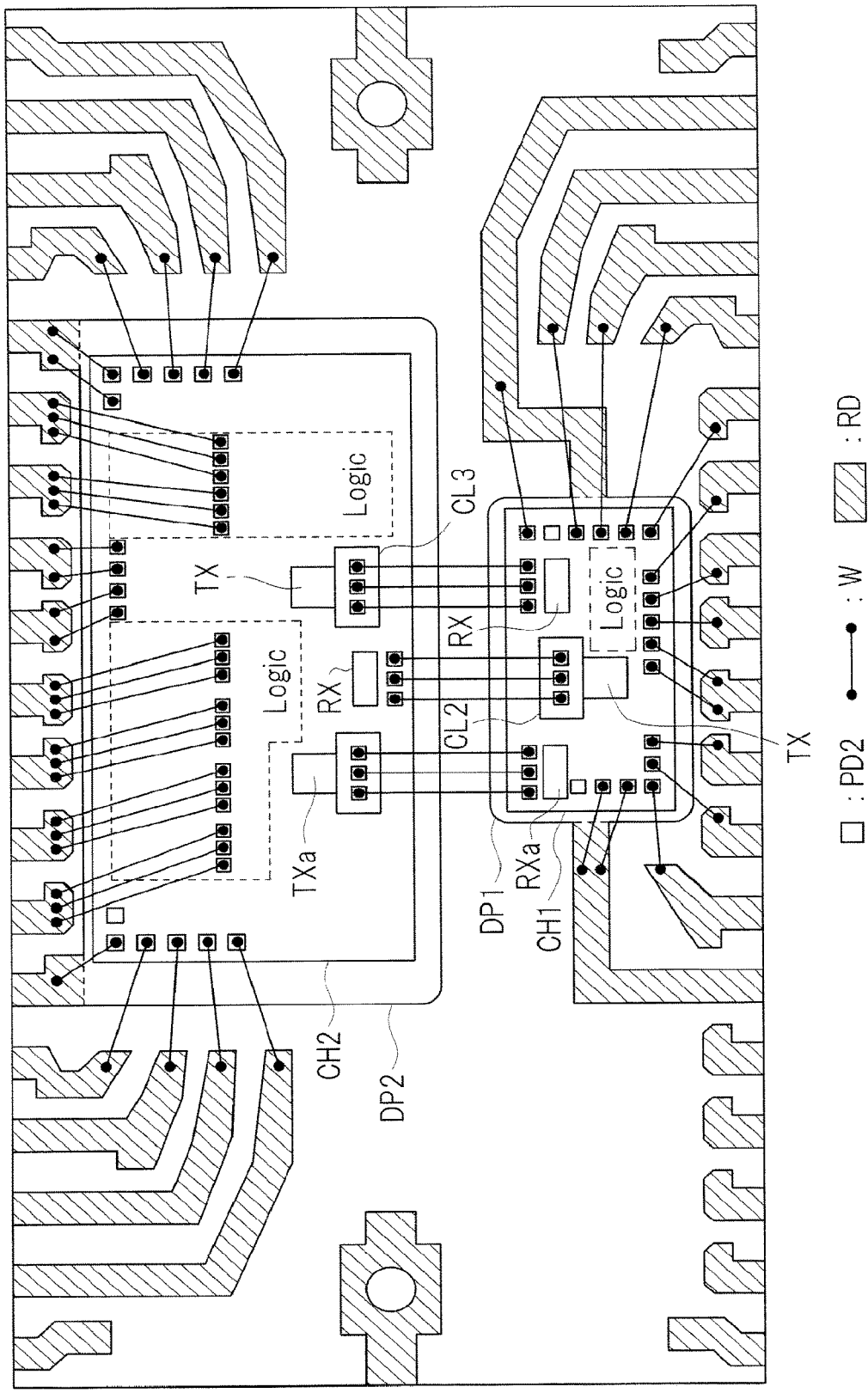

SEMICONDUCTOR DEVICE WITH INDUCTIVELY COUPLED COILS

TECHNICAL FIELD

The present invention relates to a semiconductor device, and more particularly relates to technique effectively applied to, for example, a semiconductor device having a coil.

BACKGROUND

As technique of transmitting an electric signal between two circuits to which electric signals having different electric potentials are inputted, respectively, technique using a photocoupler has been known. The photocoupler is provided with a light-emitting element, such as a light emitting diode, and a light-receiving element, such as a phototransistor, and by converting an inputted electric signal into light by the light-emitting element, as well as by returning the light into an electric signal by the light-receiving element, the electric signal is transmitted.

Moreover, a technique in which electric signals are transmitted by inductively coupling two coils with each other has been developed. For example, Patent Document 1 (Japanese Patent Application Laid-Open Publication No. 2009-302418) discloses a circuit device provided with a first coil, a first insulating layer and a second coil.

Furthermore, Patent Document 2 (Japanese Patent Application Laid-Open Publication No. 2003-309184) discloses a composite module in which a coil and a capacitor are formed on the same substrate so that a plurality of stacked coil patterns are provided.

In addition, Patent Document 3 (Japanese Patent Application Laid-Open Publication No. 2009-141011), Patent Document 4 (Japanese Patent Application Laid-Open Publication No. 2004-311655) and Patent Document 5 (Japanese Patent Application Laid-Open Publication No. 2004-281838) respectively disclose a seal ring, a metal fence and a guard ring.

CITATION LIST

Patent Document 1: Japanese Patent Application Laid-Open Publication No. 2009-302418
Patent Document 2: Japanese Patent Application Laid-Open Publication No. 2003-309184
Patent Document 3: Japanese Patent Application Laid-Open Publication No. 2009-141011
Patent Document 4: Japanese Patent Application Laid-Open Publication No. 2004-311655
Patent Document 5: Japanese Patent Application Laid-Open Publication No. 2004-281838

SUMMARY

Problems to be Solved by the Invention

For example, as technique of transmitting an electric signal between two circuits whose electric signals to be inputted thereto have mutually different electric potentials, the technique using the above-mentioned "photocoupler" has been proposed. However, since the photocoupler has a light-emitting element and a light-receiving element, it is difficult to achieve downsizing. Moreover, the application of the photocoupler has limitations in that, when an electric signal has a high frequency, it becomes impossible to follow the electric signal, and in that it is not possible to carry out operations under a high temperature of 125° C. or more.

On the other hand, by a semiconductor device that transmits an electric signal by inductively coupling two coils with each other, since the coils can be formed by utilizing a micro-processing technique of a semiconductor device, the downsizing of the device can be achieved with superior electrical characteristics; thus, the development of such a device is demanded.

For this reason, also as to the semiconductor device that transmits an electric signal by inductively coupling two coils with each other, there is a strong demand for improving its performances as much as possible.

The above and other preferred aims and novel characteristics of the present invention will be apparent from the description of the present specification and the accompanying drawings.

Means for Solving the Problems

The typical ones of the inventions disclosed in the present application. will he briefly described as follows.

A semiconductor device described in one embodiment disclosed in the present application includes a first coil and a first wiring formed on a first insulating film, a second insulating film formed on the first coil and the first wiring, a second wiring formed on the second insulating film, a third insulating film formed on the second wiring, and a second coil and a third wiring formed on the third insulating film. Moreover, a distance between the second coil and the third wiring is made longer than the distance between the second coil and the second wiring. Furthermore, a distance between the second coil and the second wiring is set to a sum of the film thicknesses or more of the second insulating film and the third insulating film located between the first coil and the second coil.

Effects of the Invention

In accordance with semiconductor devices indicated by typical embodiments described below, which are disclosed by the present application, it becomes possible to improve characteristics of the semiconductor device.

BRIEF DESCRIPTIONS OF THE DRAWINGS

FIG. 13 is a cross-sectional view illustrating a manufacturing process of the semiconductor device of the first embodiment, illustrating a manufacturing process continued from FIG. 12;

FIG. 44 is a plan view illustrating the configuration of the semiconductor device of the fifth embodiment; and FIG. 45 is a plan view illustrating the configuration of the semiconductor device of the fifth embodiment.

DETAILED DESCRIPTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value etc. (including number of pieces, values, amount, range, and the like) mentioned above.

Hereinafter, embodiments of the present invention will be described in detail with reference to the accompanying drawings. Note that components having the same function are denoted by the same reference symbols throughout the drawings for describing the embodiment, and the repetitive description thereof will be omitted. Also, when there are a plurality of similar parts (portions), an individual or specific part may be denoted by a generic reference added with a symbol. In addition, the description of the same or similar portions is not repeated in principle unless particularly required in the following embodiments.

Moreover, in some drawings used in the embodiments, hatching may be omitted even in a cross-sectional view so as to make the drawings easy to see. Also, hatching may be used even in a plan view so as to make the drawings easy to see.

Moreover, in the cross-sectional views and plan views, the sizes of the respective portions do not necessarily correspond to those of actual devices, and for a better understanding of the drawings, specific portions are sometimes illustrated with relatively larger sizes. Furthermore, even in the case when the plan view and the cross-sectional view correspond to each other, the respective portions are sometimes illustrated, with the sizes of the respective portions being changed.

(First Embodiment)

[Explanation of Configuration]

Figure 1:
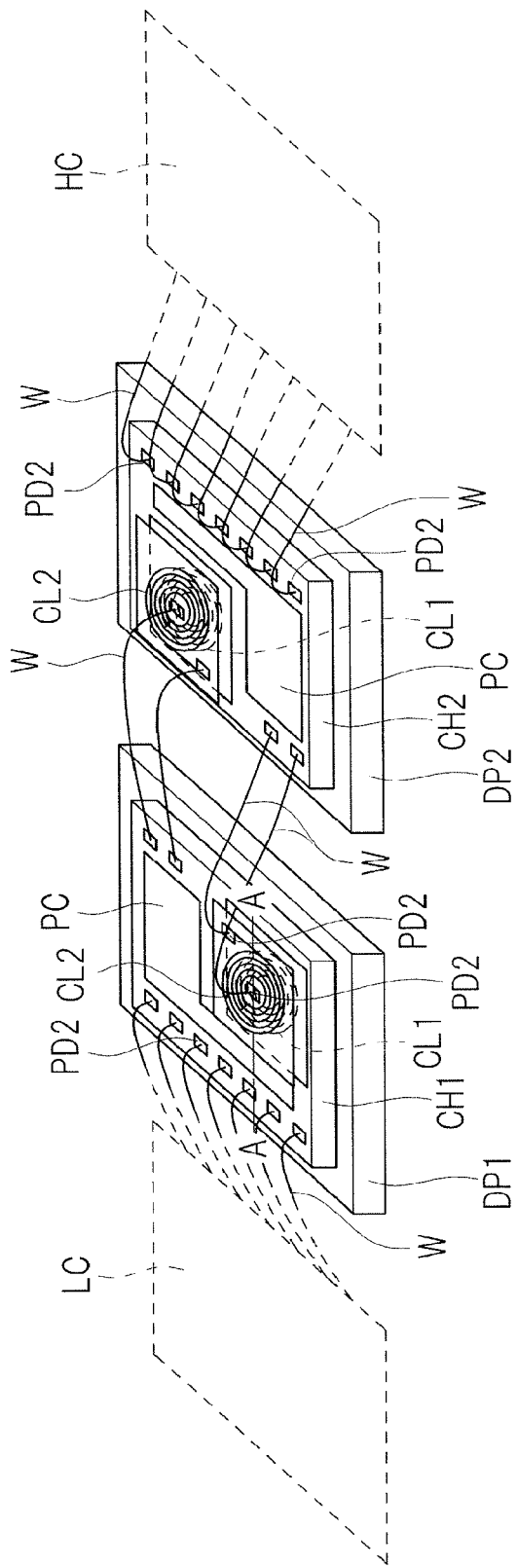
FIG. 1 is a schematic diagram illustrating a configuration of a semiconductor device in accordance with a first embodiment.

FIG. 1 is a schematic diagram illustrating a configuration of a semiconductor device in accordance with the present embodiment. The semiconductor device shown in FIG. 1 is a semiconductor device in which two chips (CH1 and CH2) are installed as one package. The chip (semiconductor chip, semiconductor piece) CH1 is mounted on a die pad DP1. The chip CH1 is provided with a transformer composed of a coil (inductor) CL1 on a lower layer, and a coil (inductor) CL2 of an upper layer. The coil CL2 of the upper layer is connected to a pad region PD2 of the chip CH2 through a wire W. The coil CL1 of the lower layer is connected to a peripheral circuit PC through a wiring not illustrated. On the peripheral circuit PC, a logic circuit constituted by elements (active elements) such as MISFETs is formed. The peripheral circuit PC is connected to a pad region PD2 disposed on an end portion of the chip CH1 through a wiring, not illustrated. The pad region PD2 is connected to a low voltage region LC having a circuit that can be driven at a low voltage (for example, 50V or less) through a wire W and a lead or the like, not illustrated.

The chip CH2 is mounted on a die pad DP2. The chip CH2 is provided with a transformer composed of a coil CL1 of a lower layer and a coil CL2 of an upper layer. The coil CL2 of the upper layer is connected to a pad region PD2 of the chip CH1 through a wire W. The coil CL1 of the lower layer is connected to a peripheral circuit PC through a wiring not illustrated. On the peripheral circuit PC, a logic circuit or the like constituted by elements such as MTSFETs is formed. The peripheral circuit PC is connected to a pad region PD2 disposed on an end portion of the chip CH2 through a wiring, not illustrated. The pad region PD2 is connected to a high voltage region HC having a circuit that can be driven at a high voltage (for example, AC actual value, 100 Vrms or more) through a wire W and a lead or the like, not illustrated.

For example, a transmission circuit in the peripheral circuit PC of the chip CH1 allows a pulse-state electric current to flow through the coil CL1. At this time, the direction of the current flowing through the coil CL1 is changed depending on '1' or '0' of the electric signal (transmitting signal, data). By the electric current of the coil CL1, an induction voltage is generated in the coil CL2 of the upper layer. This voltage is transmitted to the chip CH2 through the wire W, and amplified in a receiving circuit in the peripheral circuit PC of the chip CH2, and is further latched. In this manner, the electric signal can be wirelessly transmitted by using a magnetic induction coupling. In other words, by connecting the low voltage region LC and the high voltage region HC, which are electrically insulated from each other, to each other through a transformer, an electric signal can be transmitted between these regions (LC and HC).

Moreover, by utilizing a fine machining process for forming a semiconductor device, coils (CL1, CL2) that constitute a transformer are formed in the same manner as in the wirings and the like so that the peripheral circuit PC and the coils (CL1, CL2) can be integrally formed on the same chip.

Figure 3:
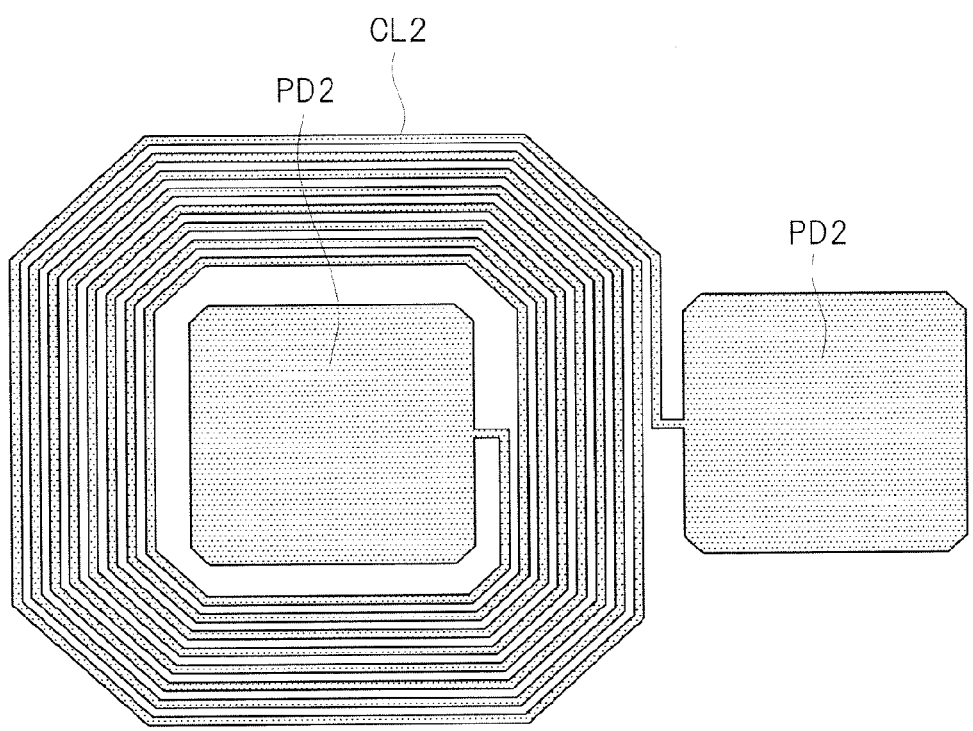
FIG. 3 is a plan view illustrating an example of the configuration of a coil of the semiconductor device of the first embodiment.

As a shape of the conductor pattern forming the transformer, as shown in FIG. 1, a spiral-shaped conductor pattern may be used (see FIG. 3).

Figure 2:
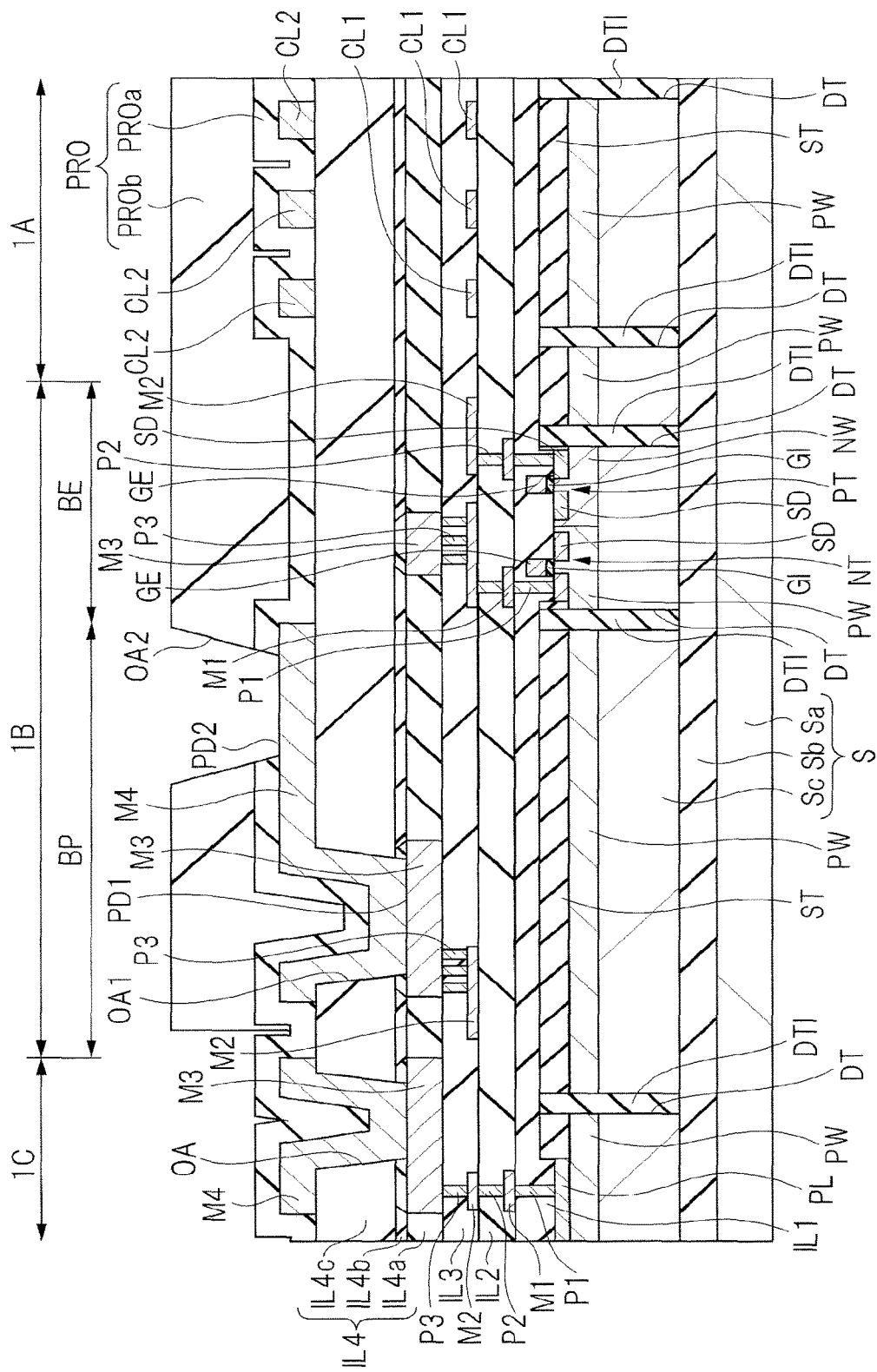
FIG. 2 is a cross-sectional view illustrating the configuration of the semiconductor device of the first embodiment.

FIG. 2 is a cross-sectional view illustrating a configuration of a semiconductor device of the present embodiment. The semiconductor device as shown in FIG. 2 is a semiconductor device provided with a transformer, which corresponds to, for example, a cross section taken along an A-A line in FIG. 1.

The semiconductor device of the present embodiment is formed by using an SOI (Silicon on Insulator) substrate. The SOI substrate is formed into a wafer state having a substantially round shape in the manufacturing process of the semiconductor device, and provided with a plurality of chip regions, each having a substantially rectangular shape. Each of the chip regions is provided with a transformer formation region 1A corresponding to a region in which a transformer is formed, a peripheral circuit formation region 1B corresponding to a region in which a peripheral circuit is formed, and a seal ring formation region IC corresponding to a region in which a seal ring is formed. Moreover, the peripheral circuit formation region 1B is provided with an element formation region BE on which elements, such as MTSFETs, are mainly formed and a pad formation region BP on which a pad region PD2 is formed. The seal ring refers to a shielding wall against moisture or the like, which is formed so as to surround the transformer formation region 1A and the peripheral circuit formation region 1B (see FIG. 4). Moreover, the seal ring also has a function of preventing a crack from being transferred at the time of dicing. In this case, as will be described later, it is composed of a stacked layer portion, such as a surrounding wiring, a surrounding plug, or the like, formed in a manner so as to surround the transformer formation region 1A and the peripheral circuit formation region 1B.

The SOI substrate S is provided with a support substrate Sa, an insulating layer (insulating film, buried insulating film, or BOX) Sb formed on the support substrate Sa, and a semiconductor layer (for example, silicon layer Sc) formed on the insulating layer Sb.

In the element formation region BE of the peripheral circuit formation region 1B, semiconductor elements, such as MISFETs (Metal Insulator Semiconductor Field Effect Transistors) or the like, are formed. These MISFETs constitute, for example, the peripheral circuit PC shown in FIG. 1. Additionally, in this case, the MISFETs are exemplified as the semiconductor elements; however, in addition to these, capacitors, memory elements or transistors having other configurations, or the like, may be formed in the peripheral circuit formation region 1B. Moreover, on the MISFET (NT, PT), an interlayer insulator Il1 is formed, and on this interlayer insulator IL1, a wiring M1 is formed. The MISFET (NT, PT) and the wiring Ml are connected to each other through a plug P1. Furthermore, on the wiring M1, an interlayer insulator IL2 is formed, and on the interlayer insulator IL2, a wiring M2 is formed. The wiring M1 and the wiring M2 are connected to each other through a plug P2 formed in the interlayer insulator IL2. On the wiring M2, an interlayer insulator IL3 is formed, and on the interlayer insulator IL3, a wiring M3 is formed. The wiring M2 and the wiring M3 are connected to each other through a plug P3 formed in the interlayer insulator IL3. In this case, the film thickness of the wiring M3 is made larger and comparatively thicker (for example, with a film thickness of 3 μm or more) than the film thickness of the wiring M2.

On the wiring M3, an interlayer insulator IL4 is formed, and on the interlayer insulator IL4, a wiring M4 is formed. The interlayer insulator 114 is formed so as to be comparatively thick in order to maintain withstand voltage between the coils CL1 and CL2, which will be described later. For example, between the coils CL1 and CL2, a withstand voltage of 2.5 kVrms for 60 seconds is required. Moreover, the interlayer insulator IL4 is formed of an inorganic insulating film formed of a silicon oxide film, a silicon nitride film, or the like. For example, the interlayer insulator IL4 is composed of an HOP (high density plasma) film IL4a and a stacked film of P-TEOS films IL4b and IL4c. The HDP film is a film formed by a high density plasma CVD method, and the P-TEOS film IL4b is a film formed by a general plasma CVD method with TEOS (tetraethyl orthosilicate) being used as a source gas. By using the HDP film IL4a, gaps between the wirings M3 can be buried with high precision. Moreover, as will be described later in detail, the HDP film IL4a has such a tendency as to be film-formed in a divided manner on the gaps between the wirings M3 as well as on the wirings M3. For this reason, the film is hardly formed on the corner portion of each wiring M3, and is mainly formed on the gaps between the wirings M3 as well as on the wirings M3 (see FIG. 20). For this reason, in comparison with a case in which the P-TEOS film is formed on the wirings M3, in the case when the HDP film IL4a is formed on the wirings M3, the film is divided so as to mitigate the film stress.

Moreover, since a configuration in which a wiring M4 to be described later and the wiring M3 are connected on the bottom face of an opening portion OA1 is provided, the interlayer insulator IL4 can be divided by the opening portion OA1 formed with a comparatively large area. With this arrangement, the film stress can be mitigated. The plane shape of the opening portion OA1 is formed, for example, as a substantially rectangular shape of 20 μm×20 μm. Furthermore, by enlarging the wire width of the wiring M4 and wiring M3, as well as by stacking these with the bottom face of the opening portion OA1 being interposed therebetween, the wiring resistances of the wiring M4 and the wiring M3 can be reduced. For example, each of the wire Widths of the wiring M4 and wiring M3 is made larger than the wire Width of the wiring M2, and the wire Width of the wiring M4 is, for example, about 4 μm, and the wire Width of the wiring M3 is about 4 μm. However, in the wiring M4 and the wiring M3, the width of the formation region of each of the openings (OA1, OA2) is set to, for example, 40 μm or more. Moreover, by forming these wrings as Al wirings, that is, by forming these by using a material containing aluminum, it is possible to form these at low costs, by using a simple process, in comparison with the case of using, for example, a copper material.

The wiring M4 is a wiring for use in drawing a region PD1 that is one portion of the wiring M3 to a desired region (pad region PD2) of the chip. That is, the above-mentioned region (region on which the pad region PD2 is formed) corresponds to a pad formation region BP. The film thickness of the wiring M4 is formed so as to be comparatively large (for example, with a film thickness of 3 μm or more), that is, larger than the film thickness of the wiring M2.

On the wiring M4, a stacked film of, for example, a silicon nitride film PROa and a polyimide film PROb, is formed as a protective film PRO. On the protective film PRO, an opening portion OA2 is formed so that the wiring M4 forms an exposed portion. The exposed portion of the wiring M4 forms the pad region PD2.

On the transformer formation region 1A, a transformer having the coil CL1 and the coil CL2 is formed. The coil CL1 of the lower layer is formed as the same layer as the wiring M2.

The coil CL2 of the upper layer is formed as the same layer as the wiring M4. Between the coil CL1 and the coil CL2, the interlayer insulator IL4 and the interlayer insulator IL3 are formed. Each of the interlayer insulator IL4 and the interlayer insulator IL3 are formed of an inorganic insulating film, such as silicon oxide films, silicon nitride films, or the like. Moreover, the interlayer insulator IL4 is formed so as to be comparatively thick in order to ensure a proper withstand voltage between the coils CL1 and CL2. The interlayer insulator IL4 is made thicker than the interlayer insulator IL2. Additionally, the interlayer insulator IL3 and the interlayer insulator IL2 have film thicknesses in the similar level. For example, the film thickness of the interlayer insulator IL4 is about 8 μm, and the film thickness of the interlayer insulator IL3 is about 1.5 μm. Moreover, a sum of the film thicknesses of the interlayer insulator IL4 and the interlayer insulator IL3 located between the coil CL1 and the coil CL2 is preferably set to 5 μm or more.

FIG. 3 is a plan view illustrating an example of a configuration of a coil of the semiconductor device of the present embodiment. The coil shown in FIG. 3 corresponds to, for example, the coil CL2 of the upper layer. In FIG. 3, the coil CL2 is formed of a conductive film having a spiral shape when seen in the plan view from the upper surface, and the end portion inside the spiral-shaped conductive film is connected to the pad region PD2, while the end portion outside the spiral-shaped conductive film is connected to another pad region PD2. Each of the pad regions PD2 is connected to, for example, a receiving circuit (Rx) of another chip through a wire (W) or the like (see FIG. 29, FIG. 30 and the like).

In the same manner as in the coil CL1 on the upper layer, the coil CL1 of the lower layer is formed of a conductive film having a spiral shape. For example, it is formed into a spiral shape as shown in FIG. 3 when seen in the plan view from the upper surface. In the coil CL1 of the lower layer, the end portion (pad region) of the spiral-shaped conductive film is connected to a transmission circuit (Tx), with the same layer as the coil CL1 or the wiring on the lower layer (for example, the wiring M2, wiring M1) being interposed therebetween (see FIG. 29, FIG. 30, or the like). For example, the end portion inside the spiral-shaped conductive film forming the coil CL1 is connected to an MISFET forming the transmission circuit (Tx), with the wiring (for example, the wiring M1) on the lower layer of the coil CL1 being interposed therebetween, and the end portion outside thereof is connected to the MISFET forming the transmission circuit (Tx), with the wiring (for example, the wiring M2) formed as the same layer as the coil CL1 being interposed therebetween.

Additionally, in the transformer formation region 1A, it is preferable not to form elements such as MISFETs or the like forming the peripheral circuit PC. In the transformer formation region 1A, the pad region PD2 of the coil CL2 of the upper layer to be formed on the upper portion thereof is connected (bonded) to another chip through the wire W or the like. In order to avoid an influence to the elements due to a pressing pressure at the time of the bonding, it is preferable not to form the elements on the transformer formation region 1A. Moreover, for the same reason, it is also preferable not to form elements on the pad formation region BP. Moreover, in the transformer formation region 1A, it is preferable not to form elements thereon, also for the purpose of preventing a mutual interference of an electric signal between coils and an electric signal to be applied to the elements.

On the semiconductor layer (silicon layer Sc) of the seal ring formation region 1C, a p-type semiconductor region PL is formed, and on this p-type semiconductor region PT, the plural wirings M1 to M4 are formed (see FIG. 2). Moreover, the p-type semiconductor region PL and the wiring M1 are connected to each other through the plug P1 formed in the interlayer insulator IL1. Furthermore, the wiring M1 and the wiring M2 are connected to each other through the plug P2 formed in the interlayer insulator I2. Moreover, the wiring M2 and the wiring M3 are connected to each other through the plug P3 formed in the interlayer insulator IL3. Furthermore, the wiring M3 and the wiring M4 are connected to each other through the bottom face of the opening portion OA1. The wiring M4 of the seal ring formation region 1C is formed as the same layer as the wiring M4 of the peripheral circuit formation region 1B and the coil CL2 of the upper layer. The width of the wiring M4 is set to, for example, about 2.8 μm.

Figure 4:
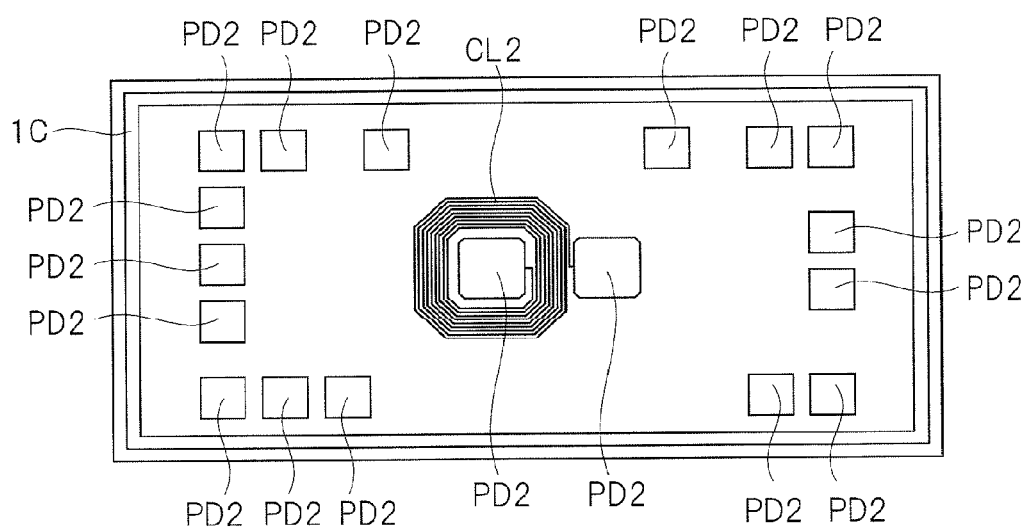
FIG. 4 is a plan view illustrating the configuration of the semiconductor device of the first embodiment.

FIG. 4 is a plan view illustrating an example of a configuration of the semiconductor device of the present embodiment. As shown in FIG. 4, the seal ring formation region 1C is disposed along the outer periphery of the semiconductor device having a substantially rectangular shape. In other words, the sealing ring formation region 1C is disposed so as to surround the transformer formation region 1A and the peripheral circuit formation region 1B.

Inside this sealing ring formation region 10, the coil CL2 and the plural pad regions PD2 are disposed. Moreover, on the outer periphery of the coil CL2, a plurality of circuit blocks (not illustrated) forming the peripheral circuit PC are disposed.

Therefore, the wirings M1 to M4 and plugs P1 to P3 formed in the seal ring formation region 1C are disposed so as to surround the transformer formation region 1A and the peripheral circuit formation region 1B. In other words, the wirings M1 to M4 formed in the seal ring formation region 1C are surrounding wirings, and the plugs P1 to P3 are surrounding plugs. The surrounding wirings are wirings that are formed, for example, along the seal ring formation region 1C into a shape for surrounding the transformer formation region 1A and the peripheral circuit formation region 1B. The surrounding plugs are conductive films buried into contact holes that are formed, for example, into a shape surrounding the transformer formation region 1A and the peripheral circuit formation region 1B, along the seal ring formation region 1C. By stacking these surrounding wirings and surrounding plugs over a plurality of layers, a shielding wall can be formed.

In this manner, by arranging the seal ring formation region 1C with the wirings (M1 to M4) and plugs (P1 to P3) of the plurality of layers formed thereon along the outer periphery of the semiconductor device (chip region), it is possible to prevent moisture from invading therein from the periphery of the semiconductor device, and consequently to improve the moisture resistance of the semiconductor device. Moreover, by the seal ring formation region 1C, the interlayer insulators (IL1 to IL4) are divided into a lattice shape for each of the chip regions of the SOI substrate S (semiconductor wafer). It is possible to mitigate a film stress applied onto the SOI substrate S in a wafer state. Thus, it is possible to reduce the warping of the SOI substrate, and also to avoid insufficient exposure, transporting failure, and so forth thereof.

In particular, in the case when in order to ensure withstand voltage between the coils CL1 and CL2, thick interlayer insulators IL4 and IL3 are formed between them, the film stress tends to become greater. Even in this case, by forming the seal ring formation region IC, the interlayer insulators IL4 and IL3 can be divided, thereby making it possible to mitigate the film stress. Moreover, in the seal ring formation region 1C, such a configuration as to connect the wiring M3 and the wiring M4 on the bottom face of the opening portion OA is prepared; therefore, the interlayer insulator IL4 is divided by the opening portion OA formed so as to have a comparatively large area. By this configuration also, the film stress can be mitigated. The opening portion OA can be formed into a stripe shape with a width of, for example, 8 μm.

Moreover, in the seal ring formation region 1C, only the silicon nitride film PROa is formed, with the polyimide film PROb being removed. In this manner, by removing the polyimide film PROb on the seal ring formation region 1C located on the outer periphery of the semiconductor device (chip region), it becomes possible to prevent the polyimide film PROb from being peeled off at the time of cutting (dicing) the substrate, which will be described later, and also to prevent the polyimide film PROb from wrapping around a dicer.

Figure 5:
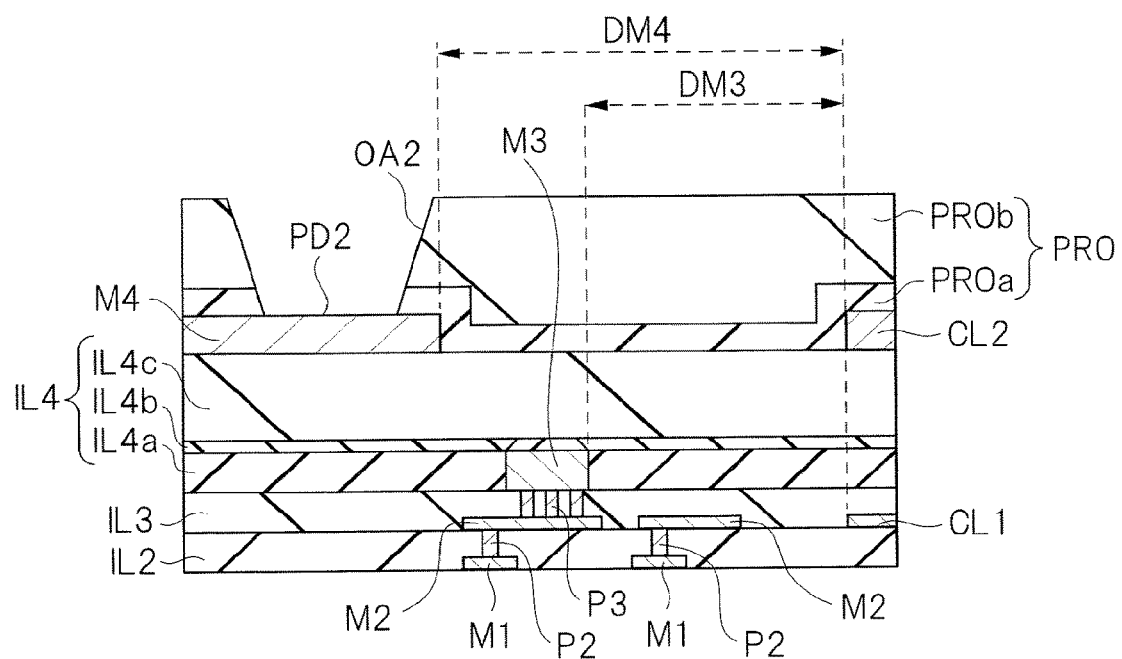
FIG. 5 is a cross-sectional view illustrating a configuration in the vicinity of a coil on an upper layer.
Figure 6:
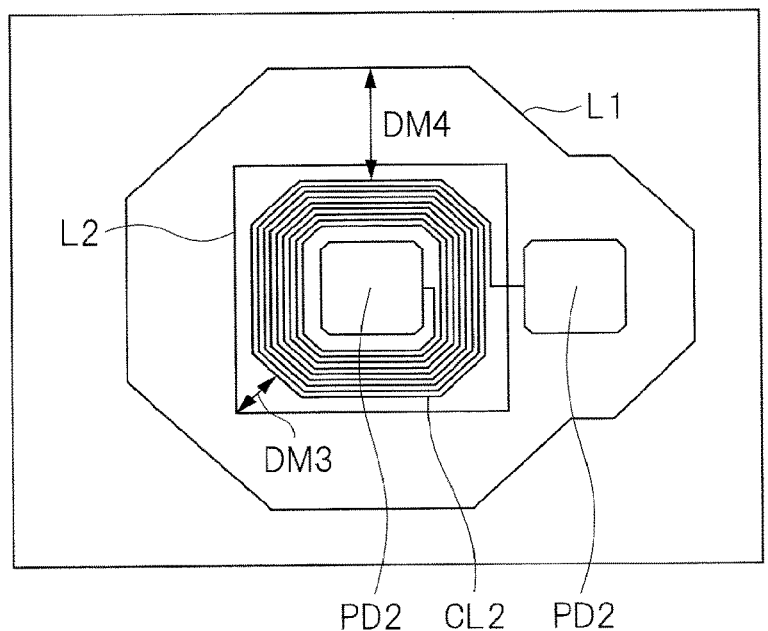
FIG. 6 is a plan view illustrating the configuration in the vicinity of the coil on an upper layer.

FIG. 5 is a cross-sectional view illustrating a configuration in the vicinity of the coil CL2 of the upper layer, and FIG. 6 is a plan view illustrating the configuration in the vicinity of the coil CL2 of the upper layer. As shown in FIG. 5, a distance DM4 between the coil CL2 of the upper layer and the wiring M4 is longer than a distance DM3 between the coil CL2 of the upper layer and the wiring M3 (DM4>DM3). Moreover, a distance DM3 from the wiring M3 is made longer than a distance between the coil CL2 of the upper layer and the coil CL1 of the lower layer (sum of the film thicknesses of the interlayer insulators IL3 and IL4, for example, about 5 μm). The distance DM4 and the distance DM3 are planar distances, that is, the shortest distances on the plan view.

A line L1 shown in FIG. 6 forms a frame indicating a space between the coil CL2 of the upper layer and the wiring M4. A line L2 forms a frame indicating a space between the coil CL2 of the upper layer and the wiring M3. In other words, the wiring M4 is disposed outside (region on the side opposite to the coil CL2 side) the line L1, and the wiring M3 is disposed outside the line L1.

In this manner, the distance DM4 between the coil CL2 of the upper layer and the wiring M4 is made longer than the distance DM3 between the coil CL2 and the wiring M3, and the distance M3 between the coil CL2 of the upper layer and the wiring M3 is made longer than the distance between the coil CL2 of the upper layer and the coil CL1 of the lower layer (the sum of the film thicknesses of the interlayer insulators IL3 and IL4). With this configuration, it is possible to improve the insulation withstand voltage between the coil CL2 and the wiring M4 as well as between the coil CL2 and the wiring M3, which tend to cause a high voltage difference.

Moreover, in the present embodiment, such a configuration is prepared in which the transformer formation region 1A, the element formation region BE and the pad formation region BP are respectively surrounded by a deep trench isolation film DTI penetrating the silicon layer Sc (see FIG. 2); therefore, it is possible to suppress variations in the electric potential of the p-type well PW of the transformer formation region 1A. As a result, it is possible to reduce variations in the capacity between the coil CL1 of the lower layer and the p-type well PW, and consequently to improve the transmission precision of an electric signal between the coils, thereby stabilizing the operations.

[Explanation of Manufacturing Method]

Next, referring to FIG. 7 to FIG. 28, the following description will explain the manufacturing method for a semiconductor device of the present embodiment, and further clarify the configuration of the semiconductor device. FIG. 7 to FIG. 28 are cross-sectional views showing manufacturing processes of the semiconductor device of the present embodiment.

Figure 7:
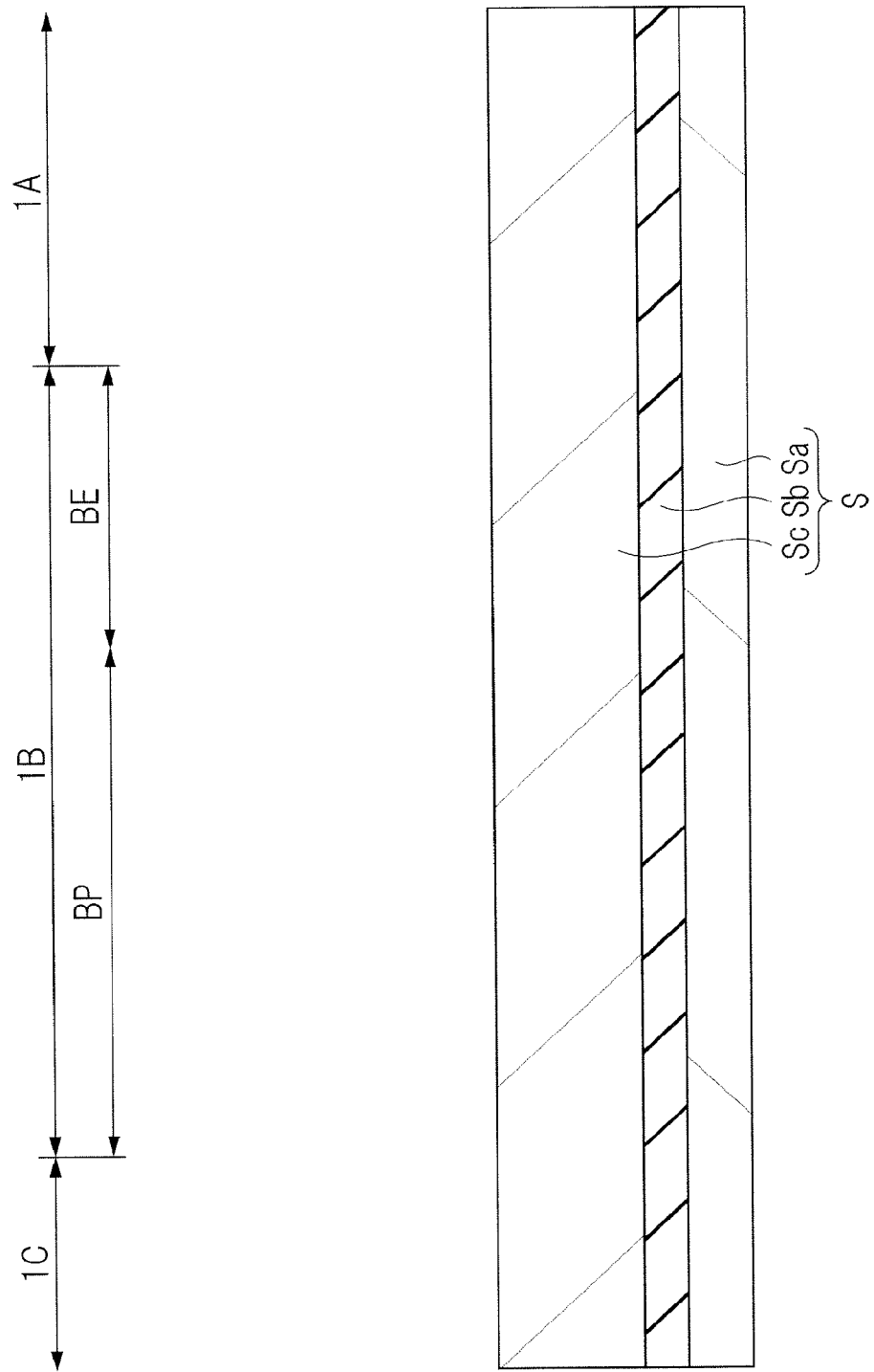
FIG. 7 is a cross-sectional view illustrating a manufacturing process of the semiconductor device of the first embodiment.

As shown in FIG. 7, for example, an SOI substrate S is prepared as a semiconductor substrate. The SOI substrate S is constituted by a support substrate Sa composed of a single crystal silicon substrate (semiconductor film), an insulating layer (buried insulating layer, BOX) Sb formed on the support substrate Sa and a silicon layer (semiconductor layer, semiconductor film, thin-film semiconductor film, thin-film semiconductor region) Sc formed on the insulating layer Sb.

The SOI substrate S is provided with a transformer formation region 1A that is a region in which a transformer is formed, a peripheral circuit formation region 1B that is a region in which a peripheral circuit is formed, and a seal ring formation region 1C that is a region in which a seal ring is formed. Moreover, the peripheral circuit formation region 1B is provided with an element formation region BE in which elements such as MISFETs or the like are mainly formed, and a pad formation region BP in which a pad region is formed.

Figure 8:
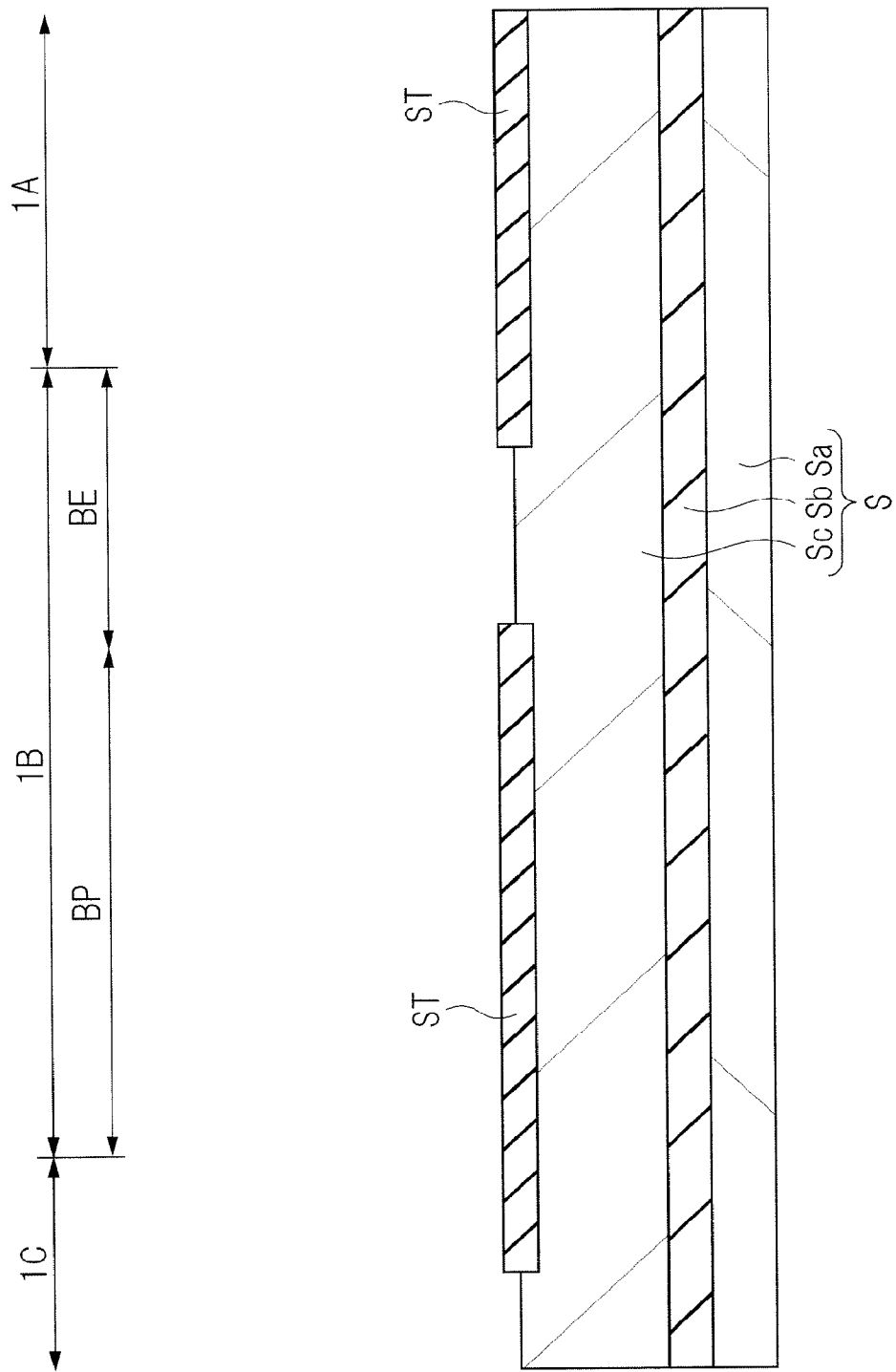
FIG. 8 is a cross-sectional view illustrating a manufacturing process of the semiconductor device of the first embodiment, illustrating a manufacturing process continued from FIG. 7.

Next, as shown in FIG. 8, on the main surface of the SOI substrate S, a device isolation region ST is formed. The device isolation region ST is formed by using, for example, an LOCOS (Local Oxidation of Silicon) method. For example, a mask film (for example, silicon nitride film) having an opening corresponding to the device isolation region is formed on the SOT substrate S, and by carrying out a heating treatment thereon, the device isolation region ST formed of a silicon oxide film is formed. Next, the above-mentioned mask film (not illustrated) is removed.

Figure 9:
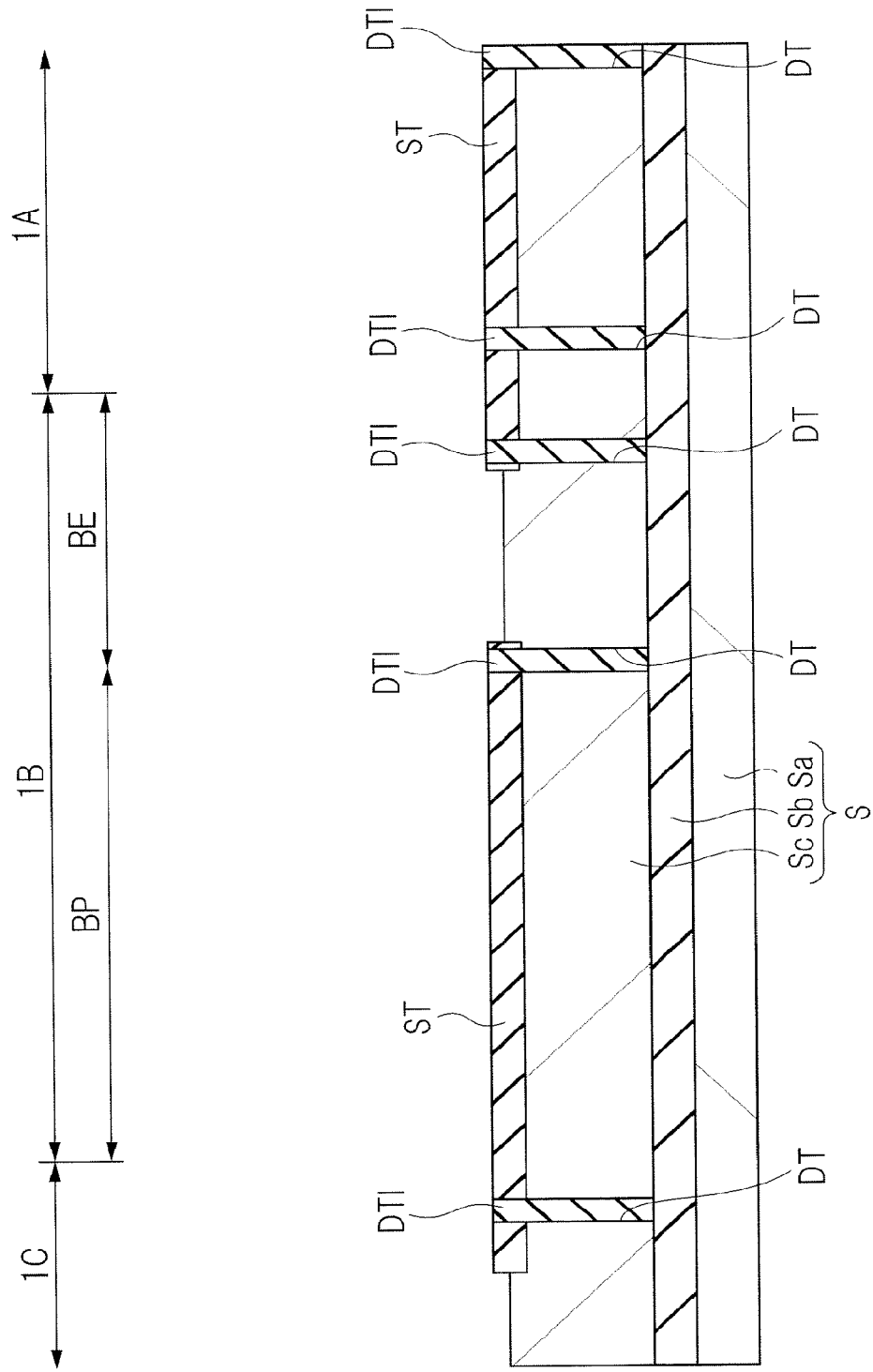
FIG. 9 is a cross-sectional view illustrating a manufacturing process of the semiconductor device of the first embodiment, illustrating a manufacturing process continued from FIG. 8.

Next, as shown in FIG. 9, in the device isolation region, a deep groove (deep trench) DT that further reaches the insulating layer Sb is formed, and by burying an insulating film inside thereof, a deep trench isolation film DTI is formed. For example, a photoresist film (not illustrated) having an opening in the region used for forming the groove DT is formed on the device isolation region ST and the silicon layer S, and by using this photoresist film as a mask, the device isolation region ST and the silicon layer Sc on the lower layer thereof are removed by using a dry etching process. Thus, the groove DT that penetrates the device isolation region ST and the silicon layer Sc to reach the insulating layer Sb can be formed. Next, the above-mentioned photoresist film (not illustrated) is removed.

Next, on the groove DT, the device isolation region ST and the silicon layer Sc, for example, a silicon oxide film is deposited as an insulating film, by using a CVD (Chemical Vapor Deposition) method or the like. Thus, the inside of the groove DT is buried with the silicon oxide film. Next, the above-mentioned silicon oxide film is polished by a CMP (Chemical Mechanical Polishing) method or the like, until the device isolation region ST is exposed. Thus, the deep trench isolation film DTI in which an insulating film such as a silicon oxide film or the like is buried is formed inside the groove DT.

The deep trench isolation film DTI is formed in a manner so as to respectively surround the transformer formation region 1A, the element formation region BE and the pad formation region BP (see FIG. 2).

Figure 10:
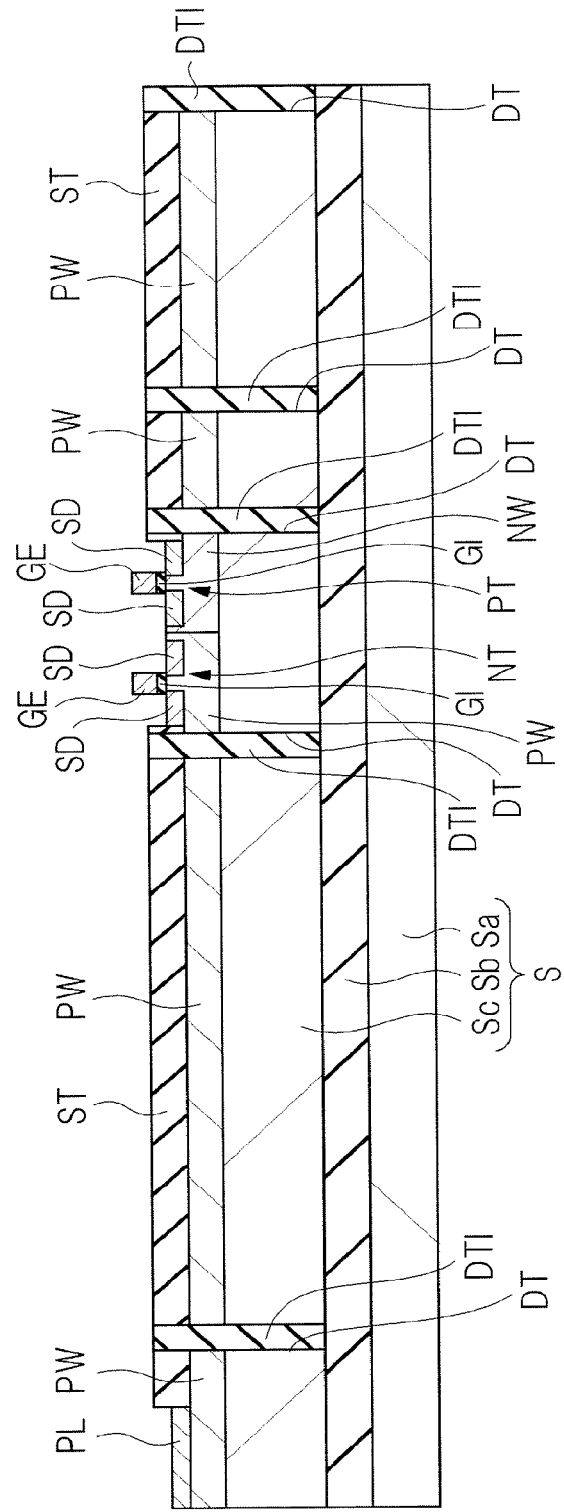
FIG. 10 is a cross-sectional view illustrating a manufacturing process of the semiconductor device of the first embodiment, illustrating a manufacturing process continued from FIG. 9.

Next, as shown in FIG. 10, elements, such as MISFETs or the like, are formed on the peripheral circuit formation region 1B. The following description will explain formation processes of the MISFETs (NT, PT). Although not particularly limited in the formation method of the MISFETs, they can be formed by using the following processes.

First, a p-type well PW and an n-type well NW are formed in the silicon layer Sc of the SOI substrate S. In this case, the p-type well PW and the n-type well NW are formed in the element formation region BE of the peripheral circuit formation region 1B, and the p-type well PW is formed on the pad formation region BP. On the p-type well PW on the element formation region BE, the MISFET (NT) is formed, and on the n-type well NW of the element formation region BP, the MISFET (PT) is formed. Moreover, the p-type well PW is formed on the transformer formation region 1A and the seal ring formation region 1C.

The p-type well PW and the n-type well NW are respectively formed by ion implantation, and are also formed until a predetermined depth from the main surface of the silicon layer Sc of the SOI substrate S.

Next, on the main surface of the SOI substrate S, a gate electrode GE is formed with the gate insulating film GI interposed therebetween. For example, by carrying out a thermal oxidizing process on the surface of the silicon layer Sc, the gate insulating film GI formed of the silicon oxide film is formed. As the gate insulating film GI, in addition to the silicon oxide film, a silicon oxynitride film may be used.

Moreover, a high dielectric constant film (so-called high-k film) may be used as the gate insulating film GI. Moreover, in addition to the thermal oxidizing method, by using another film-forming method such as a CVD method or the like, the gate insulating film GI may be formed.

Next, on the gate insulating film GI, for example, a polycrystal silicon film is formed by using a CVD method or the like, and by patterning the polycrystal silicon film by the use of a photolithography technique and an etching technique, the gate electrode GE is formed. Additionally, in accordance with the characteristics of each of the MISFETs (NT, PT), an impurity may be implanted into the material (in this case, the polycrystal silicon film) forming the gate electrode GE.

Next, a source-drain region SD is formed in the silicon layer Sc on each of the both sides of the gate electrode GE.

First, by ion-implanting an n-type impurity to a p-type well PW of each of both sides of the gate electrode GE, an $n^+$-type semiconductor region (source-drain region) SD is formed. Moreover, by ion-implanting a p-type impurity to the n-type well NW of each of the both sides of the gate electrode GE, a $p^+$-type semiconductor region (source-drain region) SD is formed. At this time, in the p-type well PW of the seal ring formation region 1C, a $p^+$-type semiconductor region PL is formed. Additionally, the source-drain region SD may be formed into a source-drain region of an LDD structure. The source-drain region of the LDD structure is composed of a low-concentration impurity region and a high-concentration impurity region. For example, after ion-implanting an impurity to a well of each of the both sides of the gate electrode GE to form a low-concentration impurity region on each of the side walls of the gate electrode GE, a side wall film is formed on each of the side walls of the gate electrode GE, and in each of the wells on the both sides of a composite body of the gate electrode GE and the side wall film, a high-concentration impurity region is formed.

Next, an annealing treatment (heating treatment) for activating impurities that have been hitherto ion-implanted is carried out.

In this manner, MISFETs (NT, PT) can be formed in the peripheral circuit formation region 1B. Thereafter, if necessary, a metal silicide layer (not illustrated) may be formed on the gate electrode GE and the source-drain region SD by using a Salicide (Self Aligned Silicide) technique.

Figure 11:
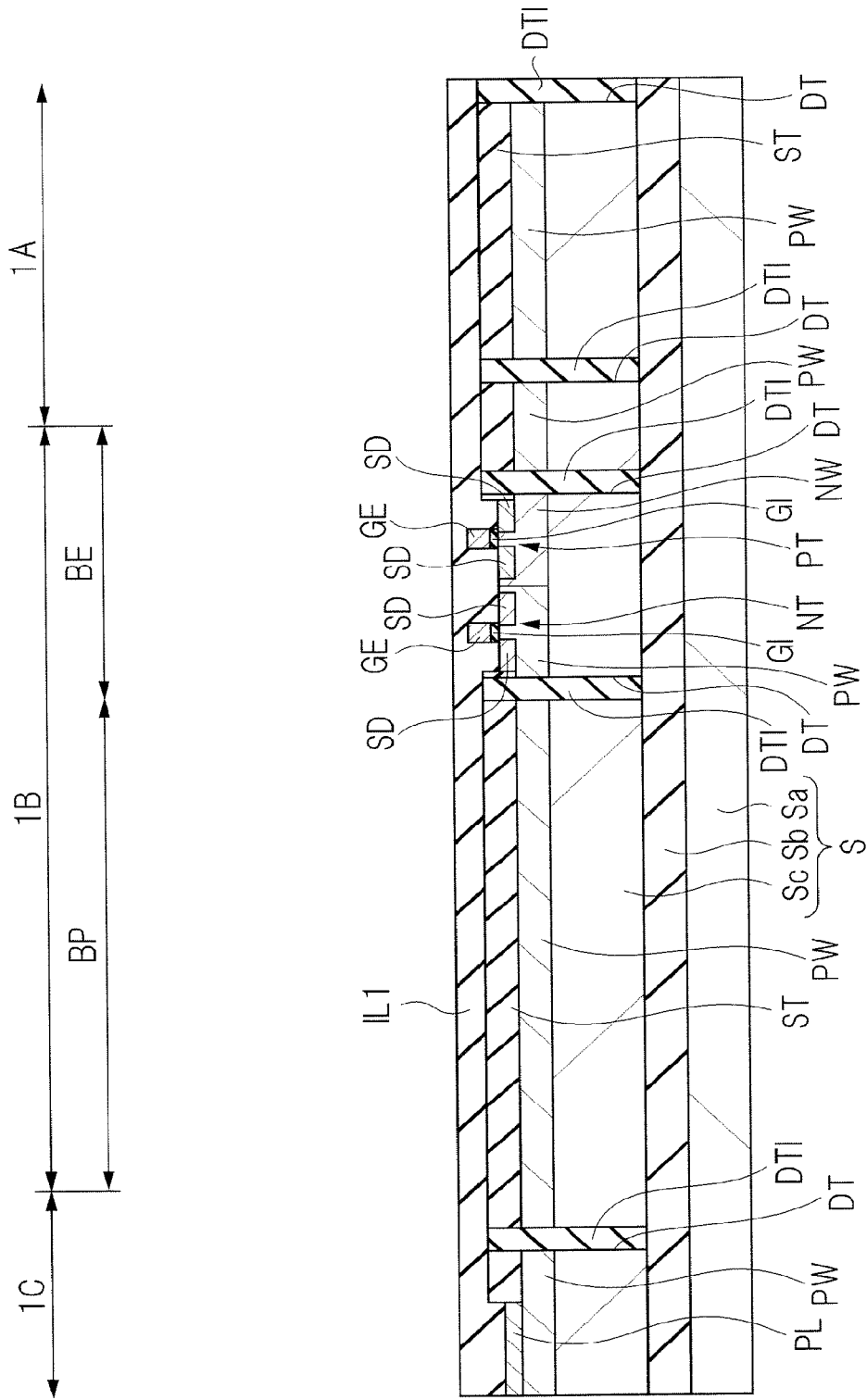
FIG. 11 is a cross-sectional view illustrating a manufacturing process of the semiconductor device of the first embodiment, illustrating a manufacturing process continued from FIG. 10.

Next, as shown in FIG. 11, an interlayer insulator IL1 is formed on the main surface (the entire main surface) of the SOI substrate S. The interlayer insulator IL1 is formed so as to cover the MISFETs (NT, PT) formed on the SOI substrate S. For example, after depositing the silicon oxide film by using a CVD method, the surface of the interlayer insulator IL1 is flattened by using a CMP method or the like, if necessary.

Figure 12:
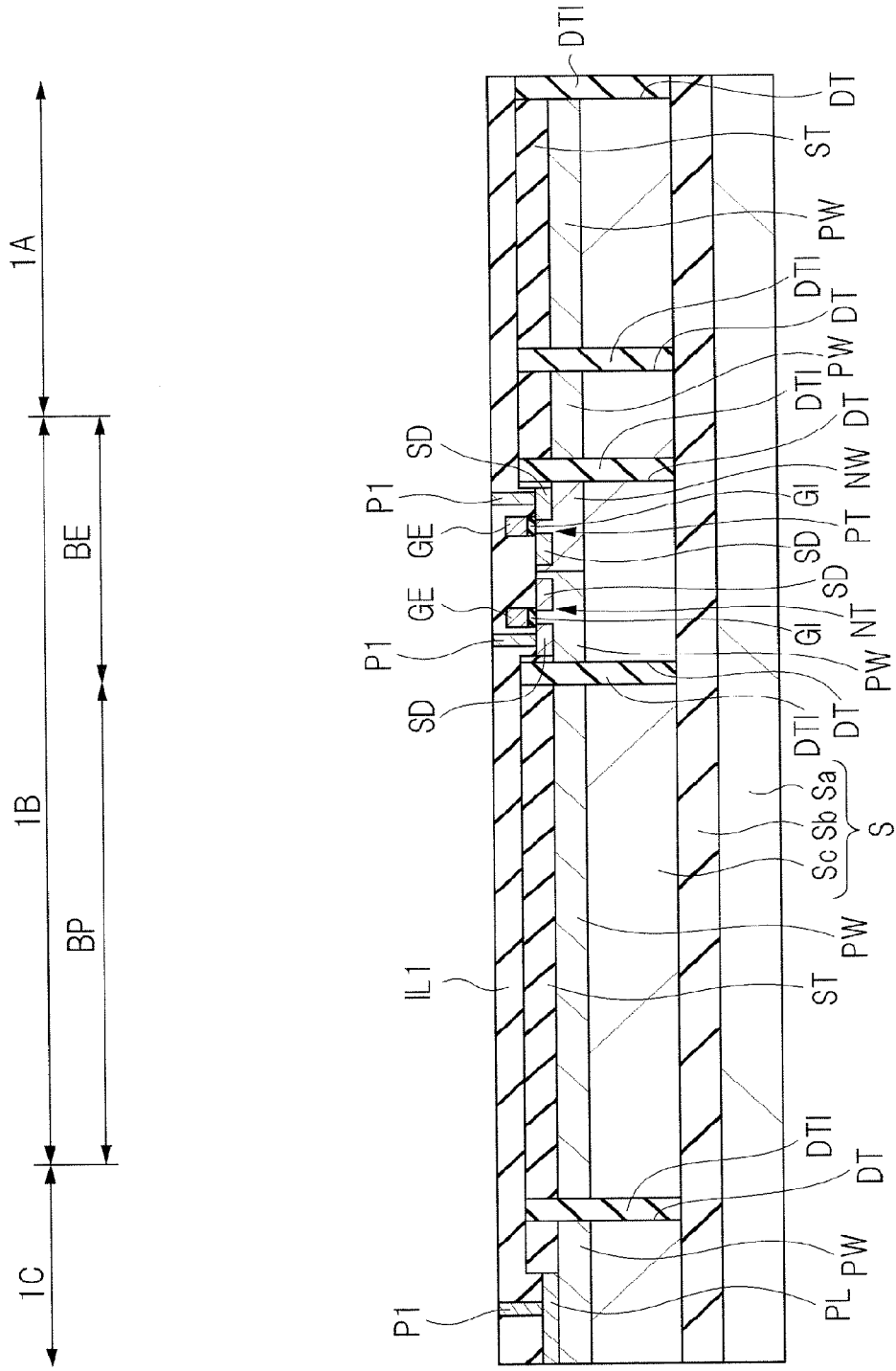
FIG. 12 is a cross-sectional view illustrating a manufacturing process of the semiconductor device of the first embodiment, illustrating a manufacturing process continued from FIG. 11.

Next, as shown in FIG. 12, the plug P1 is formed in the interlayer insulator IL1. For example, by using a photoresist layer (not illustrated) formed on the interlayer insulator IL1 by a photolithography technique as an etching mask, the interlayer insulator IL1 is dry-etched so that a contact hole (through hole, hole) is formed on the interlayer insulator IL1. Next, by burying a conductor film into the contact hole, a conductive plug (connecting conductor portion) P1 is formed. For example, a stacked film of a titanium film and a titanium nitride film is deposited by using a sputtering method or the like on the interlayer insulator IL1 including the inside of the contact hole as a barrier film. Next, on the barrier film, a tungsten (W) film is deposited by using a CVD method or the like as the main conductive film, with such a film thickness as to fill in the contact hole. Next, by using a CMP method or the like, unnecessary burrier film and main conductive film on the interlayer insulator IL1 are removed. Thus, the plug P1 is formed. For example, the plug P1 is formed on the source-drain region SD and the $p^+$-type semiconductor region PL of the seal ring formation region 1C. Additionally, the plug P1 may be formed on the gate electrode GE.

Next, as shown in FIG. 13, on the plug P1, a wiring M1 made of a conductive film is formed. For example, on the interlayer insulator IL1 and the plug P1, an aluminum film and a stacked film composed of a titanium/titanium nitride film are successively deposited as a conductive film, by using a sputtering method or the like. The stacked film of the titanium/titanium nitride film is also referred to as a barrier conductor film. Next, by patterning the above-mentioned stacked film by the use of a photolithography technique and an etching technique, the wiring M1 is formed on the plug P1.

The above-mentioned aluminum film for use in forming the wiring M1 is not particularly limited by a pure aluminum film, and may be formed by using a conductive material film (in this case, however, a conductive material film exerting a metallic conductivity) mainly composed of aluminum. For example, a compound film or an alloy film of Al (aluminum) and Si (silicon) may be used. Moreover, the compounding ratio of Al (aluminum) in the aluminum film is preferably set to be greater than 50 atomic % (that is, Al rich). The same goes not only for the above-mentioned aluminum film for use in forming the wiring Ml, but also for aluminum films for use in forming the wiring M2, wiring M3 and wiring M4.

In this case, the wiring M1 is formed on the element formation region BE and the seal ring formation region 1C; however, this may be formed in the other regions. For example, the wiring M1 may be formed on the transformer formation region 1A. The wiring M1 formed on the transformer formation region 1A in this manner serves as a wiring that electrically connects, for example, the coil CL1 and the peripheral circuit to each other.

Figure 14:
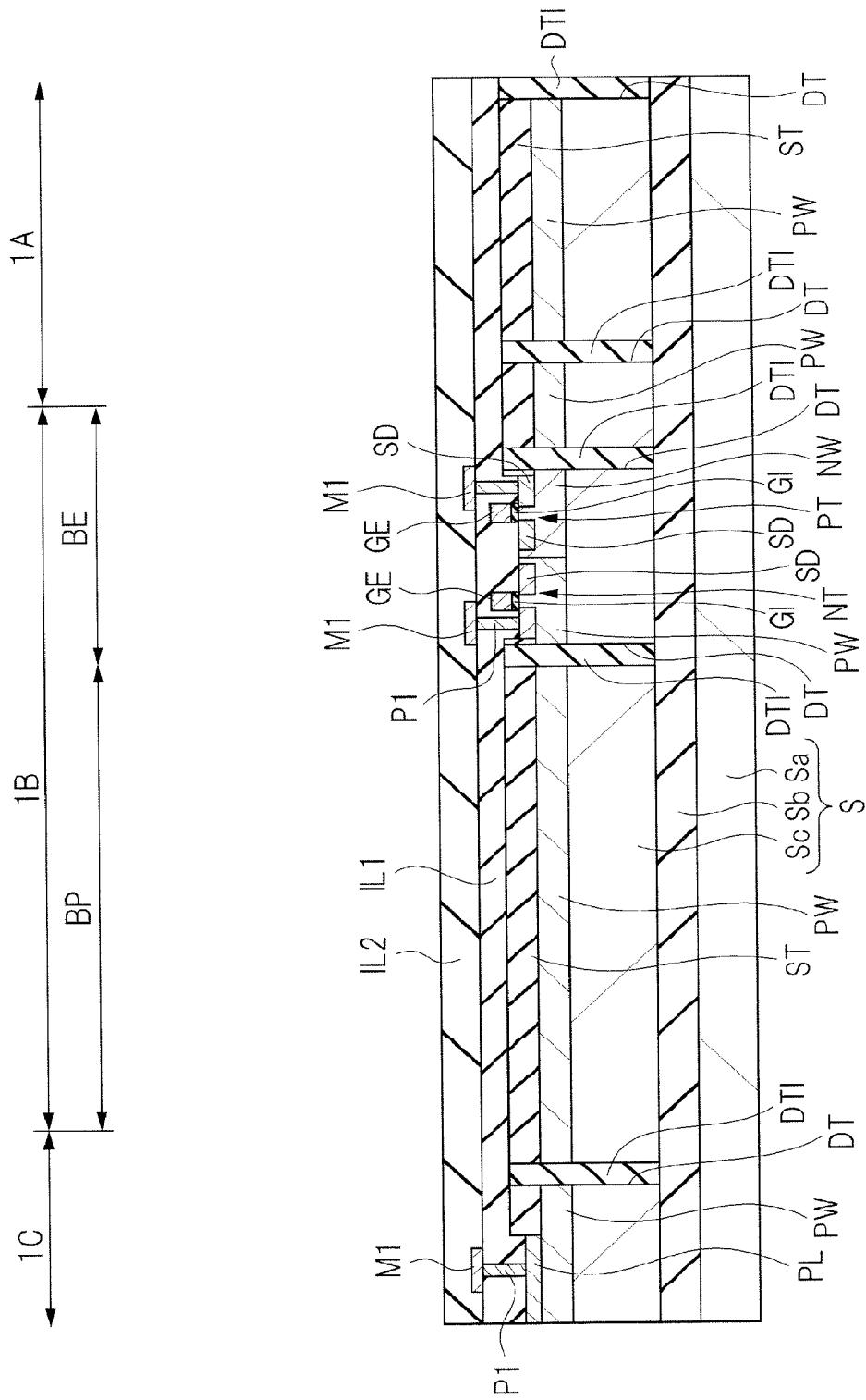
FIG. 14 is a cross-sectional view illustrating a manufacturing process of the semiconductor device of the first embodiment, illustrating a manufacturing process continued from FIG. 13.

Next, as shown in FIG. 14, the interlayer insulator IL2 is formed on the wiring M1. For example, a silicon oxide film is deposited on the wiring M1 by using a CVD method or the like.

Figure 15:
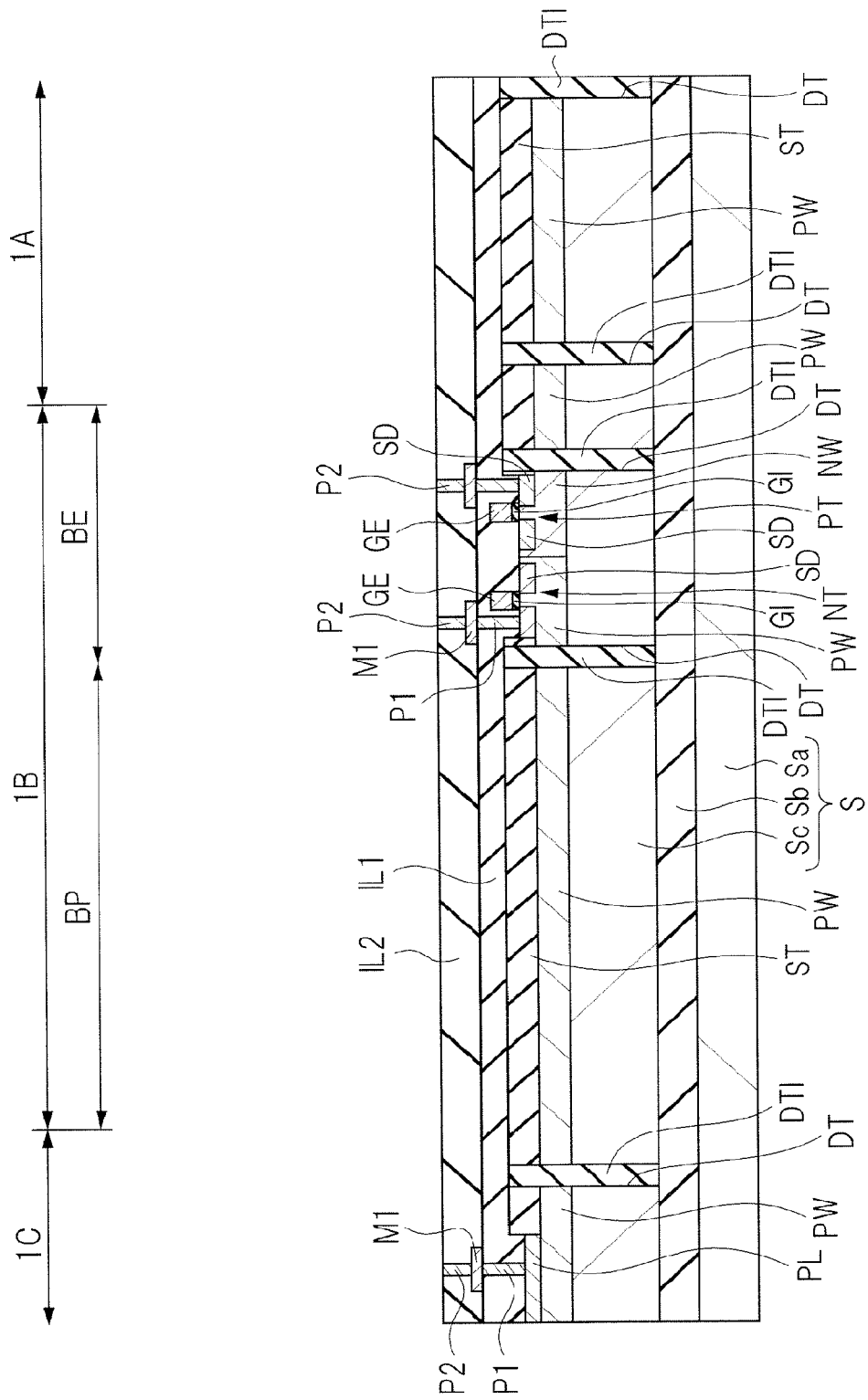
FIG. 15 is a cross-sectional view illustrating a manufacturing process of the semiconductor device of the first embodiment, illustrating a manufacturing process continued from FIG. 14.

Next, as shown in FIG. 15, by patterning the interlayer insulator IL2, a contact hole is formed on the wiring M1, and by further burying a conductive film inside the contact hole, a plug P2 is formed in the interlayer insulator IL2. The plug P2 can be formed in the same manner as in the plug P1.

Figure 16:
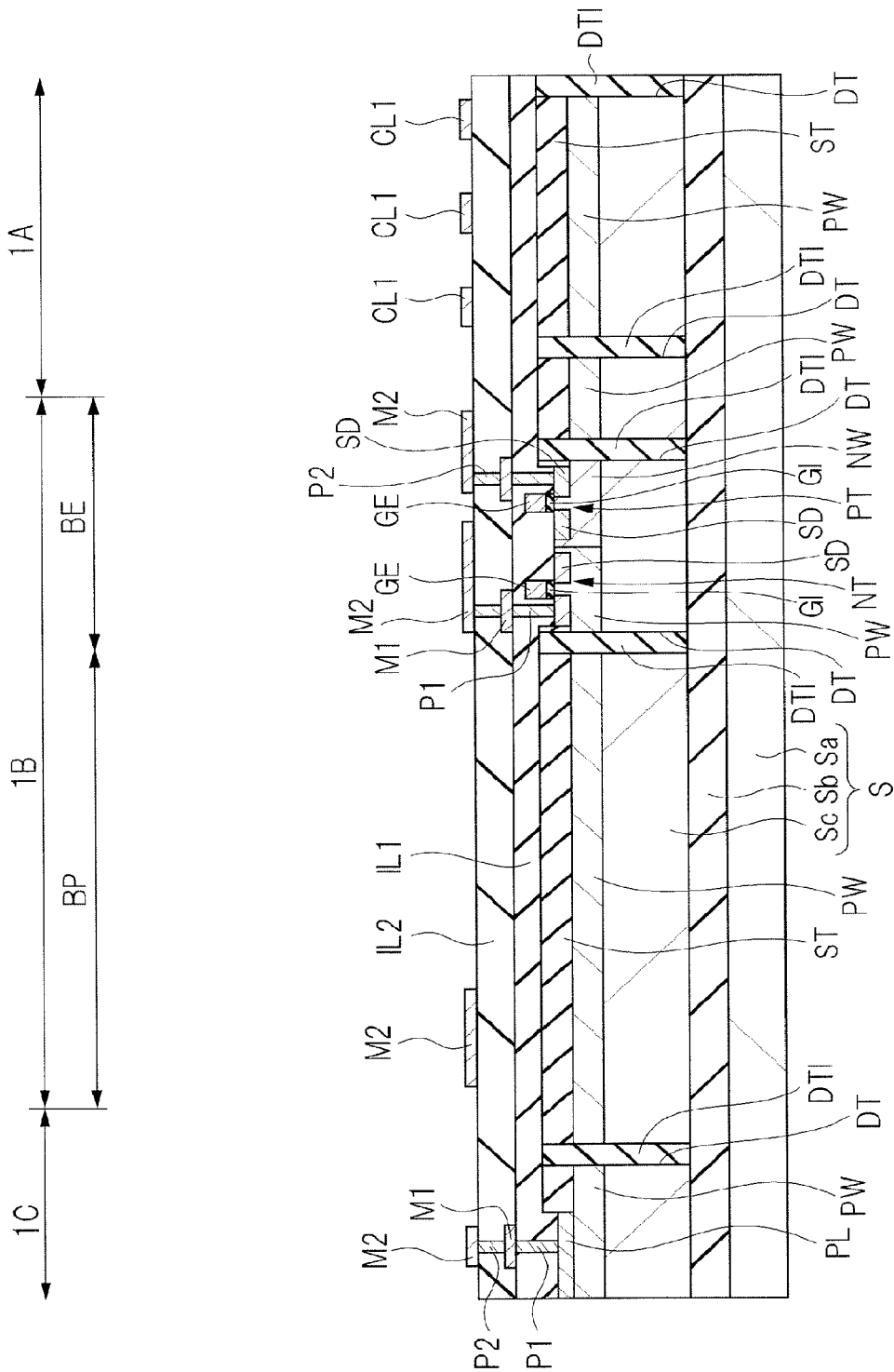
FIG. 16 is a cross-sectional view illustrating a manufacturing process of the semiconductor device of the first embodiment, illustrating a manufacturing process continued from FIG. 15.

Next, as shown in FIG. 16, on the plug P2, a wiring M2 composed of a conductive film is formed. For example, on the interlayer insulator IL2 and the plug P2, an aluminum film and a stacked film composed of a titanium/titanium nitride film are successively deposited as a conductive film, by using a sputtering method or the like. Next, by patterning the above-mentioned stacked film by the use of a photolithography technique and an etching technique, the wiring M2 is formed on the plug P2.

In this case, in the transformer formation region 1A, the coil CL1 of the lower layer is formed as the same layer as the wiring M2. That is, upon patterning the stacked film, in the transformer formation region 1A, the aforementioned spiral-shaped conductive film (coil CL1) is formed (see FIG. 3).

Of course, in the transformer formation region 1A, in addition to the coil CL1, the wiring M2 (for example, a wiring that electrically connects the coil CL1 of the lower layer to the peripheral circuit) may be formed.

Figure 17:
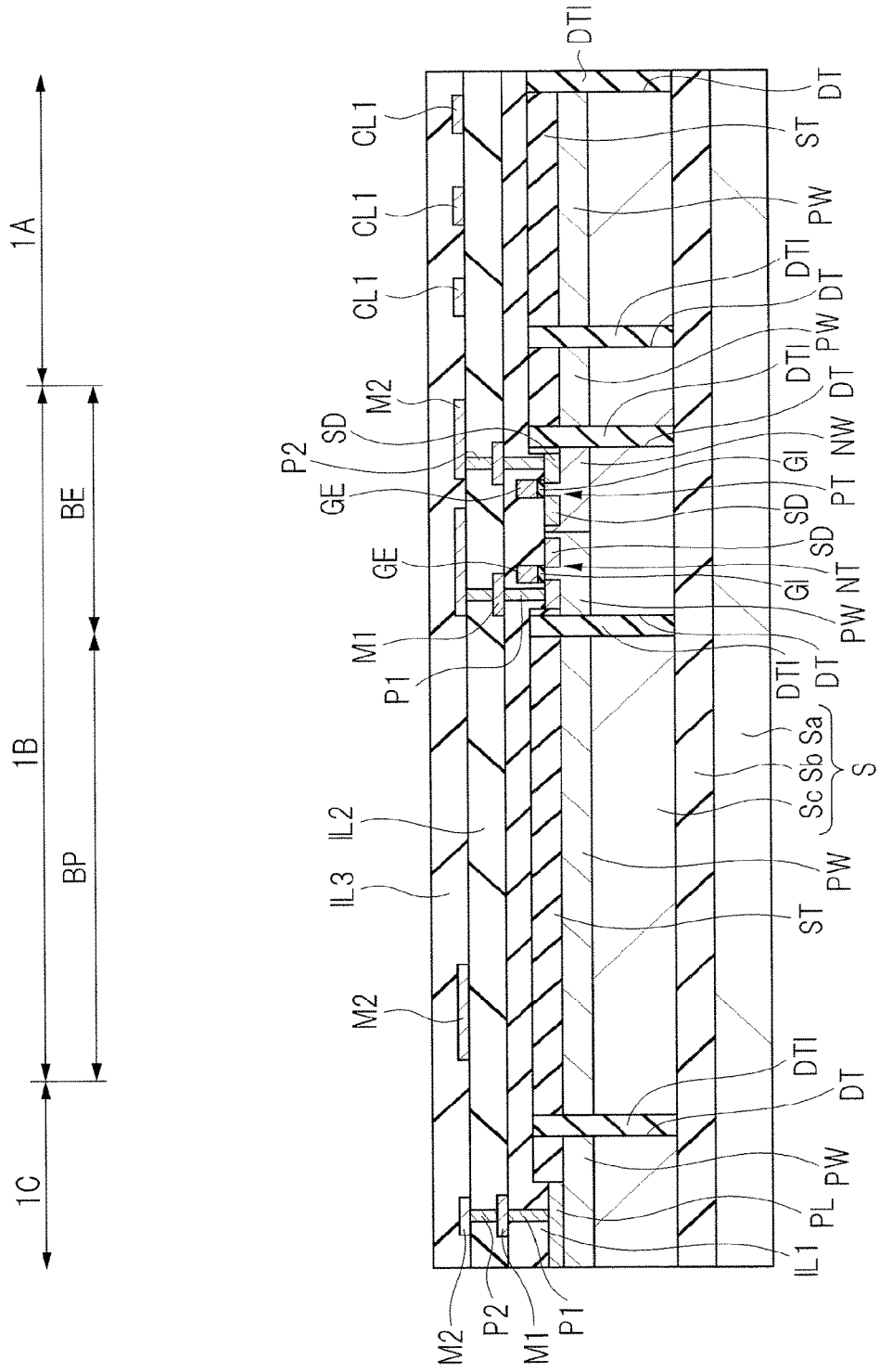
FIG. 17 is a cross-sectional view illustrating a manufacturing process of the semiconductor device of the first embodiment, illustrating a manufacturing process continued from FIG. 16.

Next, as shown in FIG. 17, on the wiring M2, an interlayer insulating film IL3 is formed. For example, on the wiring M2, a silicon oxide film is deposited by using a CVD method or the like.

Figure 18:
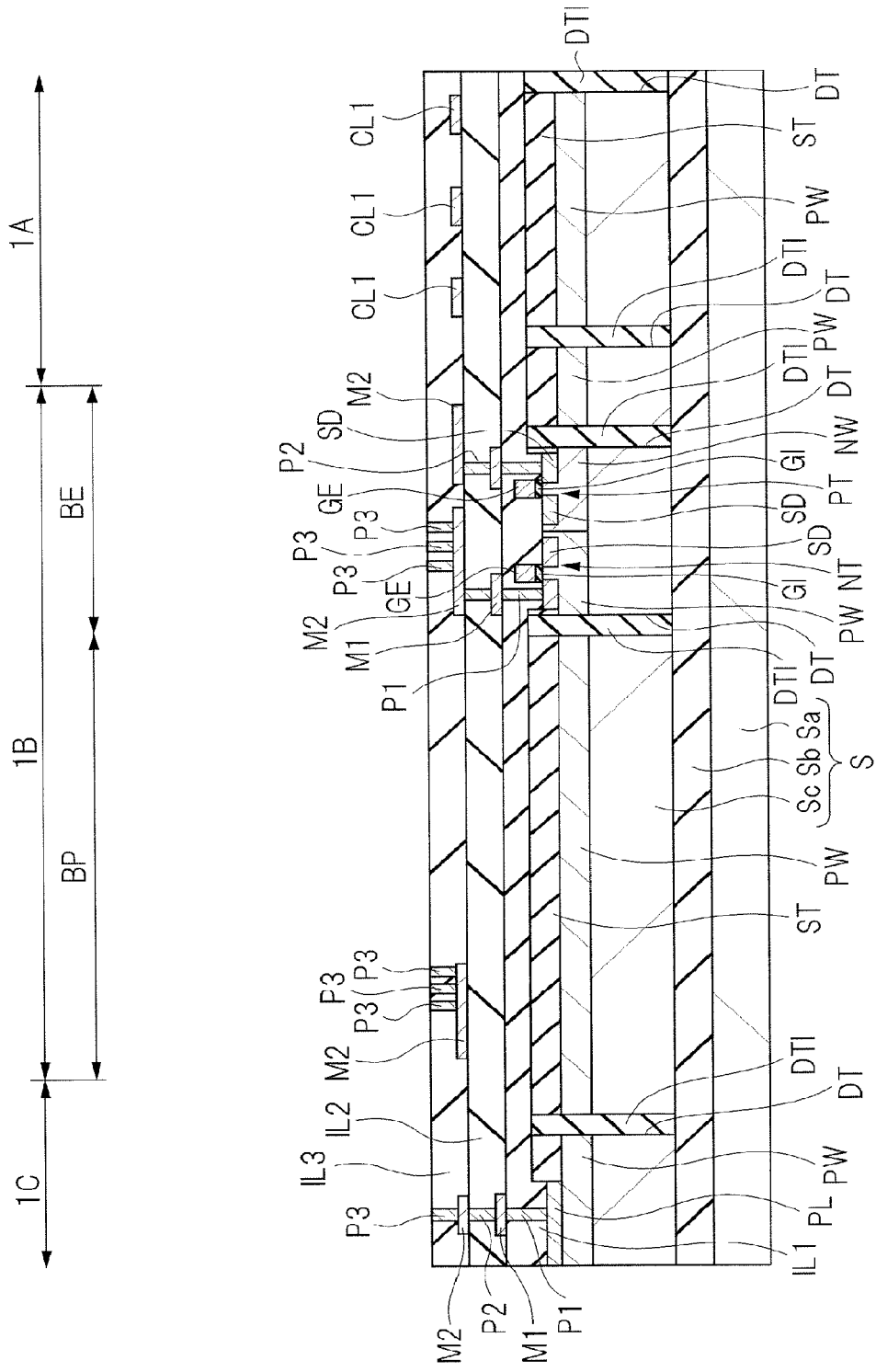
FIG. 18 is a cross-sectional view illustrating a manufacturing process of the semiconductor device of the first embodiment, illustrating a manufacturing process continued from FIG. 17.

Next, as shown in FIG. 18, by patterning the interlayer insulator IL2, a contact hole is formed on the wiring M2, and by further burying a conductive film inside the contact hole, a plug P3 is formed in the interlayer insulator IL3. The plug P3 can be formed in the same manner as in the plug P1.

Figure 19:
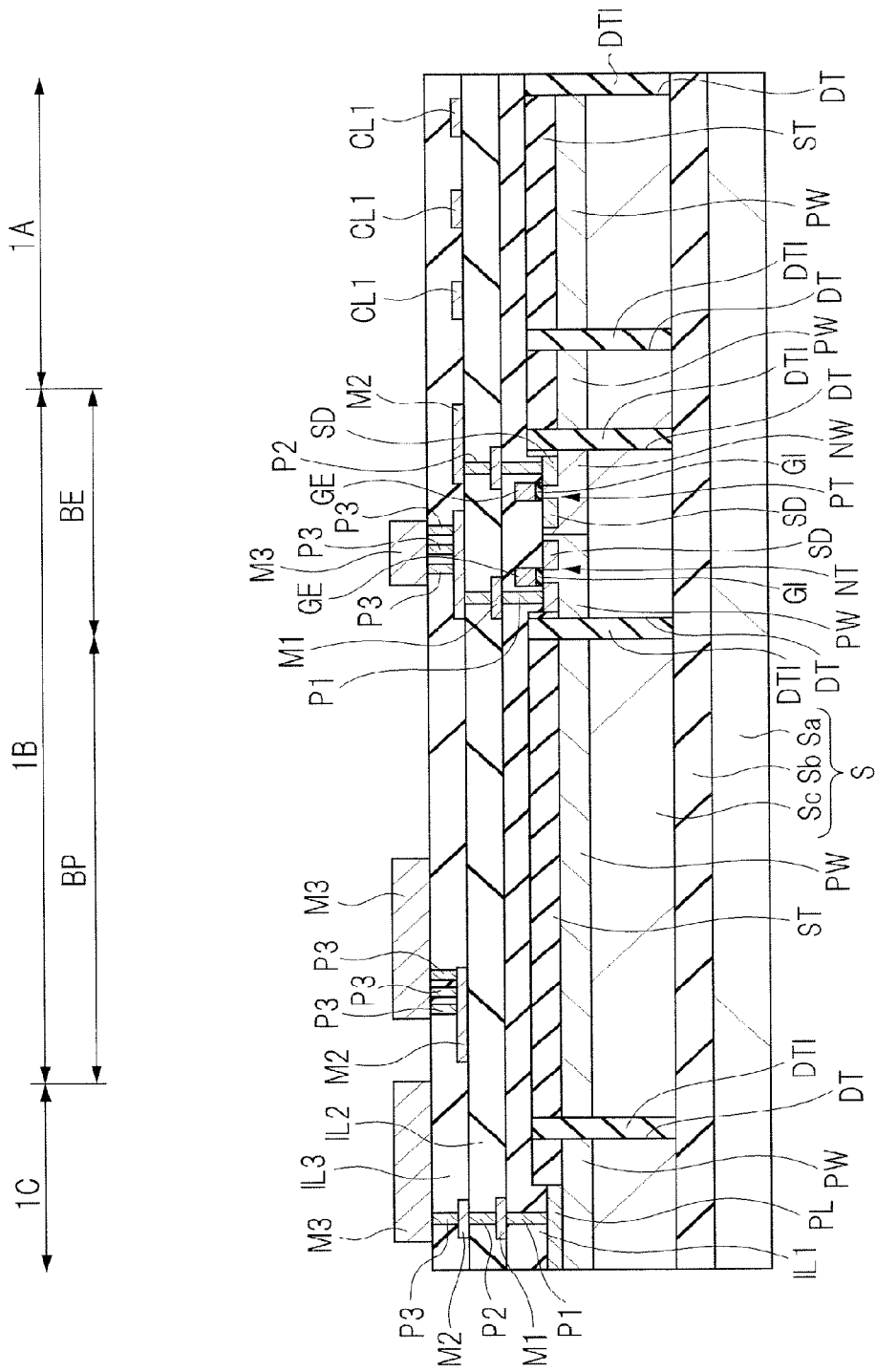
FIG. 19 is a cross-sectional view illustrating a manufacturing process of the semiconductor device of the first embodiment, illustrating a manufacturing process continued from FIG. 18.

Next, as shown in FIG. 19, on the plug P3, a wiring M3 composed of a conductive film is formed. For example, on the interlayer insulator IL3 and the plug P3, an aluminum film and a stacked film composed of a titanium/titanium nitride film are successively deposited as a conductive film, by using a sputtering method or the like. Next, by patterning the above-mentioned stacked film by the use of a photolithography technique and an etching technique, the wiring M3 is formed on the plug P3. The film thickness of the wiring M3 is greater than the film thickness (for example, 0.4 to 1.0 µm) of the wiring M1, M2, and is set to about 3 to 4 µm. In this case, in the seal ring formation region 1C, the wiring M3 is formed as a surrounding wiring.

Next, as shown in FIG. 20 to FIG. 24, an interlayer insulator IL4 is formed on the wiring M3. The interlayer insulator IL4 is formed of a stacked film of an HDP film IL4a and P-TEOS films IL4b, IL4c.

In this case, in accordance with the kind of energy required for reaction of a source gas, the CVD method is classified into a thermal CVD, a plasma CVD or the like. Moreover, the plasma CVD method is classified into a general-use plasma CVD in which a discharge derived from a high frequency of industrial frequency (13.56 MHz) is used, and a high density plasma CVD in which the plasma density is increased in comparison with that of this plasma CVD. Therefore, the HDP film is a film formed by using the high density plasma CVD, and the P-TEOS film is a film formed by using the general-use plasma CVD, with TEOS being used as a source gas.

Figure 20:
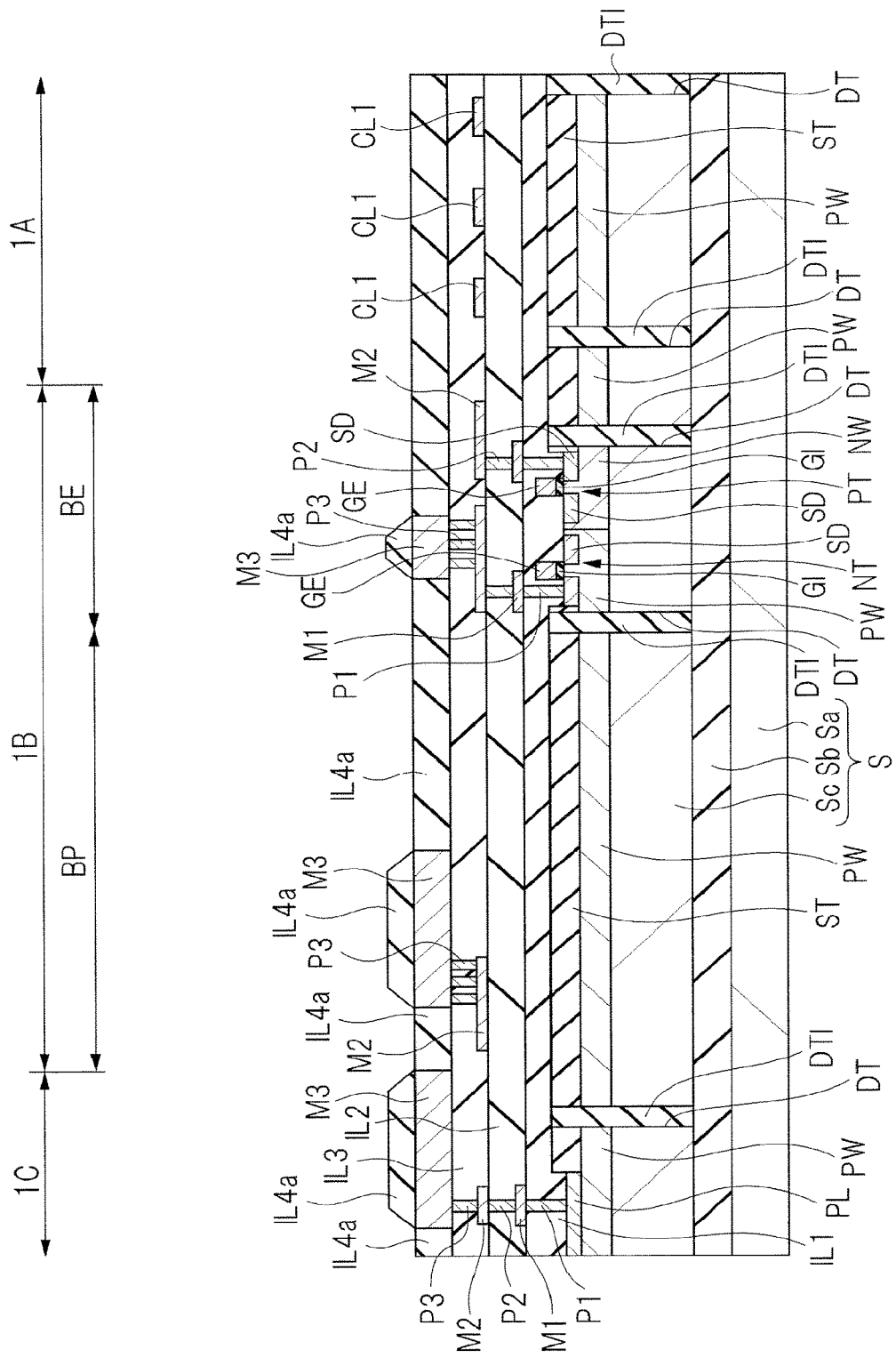
FIG. 20 is a cross-sectional view illustrating a manufacturing process of the semiconductor device of the first embodiment, illustrating a manufacturing process continued from FIG. 19.

First, as shown in FIG. 20, on the wiring M3 and the interlayer insulator IL4, a silicon oxide film is formed as the HDP film IL4a by using the high density plasma CVD method. By using the high density plasma CVD method, the gap between the wirings M3 can be buried with the HDP film IL4a, with high precision and a good flatness, even in the case when the film thickness of the wiring M3 is comparatively high and the step difference (aspect ratio) between the wiring M3 and the interlayer insulator IL4 is large. In particular, in the case when the high density plasma CVD method is used, as described earlier, the film is mainly formed on the gap between the wirings M3 as well as on the wiring M3.

Figure 21:
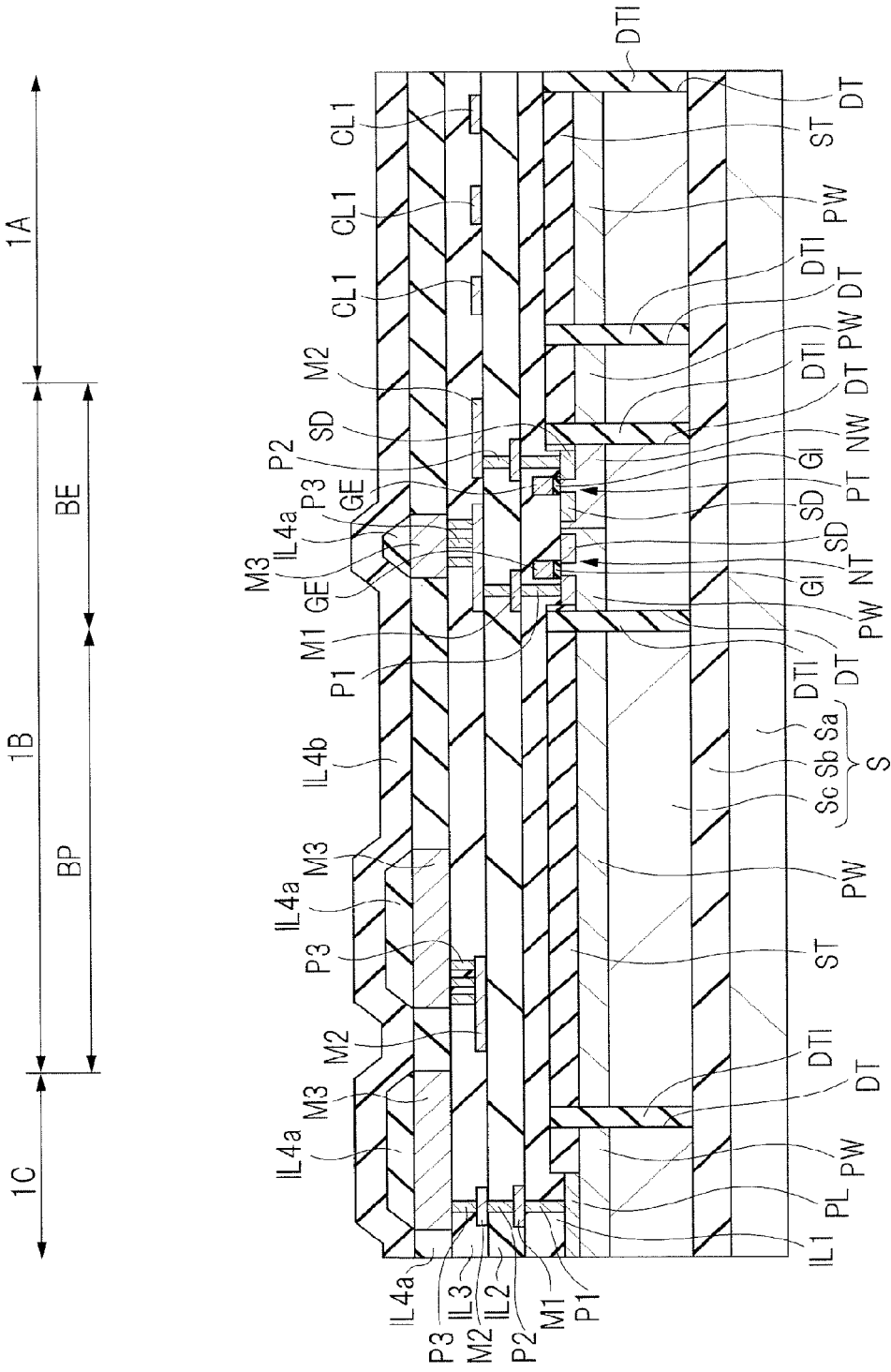
FIG. 21 is a cross-sectional view illustrating a manufacturing process of the semiconductor device of the first embodiment, illustrating a manufacturing process continued from FIG. 20.

Next, as shown in FIG. 21, the P-TEOS film IL4b is formed on the HOP film IL4a. That is, by using a plasma CVD using TEOS as a source gas, the P-TEOS film (silicon oxide film) IL4b is deposited on the HDP film IL4a.

Figure 22:
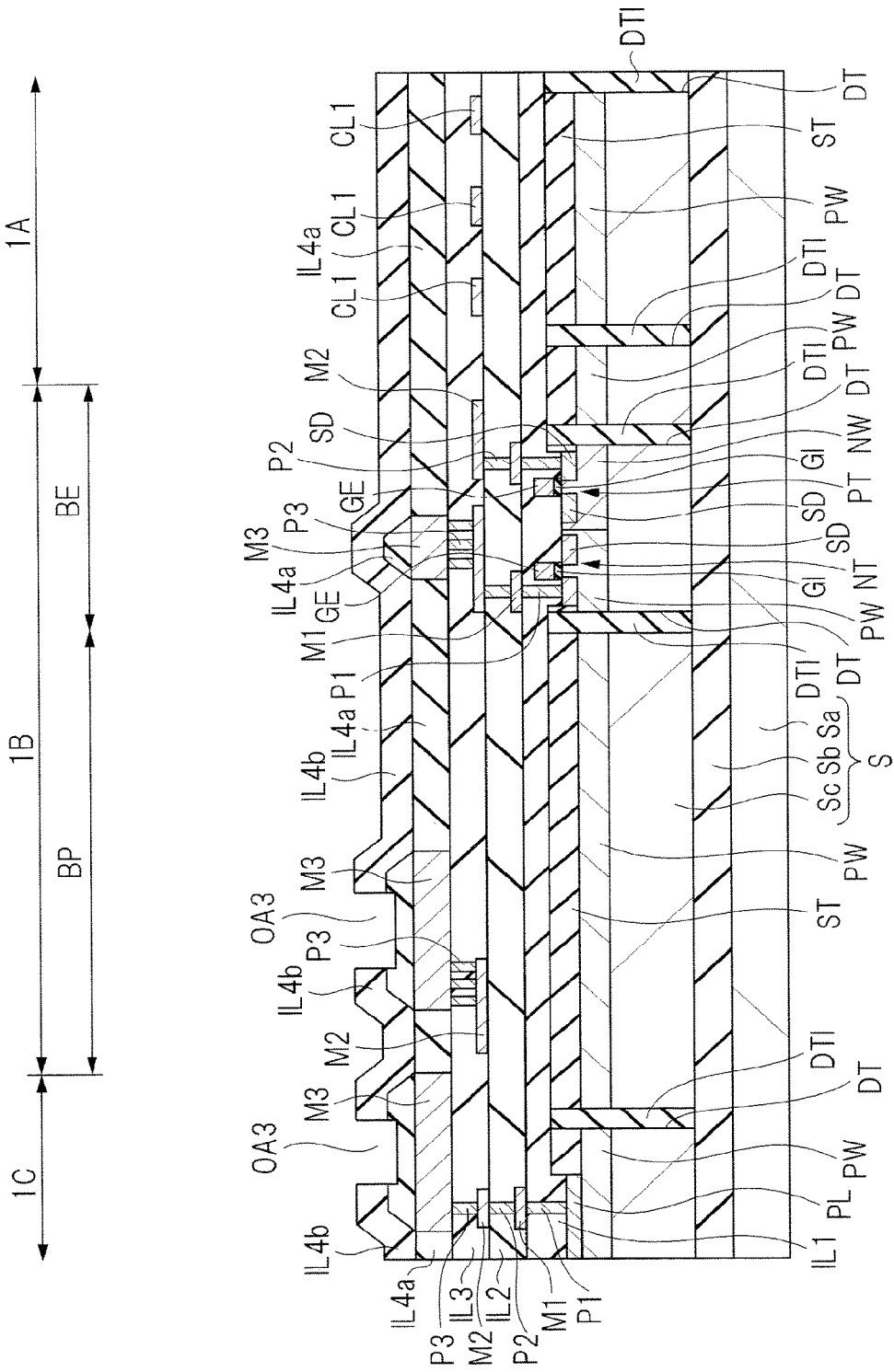
FIG. 22 is a cross-sectional view illustrating a manufacturing process of the semiconductor device of the first embodiment, illustrating a manufacturing process continued from FIG. 21.

Thereafter, a flattening process is carried out on the surface of the P-TEOS film IL4b by using a CMP method or the like, and in this case, the HDP film IL4a and the P-TEOS film IL4b on the wiring M3 having a planarly large size (having a wide width) are preliminarily removed by using a dry etching process. In this case, as shown in FIG. 22, the HDP film IL4a and the P-TEOS film IL4b on the wiring M3 of the pad formation region BP as well as on the wiring M3 of the seal ring formation region 1C are removed by dry etching so that an opening portion OA3 is formed.

Figure 23:
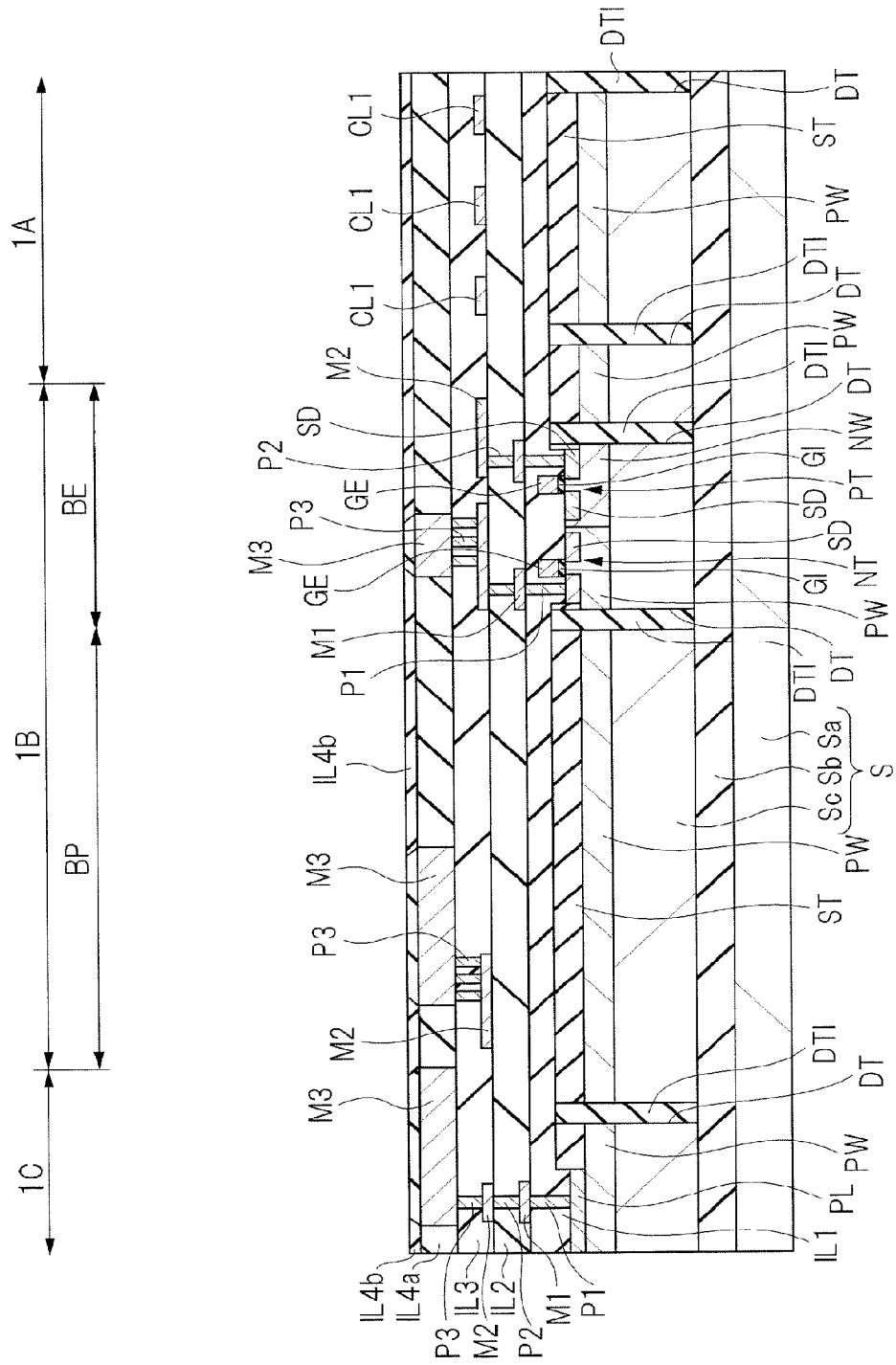
FIG. 23 is a cross-sectional view illustrating a manufacturing process of the semiconductor device of the first embodiment, illustrating a manufacturing process continued from FIG. 22.
Figure 24:
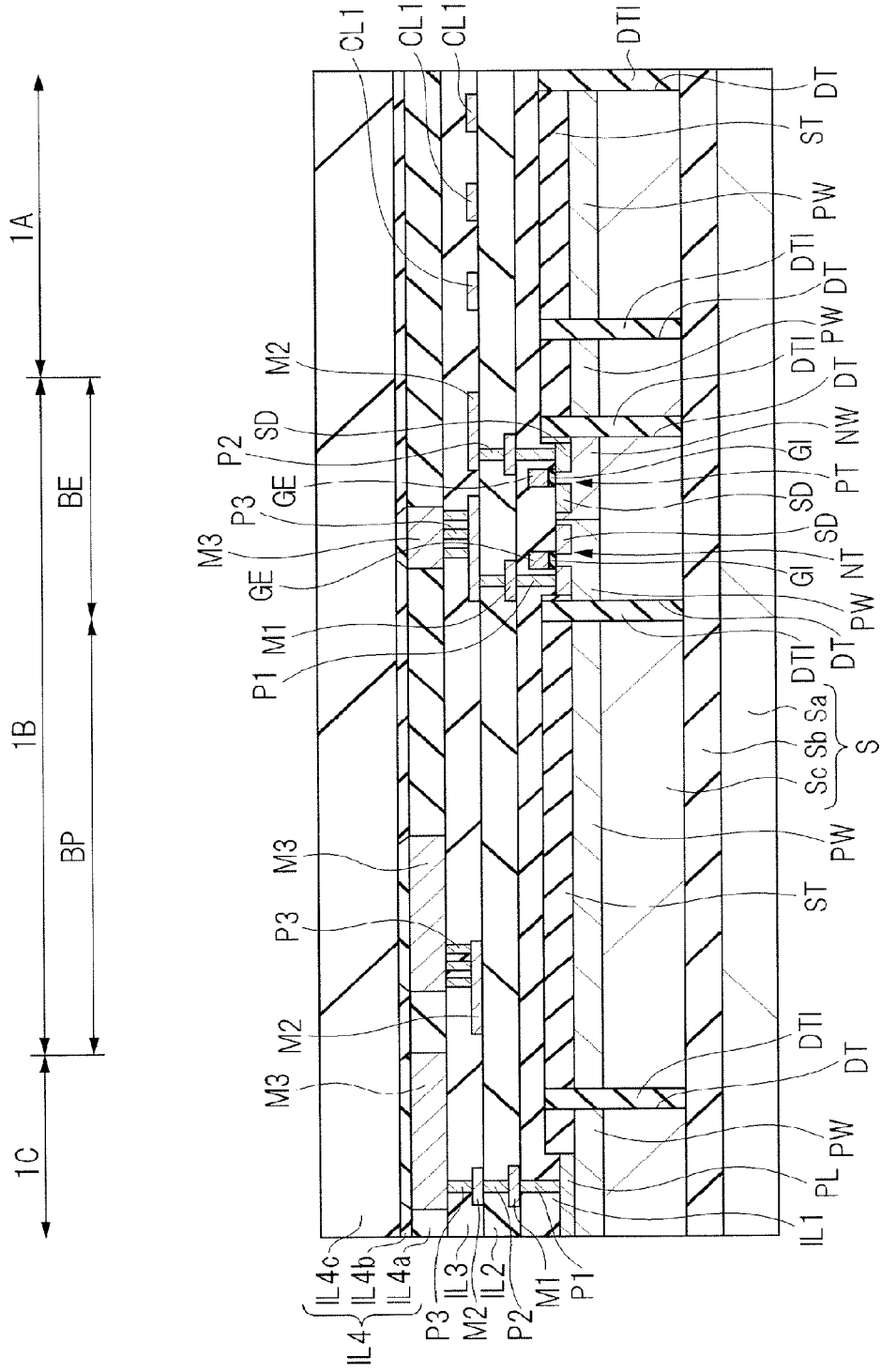
FIG. 24 is a cross-sectional view illustrating a manufacturing process of the semiconductor device of the first embodiment, illustrating a manufacturing process continued from FIG. 23.

Next, as shown in FIG. 23, the surfaces of the HDP film IL4a and the P-TEOS film IL4b are flattened by using a CMP method or the like. Then, as shown in FIG. 24, a P-TEOS film IL4c is formed on the HDP film IL4a and the P-TEOS film IL4b. That is, by using plasma CVD with TEOS being used as a source gas, the P-TEOS film IL4c is deposited on the HDP film IL4a and the P-TEOS film IL4b. Thus, on the wiring M3, an interlayer insulator IL4 composed of the HDP film IL4a and the stacked film of the P-TEOS films IL4b, IL4c is formed. The film thickness of the interlayer insulator IL4 is about 8 µm, and preferably set to 4 µm or more.

Figure 25:
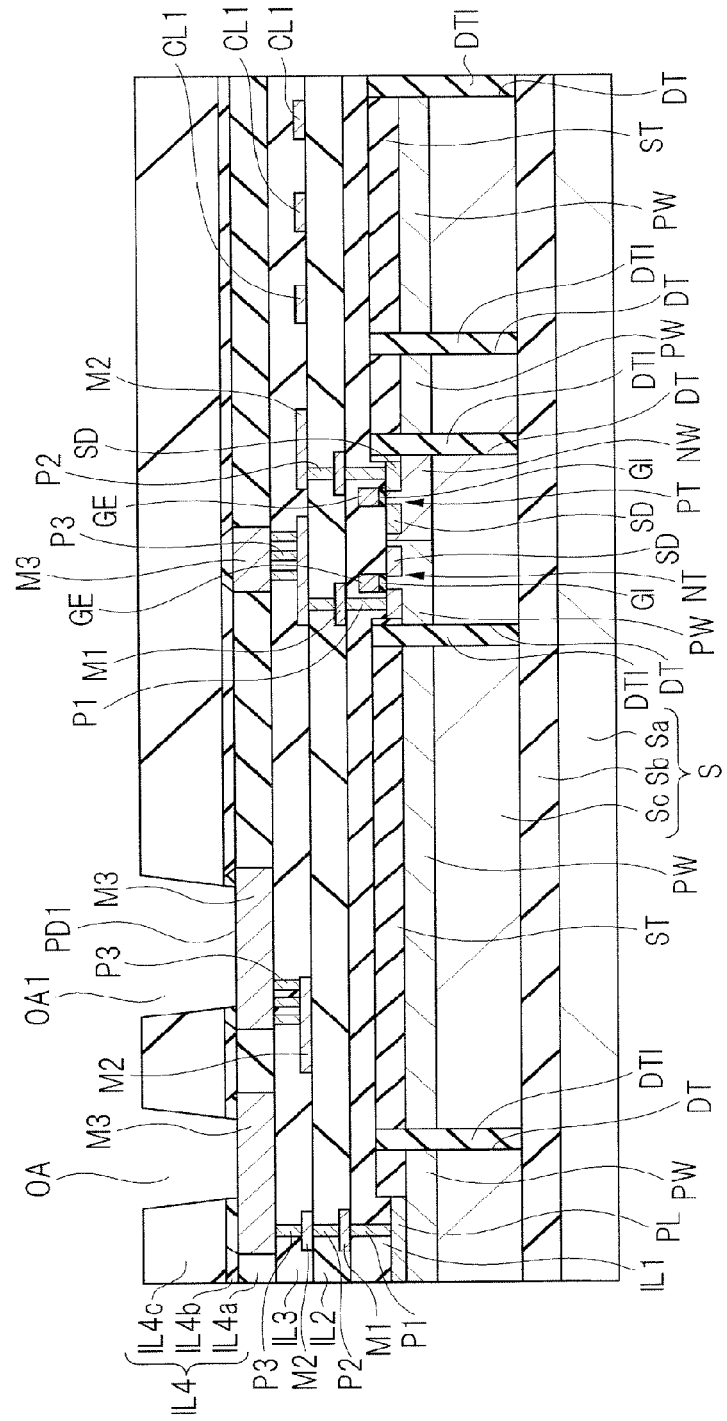
FIG. 25 is a cross-sectional view illustrating a manufacturing process of the semiconductor device of the first embodiment, illustrating a manufacturing process continued from FIG. 24.

Next, as shown in FIG. 25, by removing the interlayer insulator IL4 from the wiring M3 of the pad formation region BP and the wiring M3 of the seal ring formation region 1C, openings OA1 and OA are formed. For example, a photoresist film having openings on the formation regions of the openings OA1 and OA is formed on the interlayer insulator IL4, and by etching the interlayer insulator IL4, with the photoresist film being used as a mask, the openings OA1 and OA are formed. The wiring M3 is exposed to the bottom surface of the opening portion OA1 of the pad formation region BP.

Figure 26:
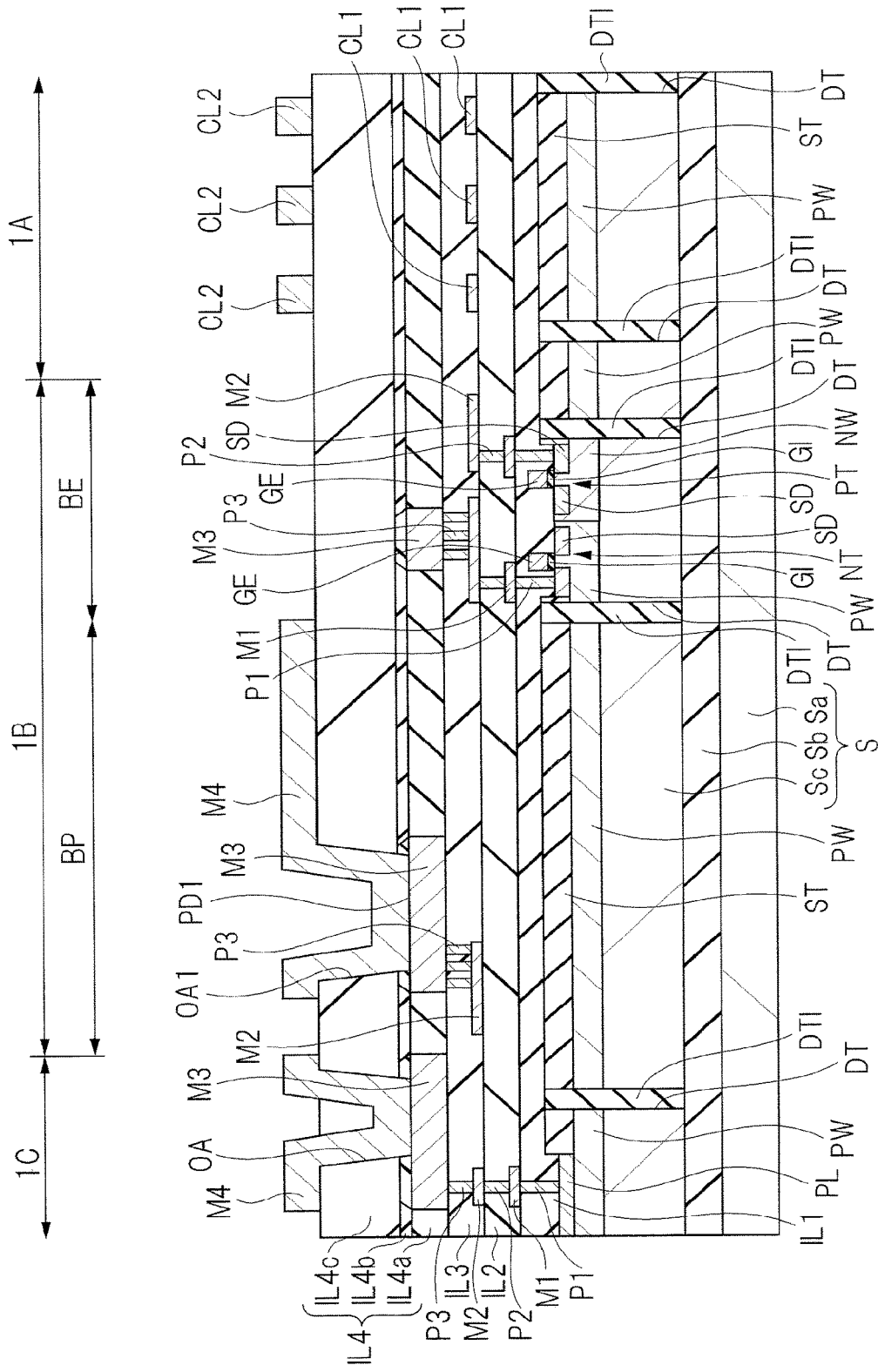
FIG. 26 is a cross-sectional view illustrating a manufacturing process of the semiconductor device of the first embodiment, illustrating a manufacturing process continued from FIG. 25.

Next, as shown in FIG. 26, a wiring M4 is formed on the interlayer insulator ILA including the insides of the openings OA1 and OA. For example, on the interlayer insulator IL4 including the insides of the openings OA1 and OA, a stacked film composed of an aluminum film and a titanium/titanium nitride film is successively deposited as a conductive film by using a sputtering method or the like. Next, by patterning the stacked film by the use of a photolithography technique and an etching technique, the wiring M4 is formed. The film thickness of the wiring M4 is about 3 to 4 µm.

In this case, in the transformer formation region 1A, the coil CL2 of the upper layer is formed as the same layer as the wiring M4. That is, upon patterning the above-mentioned stacked film, in the transformer formation region 1A, the aforementioned spiral-shaped conductive film (coil CL2) is formed (see FIG. 3). Moreover, in the present embodiment, as described earlier, the wiring M4 prepared as the same layer as the wiring M4 in the peripheral circuit formation region 1B is formed as a surrounding wiring on the wiring M3 in the seal ring formation region 1C.

Figure 27:
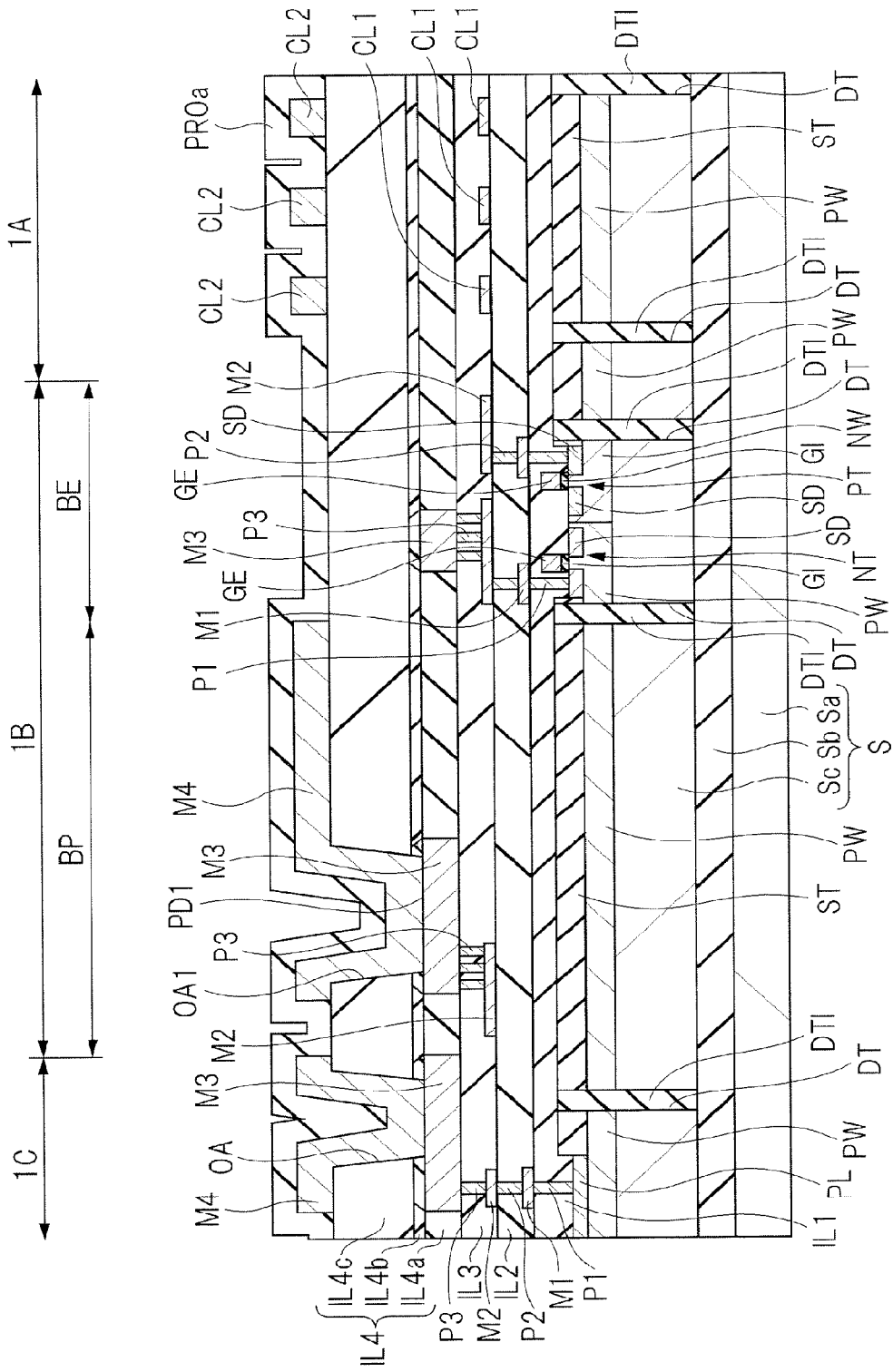
FIG. 27 is a cross-sectional view illustrating a manufacturing process of the semiconductor device of the first embodiment, illustrating a manufacturing process continued from FIG. 26.
Figure 28:
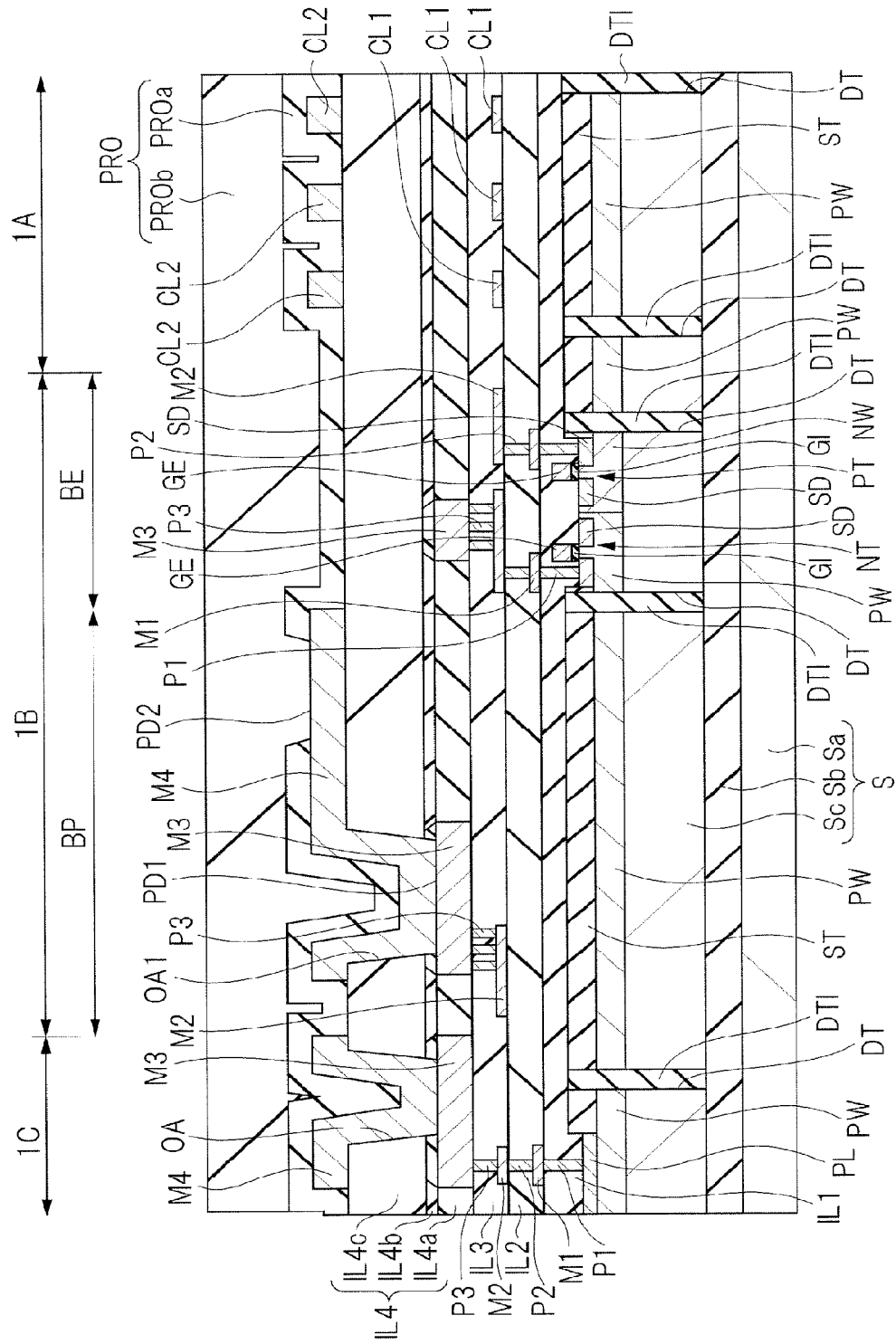
FIG. 28 is a cross-sectional view illustrating a manufacturing process of the semiconductor device of the first embodiment, illustrating a manufacturing process continued from FIG. 27.

Next, as shown in FIG. 27 and FIG. 28, an insulating film is formed on the coil CL2 and the wiring M4 as a protective film PRO. In this case, as the insulating film, for example, a stacked film composed of a silicon nitride film PROa and a polyimide film PROb is formed. First, as shown in FIG. 27, the silicon nitride film PROa is deposited on the coil CL2 and the wiring M4 by using a CVD method or the like. Next, as shown in FIG. 28, by using a photoresist film, not illustrated, on the silicon nitride film PROa as a mask, the silicon nitride film PROa on the pad region PD2 of the wiring M4 is etched and removed so that the wiring M4 on the pad region PD2 is exposed.

Next, on the pad region PD2 and the silicon nitride film PROa, a photosensitive polyimide film PROb is applied. For example, after a precursor liquid of polyimide has been rotated and applied onto the surface of the SOI substrate S, this is dried so that the polyimide film PROb is formed. Next, by exposing and developing the photosensitive polyimide film PROb, the polyimide film PROb on the pad region PD2 is removed so that an opening portion OA2 is formed (see FIG. 2). At this time, the polyimide film PROb on the upper portion of the wiring M3 in the seal ring formation region 1C is also removed. Thereafter, by carrying out a heating treatment thereon, the polyimide film PROb is cured.

Thereafter, by cutting (dicing) the wafer-state SOI substrate S for each of the chip region, it is divided (into individual pieces) into a plurality of semiconductor chips. Thus, a semiconductor chip is obtained by each of the chip regions of the SOI substrate S (semiconductor wafer). Additionally, prior to the dicing process, the rear surface of the SOI substrate S may be polished to form the SOI substrate S into a thin film.

Next, by connecting the pad region PD2 of the cut-out semiconductor chip to a pad region of another semiconductor chip by using a wire or the like, a semiconductor device with two semiconductor chips being electrically connected is formed (see FIG. 1).

(Second Embodiment)

Figure 29:
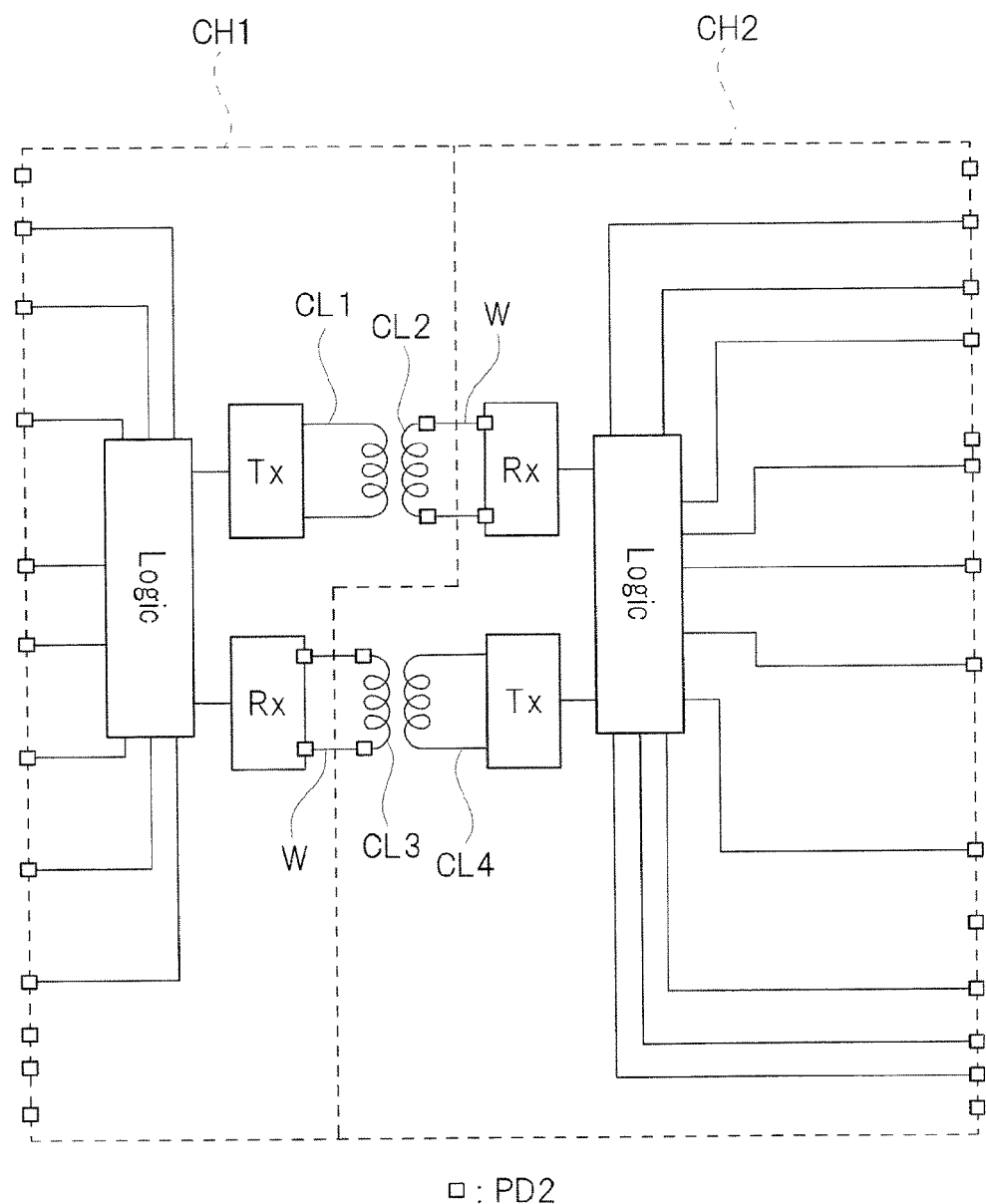
FIG. 29 is a block diagram illustrating a configuration of a semiconductor device in accordance with a second embodiment.
Figure 30:
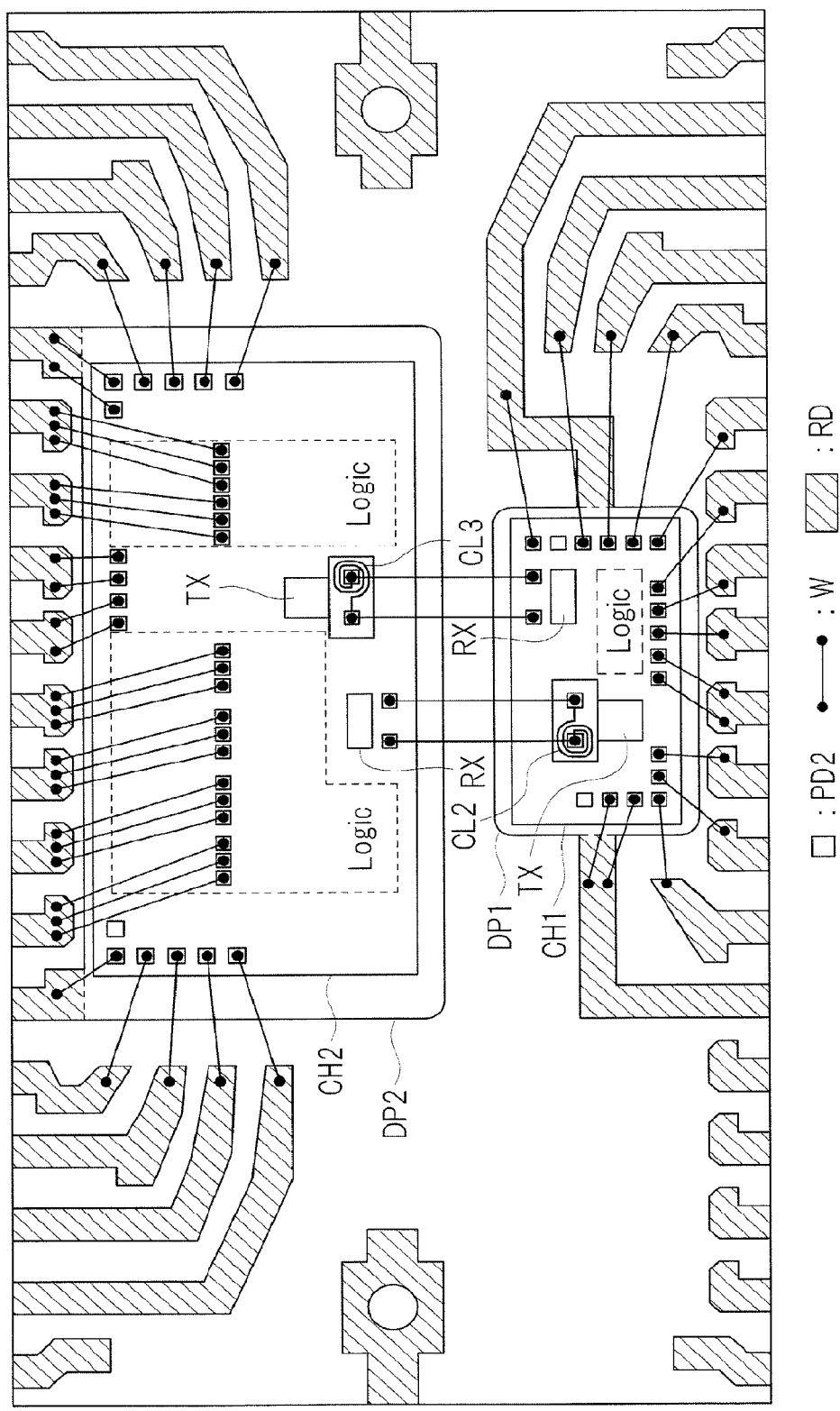
FIG. 30 is a plan view illustrating the configuration of the semiconductor device of the second embodiment.

In the present embodiment, an explanation will be given to an applied portion of the semiconductor device explained in the first embodiment. FIG. 29 is a block diagram illustrating a configuration of a semiconductor device in accordance with the present embodiment. FIG. 30 is a plan view illustrating the configuration of the semiconductor device of the present embodiment.

In the semiconductor device shown in FIG. 29, the chip CH1 and chip CH2 are formed into one package.

The chip CH1 is provided with a transformer composed of a coil CL1 connected to a transmission circuit Tx and a coil CL2. The coil CL2 is connected to a receiving circuit Rx of the chip CH2 with pad regions PD2 and wires W interposed therebetween. Additionally, in FIG. 29 and FIG. 30, the pad regions PD2 are indicated by square portions.

Moreover, the chip CH1 is provided with the receiving circuit Rx and a logic circuit Logic. The logic circuit Logic is connected to the transmission circuit Tx and the receiving circuit Rx of the chip CH1, and the logic circuit Logic is connected to the plural pad regions PD2.

The chip CH2 is provided with a transformer composed of a coil CL4 connected to a transmission circuit Tx and a coil CL3. The coil CL3 is connected to a receiving circuit Rx of the chip CH1 with pad regions PD2 and wires W interposed therebetween.

Moreover, the chip CH2 is provided with the receiving circuit Rx and a logic circuit Logic. The logic circuit Logic is connected to the transmission circuit Tx and the receiving circuit Rx of the chip CH2, and the logic circuit Logic is connected to the plural pad regions PD2.

As shown in FIG. 30, the coil CL2 of the chip CH1 is connected to the receiving circuit Rx of the chip CH2 through wires W. On the lower layer of the coil CL2, a coil (CL1), not illustrated, is disposed, and connected to the transmission circuit Tx of the chip CH1 through wires, not illustrated.

Moreover, the coil CL3 of the chip CH2 is connected to the receiving circuit Rx of the chip CH1. On the lower layer of the coil CL3, a coil (CL4), not illustrated, is disposed, and connected to the transmission circuit Tx of the chip CH2 through wires, not illustrated.

For example, the logic circuit Logic is disposed on the chip CH2. In the chip CH2, a peripheral circuit composed of the logic circuit Logic, the transmission circuit Tx, the receiving circuit Rx and the like is connected to the plural pad regions PD2 through wires, not illustrated. Moreover, in the chip CH1, a peripheral circuit composed of the logic circuit Logic, the transmission circuit Tx, the receiving circuit Rx and the like is connected to the plural pad regions PD2 through wires, not illustrated.

The pad regions PD2 of the chips CH1 and CH2 are connected to leads RD through wires W.

In this semiconductor device, the configuration (see FIG. 2, etc.) of the first embodiment can be applied to the peripheral circuit portion composed of the logic circuit Logic, the transmission circuit Tx, the receiving circuit Rx and the like of the chip CH2 and the transformer (coils CL1 and CL2) portion.

Moreover, the configuration (see FIG. 2, etc.) of the first embodiment can be applied to the peripheral circuit portion composed of the logic circuit Logic, the transmission circuit Tx, the receiving circuit Rx and the like of the chip CH1 and transformer (coils CL3 and CL4) portion.

(Third Embodiment)

In the present embodiment, explanations will be given to various application examples of the first embodiment.

<First Application Example>

In the first embodiment, the coil CL2 (single coil, see FIG. 3) having a string of coil portions wound clockwise substantially centered on the pad region PD2 has been exemplified; however, the shape of the coil CL2 is not particularly limited, and coils having various shapes may be used.

Figure 31:
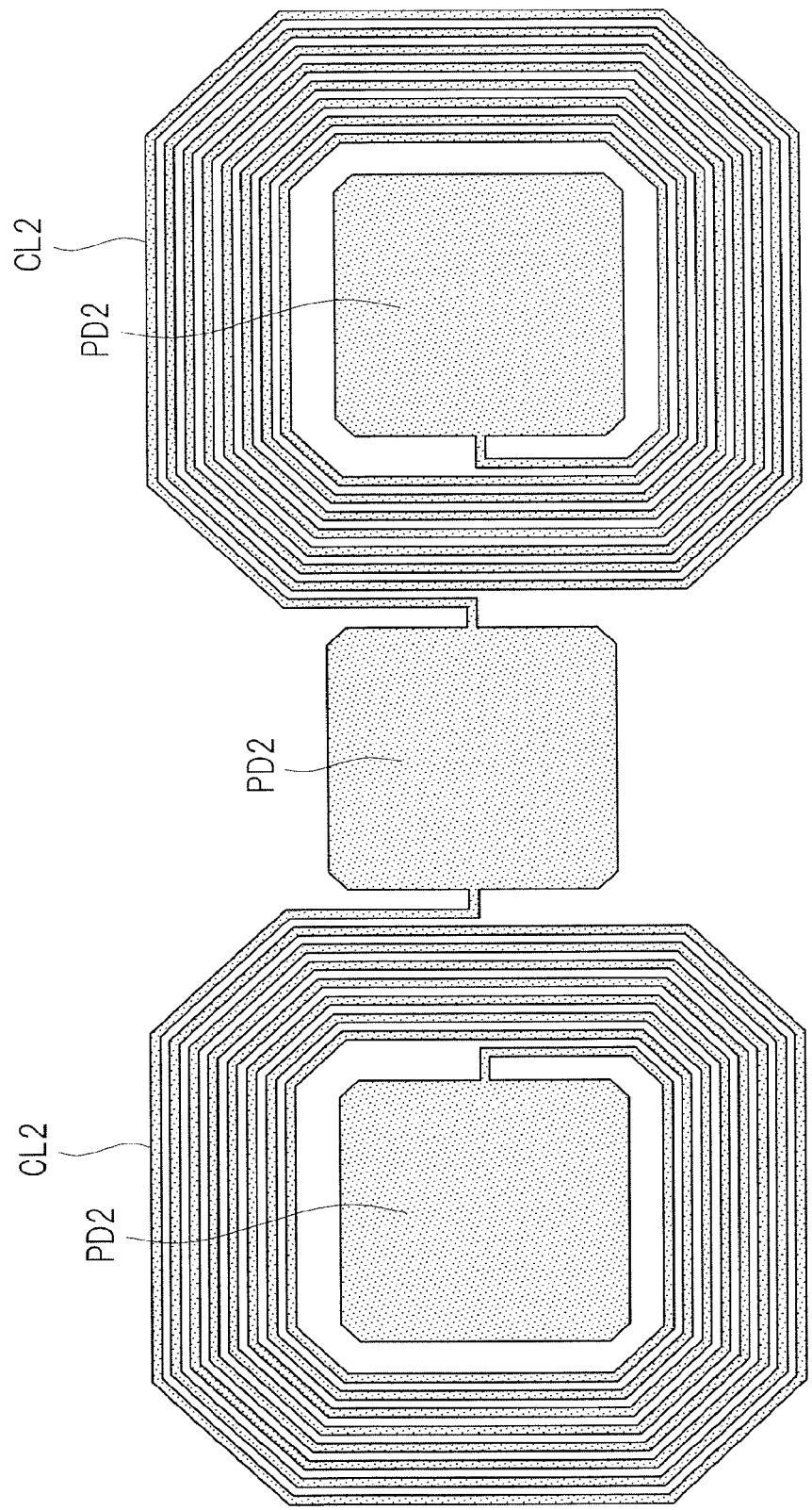
FIG. 31 is a plan view illustrating a configuration of a coil in accordance with a first application example of a third embodiment.

FIG. 31 is a plan view illustrating a configuration of a coil in accordance with a first application example of the present embodiment. The coil CL2 shown in FIG. 31 has two coil portions. That is, a string of coil portion wound clockwise substantially centered on the first pad region PD2 and a string of coil portion wound counter-clockwise substantially centered on the second pad region PD2 are prepared, and end portions on the outside of the two coil portions are respectively connected to the third pad region PD2.

Figure 32:
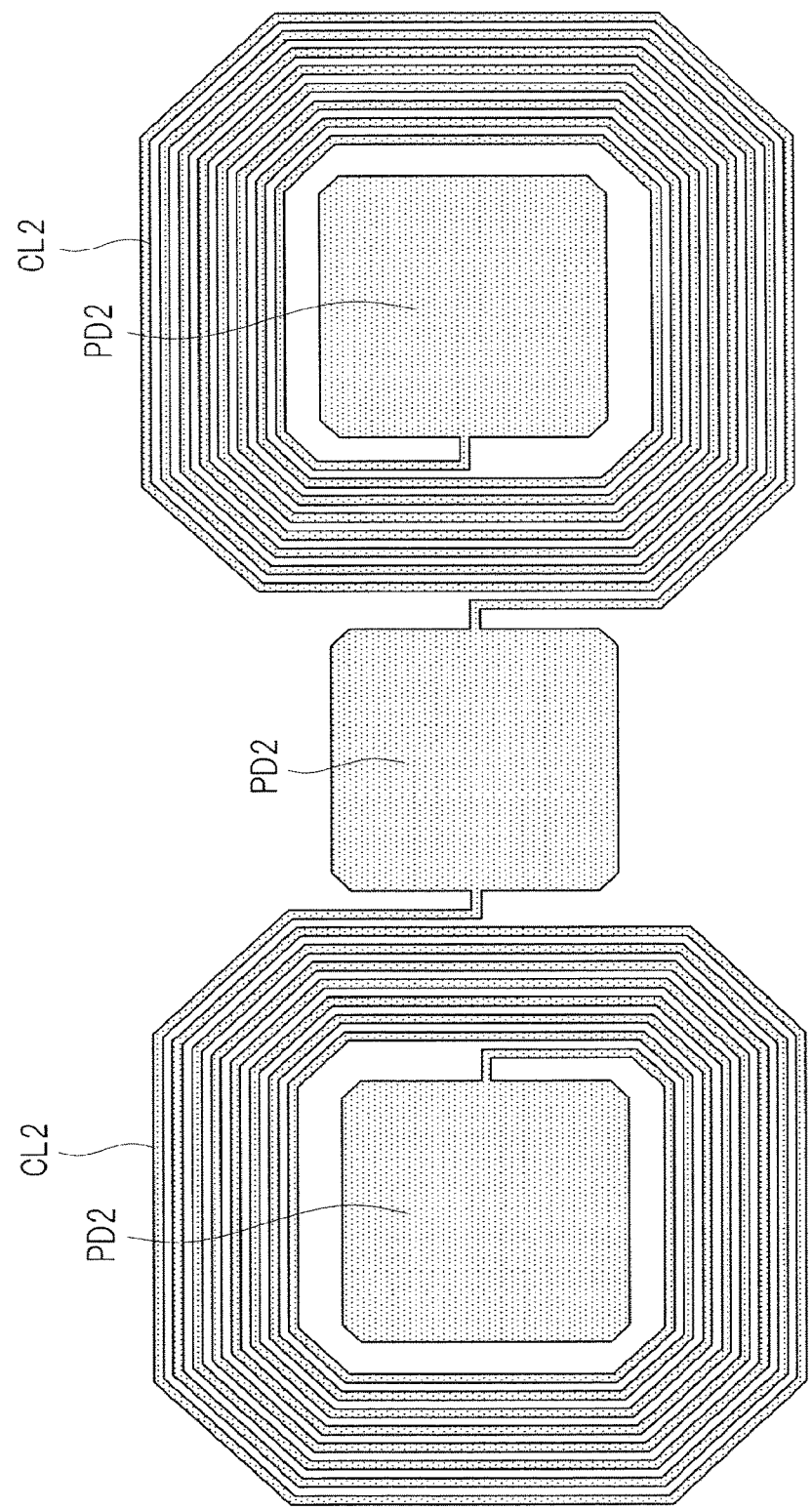
FIG. 32 is a plan view illustrating another configuration of the coil in accordance with the first application example of the third embodiment.

FIG. 32 is a plan view illustrating another configuration of a coil in accordance with first application example of the present embodiment. The coil CL2 shown in FIG. 32 has two coil portions. That is, a string of coil portion wound clockwise substantially centered on the first pad region PD2 and a string of coil portion wound clockwise substantially centered on the second pad region PD2 are prepared, and end portions on the outside of the two coil portions are respectively connected to the third pad region PD2.

In this manner, the coil CL2 of the upper layer having two coil portions and three pad regions PD2 may be used. In this case, the coil CL1 of the lower layer is configured to have two coil portions in the same manner as in the coil on the upper layer. The coil having two coil portions in this manner is referred to as "twin coil".

Figure 33:
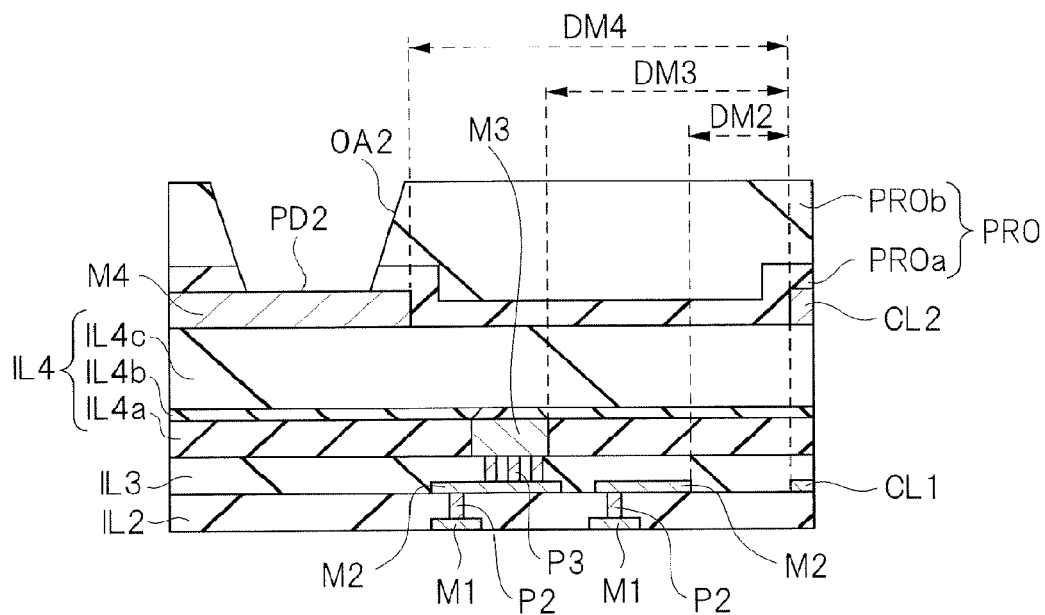
FIG. 33 is a cross-sectional view illustrating main parts of a semiconductor device in the case of using a twin coil.
Figure 34:
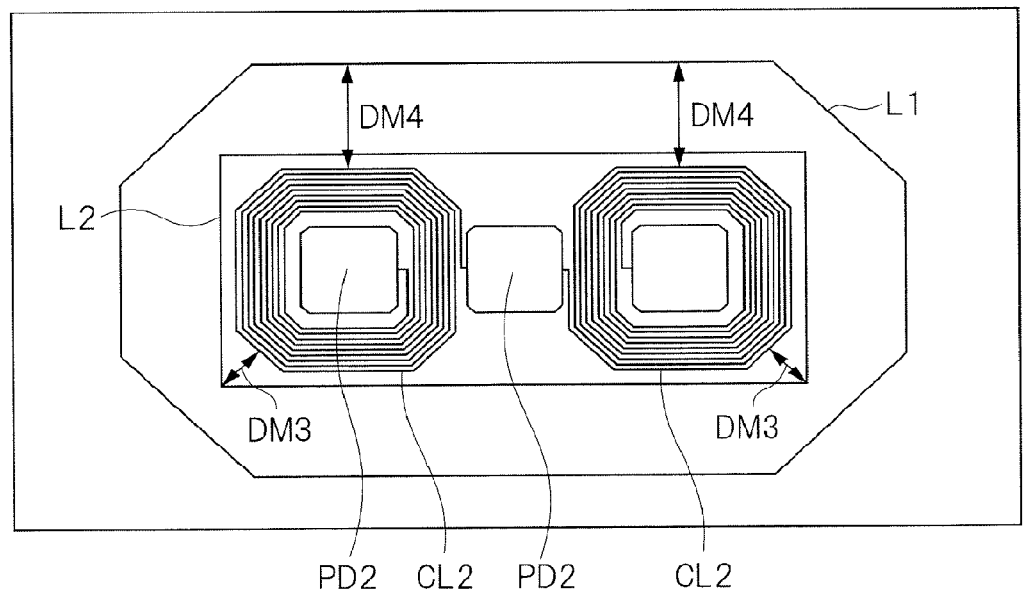
FIG. 34 is a plan view illustrating main parts of the semiconductor device in the case of using the twin coil.

FIG. 33 is a cross-sectional view illustrating main parts of a semiconductor device using the twin coil, and FIG. 34 is a plan view illustrating the main parts of the semiconductor device using the twin coil.

As shown in FIG. 33, a distance DM4 between the coil CL2 of the upper layer and the wiring M4 is longer than a distance DM3 between the coil CL2 of the upper layer and the wiring M3 (DM4>DM3). Moreover, a distance DM3 between the coil CL2 of the upper layer and the wiring M3 is made to be a distance between the coil CL2 of the upper layer and the coil CL1 of the lower layer (sum of film thicknesses of the interlayer insulators IL3 and IL4, for example, about 5 μm) or more.

A line L1 shown in FIG. 34 forms a frame indicating a space between the coil CL2 of the upper layer and the wiring M4. A line L2 forms a frame indicating a space between the coil CL2 of the upper layer and the wiring M3. In other words, the wiring M4 is disposed on an outer side (region on a side opposite to the coil CL2 side) from the line L1, and the wiring M3 is disposed on an outer side from the line L1.

In this manner, the distance DM4 between the coil CL2 of the upper layer and the wiring M4 is made longer than the distance DM3 between the coil CL2 of the upper layer and the wiring M3, and the distance DM3 between the coil CL2 of the upper layer and the wiring M3 is made to be a distance between the coil CL2 of the upper layer and the coil CL1 of the lower layer (sum of film thicknesses of the interlayer insulators IL3 and IL4) or more. Thus, in the case of using the twin coil also, it is possible to improve an insulation withstand voltage between the coil CL2 and the wiring M4, as well as between the coil CL2 and the wiring M3, where a high voltage difference tends to be caused, in the same manner as in the first embodiment.

Figure 35:
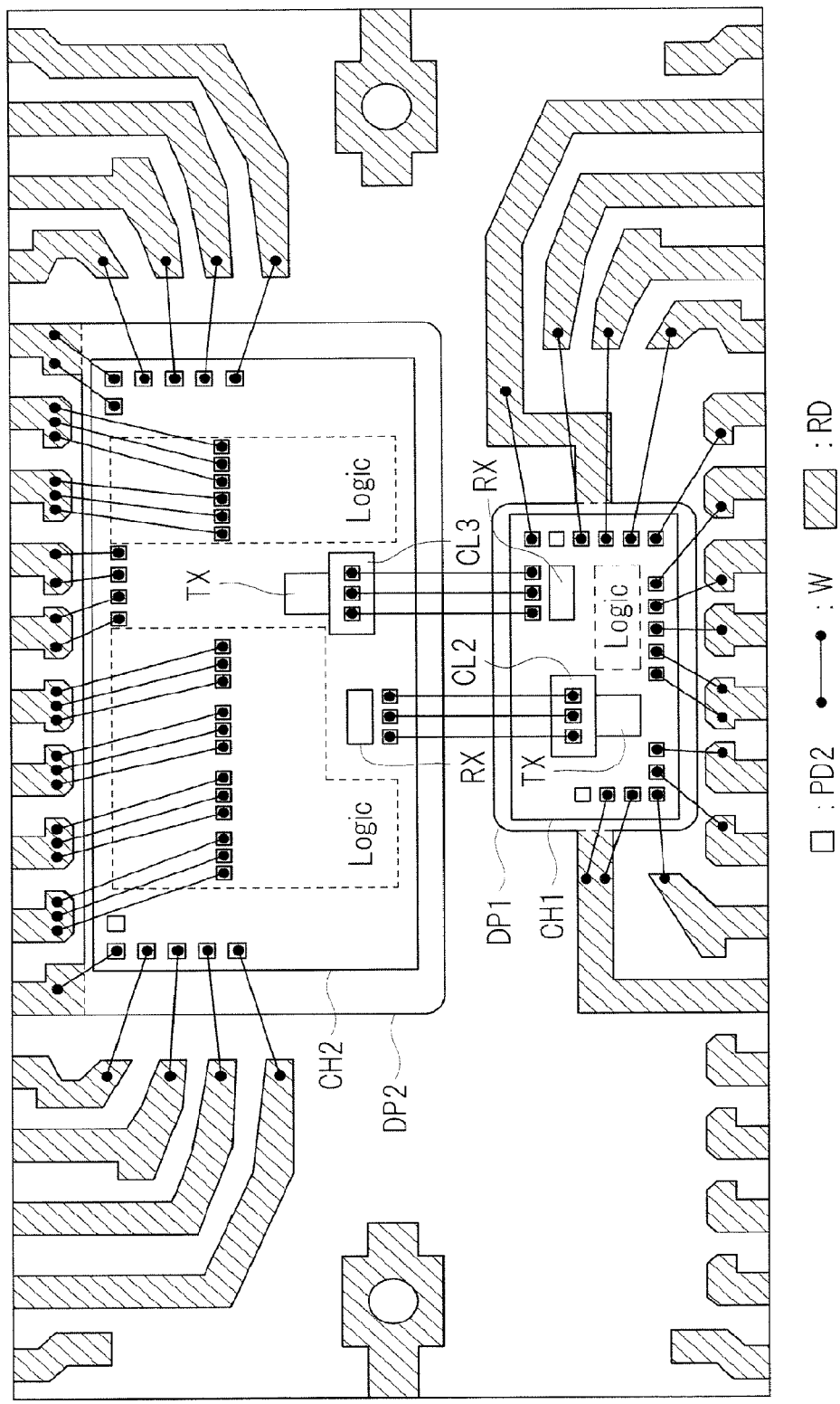
FIG. 35 is a plan view illustrating an example of a configuration of a semiconductor device (package) in the case of using the twin coil.

FIG. 35 is a plan view illustrating an example of a configuration of a semiconductor device (package) in the case of using the twin coil. In the semiconductor device shown in FIG. 35, the chip CH1 and the chip CH2 are formed into one package. Additionally, since the same configuration as that of the second embodiment (FIG. 30) is used except that the twin coil is used as a coil, with two coil portions (not illustrated) and three pad regions PD2 being utilized, the detailed description thereof will be omitted.

<Second Application Example>

In the first embodiment, the transformer formation region 1A and the like are designed to be surrounded by the deep trench isolation film DTI that penetrates the silicon layer Sc so as to suppress variations in the well electric potential of the transformer formation region 1A; however, the well electric potential of the transformer formation region 1A may also be fixed.

Figure 36:
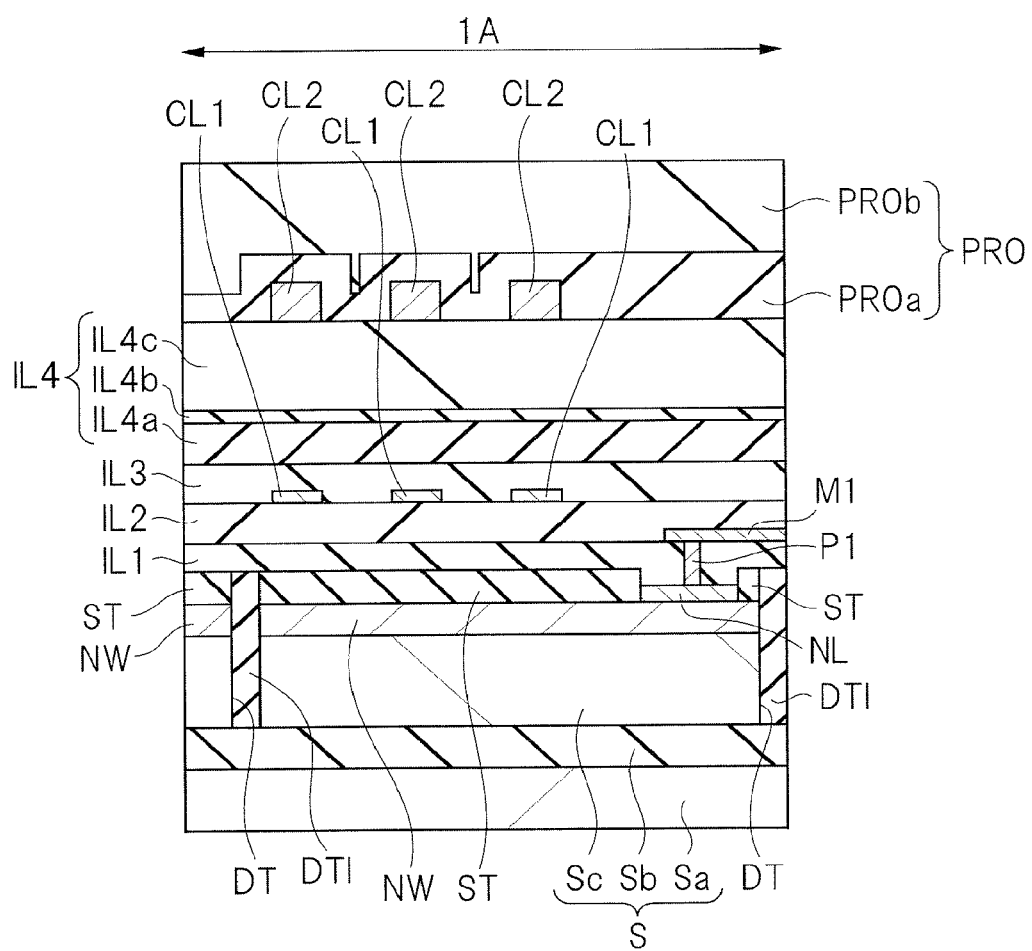
FIG. 36 is a cross-sectional view illustrating main parts of a configuration in accordance with a second application example of the third embodiment.

FIG. 36 is a cross-sectional view illustrating main parts of a configuration of a semiconductor device in accordance with a second application example of the present embodiment. As shown in FIG. 36, in the semiconductor device of the second application, an n-type well NW is formed in the silicon layer Sc of the transformer formation region 1A.

Moreover, an n-type semiconductor region NL is formed in this n-type well NW, and this n-type semiconductor region NL is connected to the wiring M1 through the plug P1. For example, a ground potential line and the n-type semiconductor region NL are connected to each other through the wiring M1. Thus, the n-type well NW of the transformer formation region 1A is fixed to the ground potential. In this manner, by forming the transformer formation region 1A into a configuration being surrounded by the deep trench isolation film DT1 penetrating the silicon layer Sc and also by setting the n-type well NW of the transformer formation region 1A to a predetermined electric potential (for example, ground potential), variations in the capacity between the coil CL1 of the lower layer and the p-type well PW can be further reduced, thereby making it possible to improve transmission precision of an electric signal between the coils and also to stabilize operations.

The n-type semiconductor region NL can be formed, for example, by using the same ion implanting process as that of the source-drain region SD of the MISFET (NT) explained in the first embodiment. Moreover, the plug P1 to be connected to the n-type semiconductor region NL and the wiring M1 can be formed in the same manner as in the plug P1 and the wiring M1 explained in the first embodiment.

Moreover, a predetermined electric potential (for example, ground potential) may also be applied to the support substrate Sa. In this manner, by fixing the electric potential of the support substrate Sa to the predetermined electric potential (for example, ground potential), variations in the well electric potential of the transformer formation region 1A can also be reduced.

Moreover, by setting all the n-type semiconductor region NL, the n-type well NW and the silicon layer Sc to the n-type, the fixed electric potential can be more firmly maintained. Furthermore, by setting the regions corresponding to the n-type semiconductor region NL, the n-type well NW and the silicon layer Sc to the p-type also, it is possible to firmly maintain the fixed electric potential.

<Third Application Example>

Figure 37:
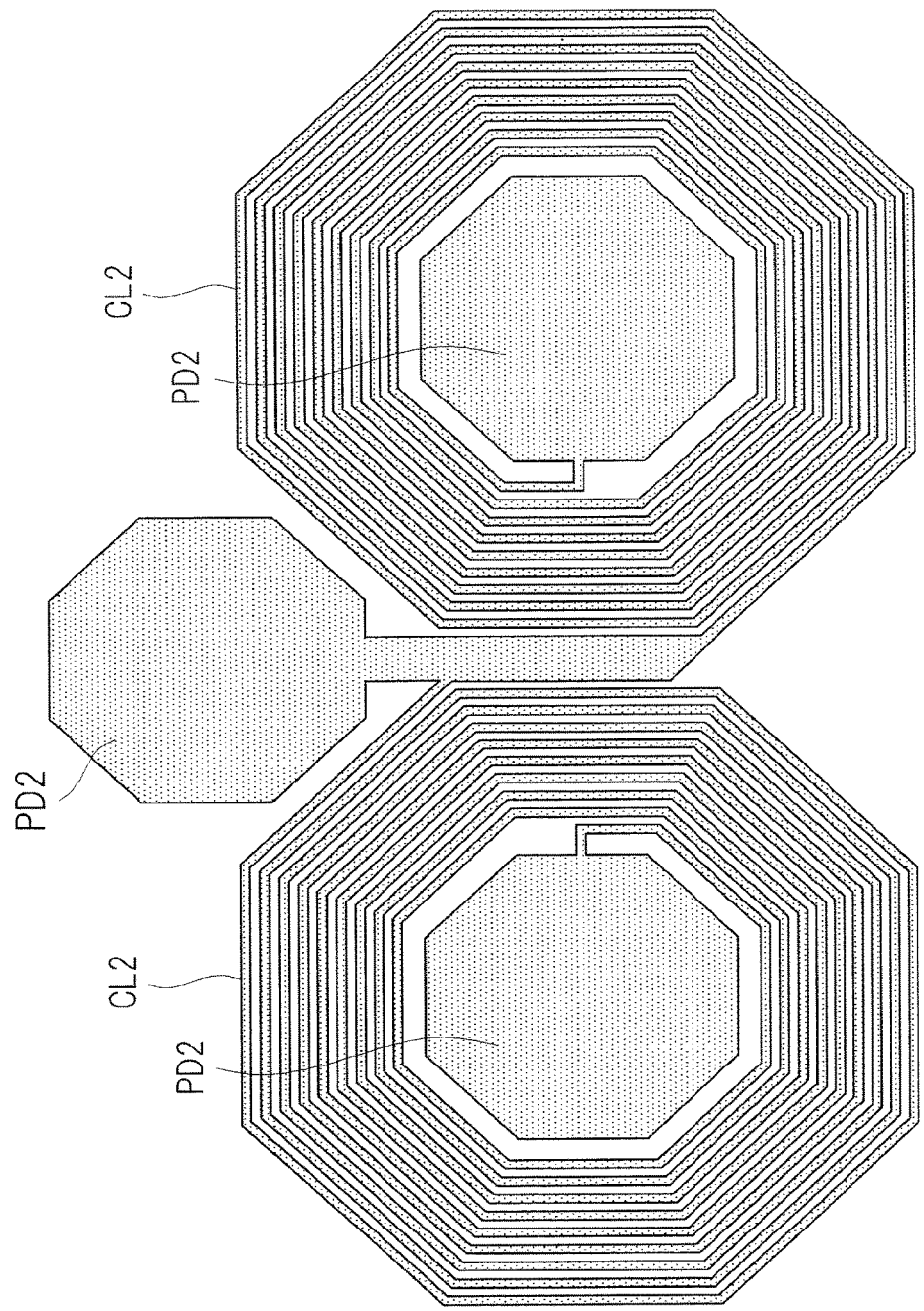
FIG. 37 is a plan view illustrating a configuration of a coil in accordance with a third application example of the third embodiment.

FIG. 37 is a plan view illustrating a configuration of a coil in accordance with a third application example of the present embodiment. The coil CL2 shown in FIG. 37 has two coil portions. That is, a string of coil portion wound clockwise substantially centered on the first pad region PD2 and a string of coil portion wound counter-clockwise substantially centered on the second pad region PD2 are prepared, and end portions on the outside of the two coil portions are respectively connected to the third pad region PD2.

Moreover, in FIG. 37, the shape of the pad region PD2 is set to an octagonal shape. In this manner, by setting the shape of one roll of a coil to the octagonal shape, the shape of the pad region PD2 disposed inside thereof may also be set to an octagonal shape so as to correspond to the shape of the roll of a coil. Furthermore, the pad region PD2 to be installed between the two coil portions may be set to an octagonal shape so as to correspond to the roll shape of the outermost circumference of the two coils.

In this manner, by forming the shape of the pad region PD2 to be disposed inside the coil portion as well as between the coils into a shape corresponding to the shape of the roll of the coil, it becomes possible to reduce the area of the coil.

Additionally, in the present application example, the shape of the pad region PD2 is exemplified as an octagonal shape; however, another polygonal shape having more sides than those of a square shape, such as a hexagonal shape, may be used. Moreover, in the polygonal shape, such a shape having a small difference between the lengths of the respective sides, which is closer to a regular pentagonal shape, is preferably used.

<Fourth Application Example>

Figure 38A:
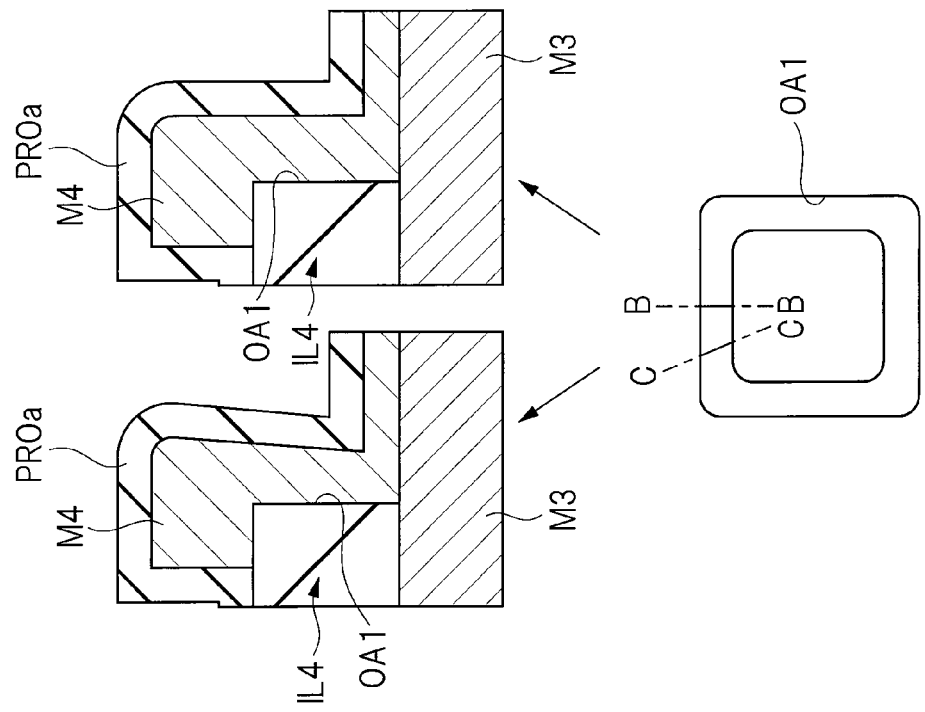
FIGS. 38A and 38B are diagrams illustrating a relationship between a shape of an opening on a pad region and a shape of a wiring.
Figure 38B:
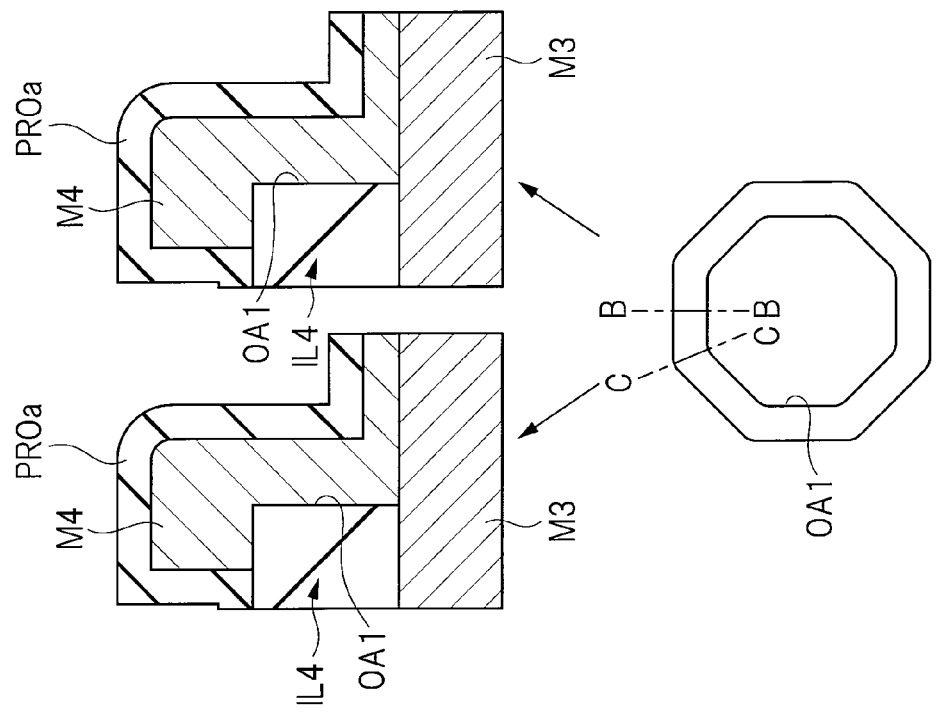

In the present application example, an explanation will be given to the shape of the opening portion OA1 on the pad region PD1. FIGS. 38A and 38B are diagrams showing a relationship between the shape of the opening on the pad region and the shape of the wiring. FIG. 38A shows a state in which the planar shape of the opening portion OA1 on the pad region PD1 is formed into an octagonal shape, and FIG. 38B shows a state in which the planar shape of the opening portion OA1 on the pad region PD1 is formed into a square shape.

As shown in FIG. 38B, in the case when the planar shape of the opening portion OA1 on the pad region PD1 is formed into the square shape, the wiring M4 is formed into an overhang shape at each of corner portions (C-C portions) of the square shape, with the result that the insulating film (in this case, silicon nitride film PROa) covering the wiring M4 tends to have a crack. On the other hand, the film thickness difference in the wiring M4 is small along the straight portions (B-B portions) of the square shape.

In contrast, in the case when the planar shape of the opening portion OA1 on the pad region PD1 is formed into an octagonal shape as shown in FIG. 38A, the overhang shape of the wiring M4 is improved on each of the corner portions (C-C portions) of the octagonal shape so that the shape difference relative to each of the straight portions (B-B portions) of the octagonal shape is mitigated.

In this manner, by forming the planar shape of the opening portion OA1 on the pad region PD1 into another polygonal shape having more sides than those of the square shape, such as an octagonal shape, a hexagonal shape or the like, the angle of the corner can be made greater, thereby making it possible to reduce the occurrence of cracks at the corner portions of the insulating film (in this case, silicon nitride film PROa).

In particular, in the case when the film thickness of the insulating film between the coils CL1 and CL2 is made greater so as to ensure a proper insulation withstand voltage between the coils CL1 and CL2, the planar shape of the opening portion OA1 on the pad region PD1 has to be made larger and deeper. For this reason, since with respect to the planar shape of the opening portion OA1 on the pad region PD1, the ratio of the corner portions to be formed into a round shape becomes smaller in comparison with that of the straight line portions, a crack tends to easily occur at the corner portion of the insulating film (in this case, silicon nitride film PROa). Moreover, in the case when an Al material is used as the material for the wiring M4, since the Al material is softer than the insulating film (in this case, silicon nitride film PROa) to be formed on the upper portion thereof, the change in the insulating film (in this case, silicon nitride film PROa) fails to follow the change in the Al material, easily causing a crack.

In contrast, by forming the planar shape of the opening portion OA1 on the pad region PD1 into a polygonal shape having more sides than those of the square shape, it becomes possible to make the angle of each of corner portions greater, and consequently to reduce the occurrence of a crack in the insulating film at each of the corner portions.

Figure 39:
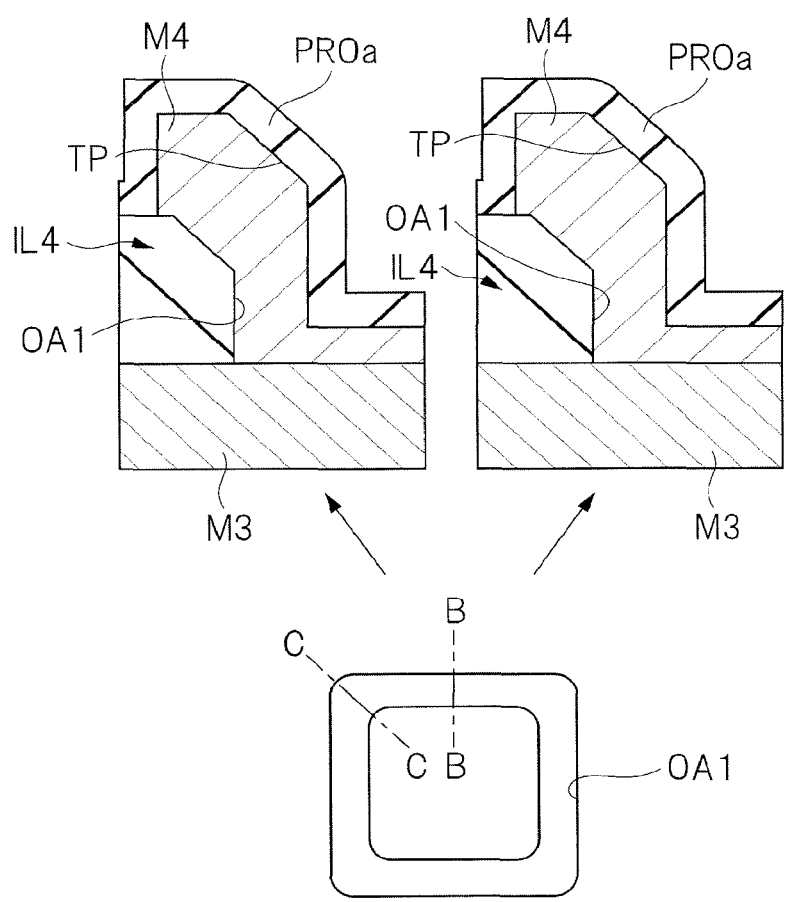
FIG. 39 is a diagram illustrating a cross-sectional shape of the opening on the pad region.

FIG. 39 is a diagram illustrating a cross-sectional shape of the opening on the pad region. As explained with reference to FIG. 38B, in the case when the planar shape of the opening portion OA1 on the pad region PD1 is formed into a square shape, the wiring M4 is formed into an overhang shape at each of corner portions (C-C portions), with the result that the insulating film (in this case, silicon nitride film PROa) covering the wiring M4 tends to have a crack. Therefore, as shown in FIG. 39, the upper portion of the side face of the opening portion OA1 may be formed into a tapered shape. In other words, a tapered face TP is formed on the upper portion of the side face of the opening portion OA1. The angle (taper angle) between the tapered face TP and the wiring M3 is set to, for example, about 45°, and is more preferably adjusted in a range from 20° or more to 90° or less.

In this manner, by forming the upper portion of the side face of the opening portion OA1 into a tapered shape, it becomes possible to reduce the occurrence of a crack in the insulating film (in this case, silicon nitride film PROa) covering the wiring M even when the planar shape of the opening portion OA1 has a square shape.

In order to form the upper portion of the side face of the opening portion OA1 into a tapered shape in this manner, for example, after in the above-mentioned etching process, the interlayer insulator IL4 has been etched by its film thickness corresponding to about 0.2 μm to 0.3 μm (in this case, 0.25 μm (about 3%)) by a wet etching process with a photoresist film (not illustrated) being used as a mask, the remaining interlayer insulator IL4 is etched until the wiring M3 (pad region PD1) has been exposed by a dry etching process with a photoresist film being used as a mask. For example, in the wet etching process, a hydrofluoric acid solution (hydrofluoric acid) is used, and in the dry etching process, a fluorine-based gas may be used.

Additionally, the entire side face of the opening portion OA1 may be formed into a tapered shape. Moreover, with the planar shape of the opening portion OA1 being formed into an octagonal shape, the upper portion of the side face of the opening portion OA1 may be formed into a tapered shape.

(Fourth Embodiment)

Figure 40:
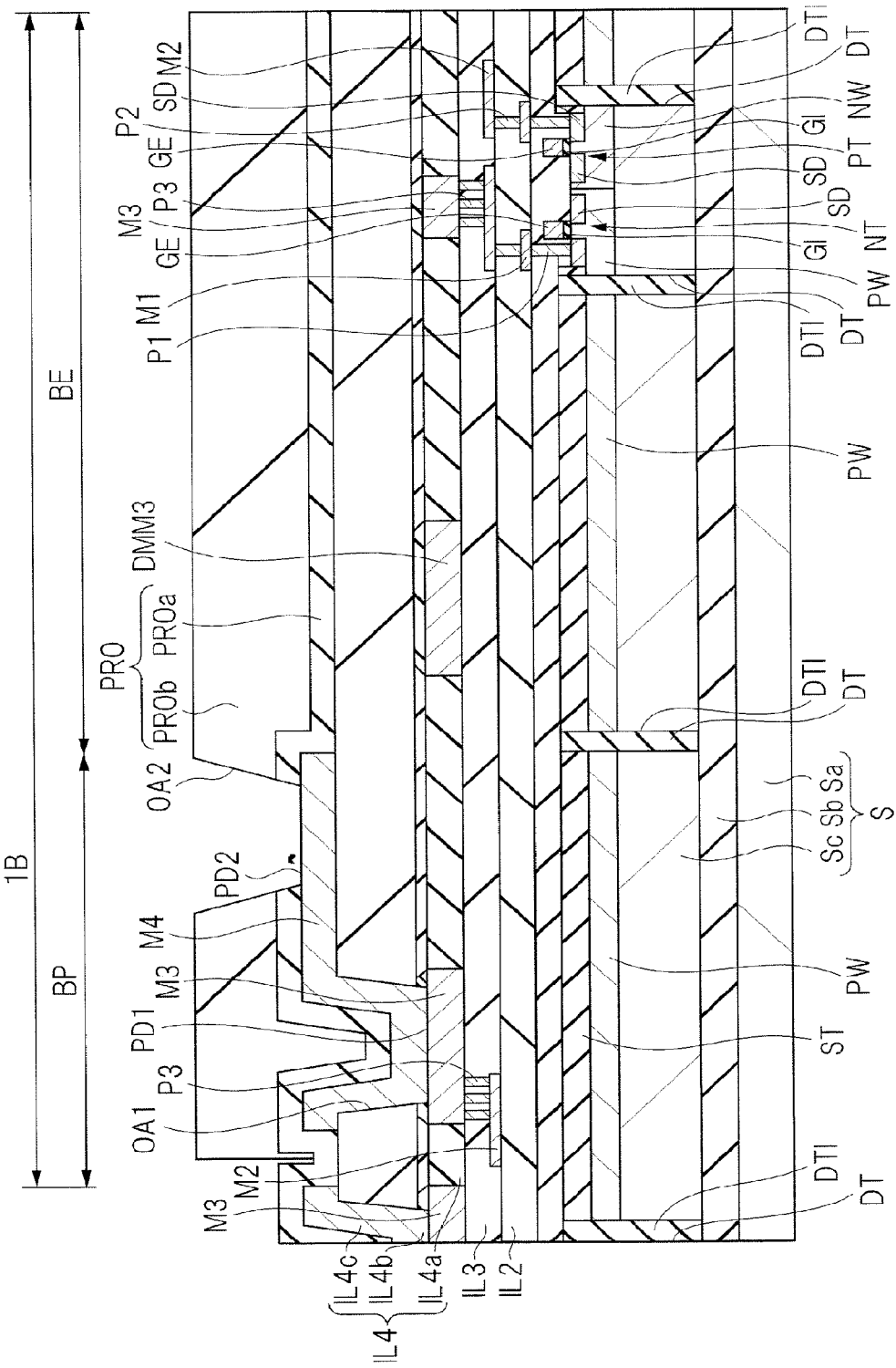
FIG. 40 is a cross-sectional view illustrating a configuration of a semiconductor device in accordance with a fourth embodiment.
Figure 41:
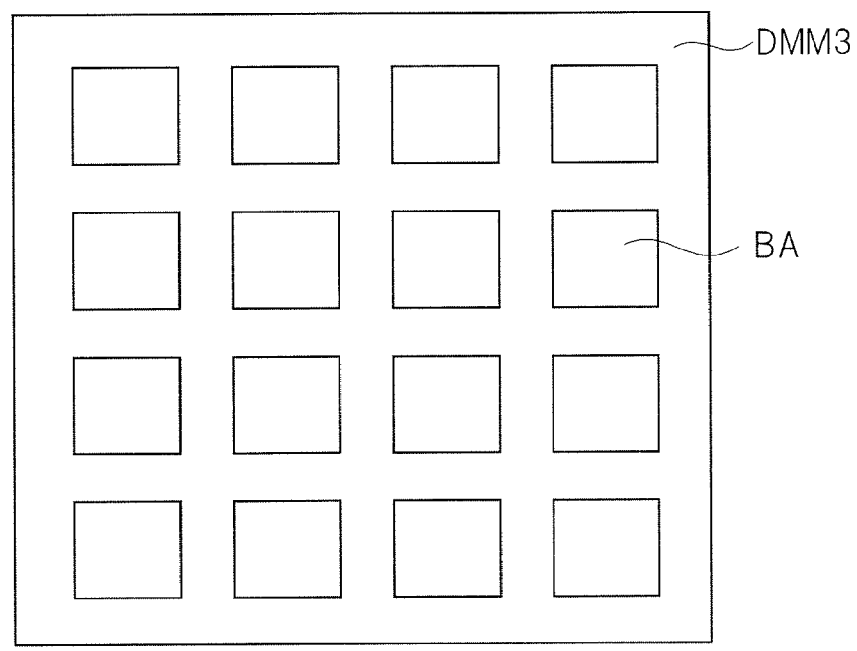
FIG. 41 is a plan view illustrating a shape of a dummy wiring of the semiconductor device of the fourth embodiment.

In the present embodiment, an explanation will be given to a dummy wiring fur use in dividing the HDP film IL4a or the interlayer insulator IL4. FIG. 40 is a cross-sectional view illustrating a configuration of a semiconductor device of the present embodiment. FIG. 41 is a plan view illustrating a shape of the dummy wiring of the semiconductor device of the present embodiment. Since the configurations other than the dummy wiring DMM3 are the same as those of the first embodiment, the detailed explanation thereof will be omitted.

As shown in FIG. 40, in the present embodiment, the dummy wiring DMM3 that is a wiring on the same layer as the wiring M3 is disposed in the element formation region BE. As shown in FIG. 41, for example, the planar shape of the dummy wiring DMM3 may be formed into a lattice shape. For example, the dummy wiring DMMs is formed into a lattice shape in a manner so as to surround block areas BA of the plural logic circuits forming a peripheral circuit. Elements such as MISFETs (NT, PT) and the like are formed in the block areas BA.

By forming the dummy wiring DMM3 in this manner, the HDP film IL4a can be divided so that a film stress caused by the HDP film IL4a can be mitigated. Additionally, the planar shape of the dummy wiring DMM3 is not necessarily limited by the above-mentioned lattice shape, and may be placed in a scattered manner by utilizing the gaps between the block areas BA of the logic circuit. The dummy wiring DMM3 of this type is used for wire-connecting the semiconductor elements such as MISFETs or the like, and is not used for forming logic circuits. Therefore, the wiring does not contribute to circuit operations, and the dummy wiring DMM3 is fixed to a floating state or a predetermined electric potential.

Figure 42:
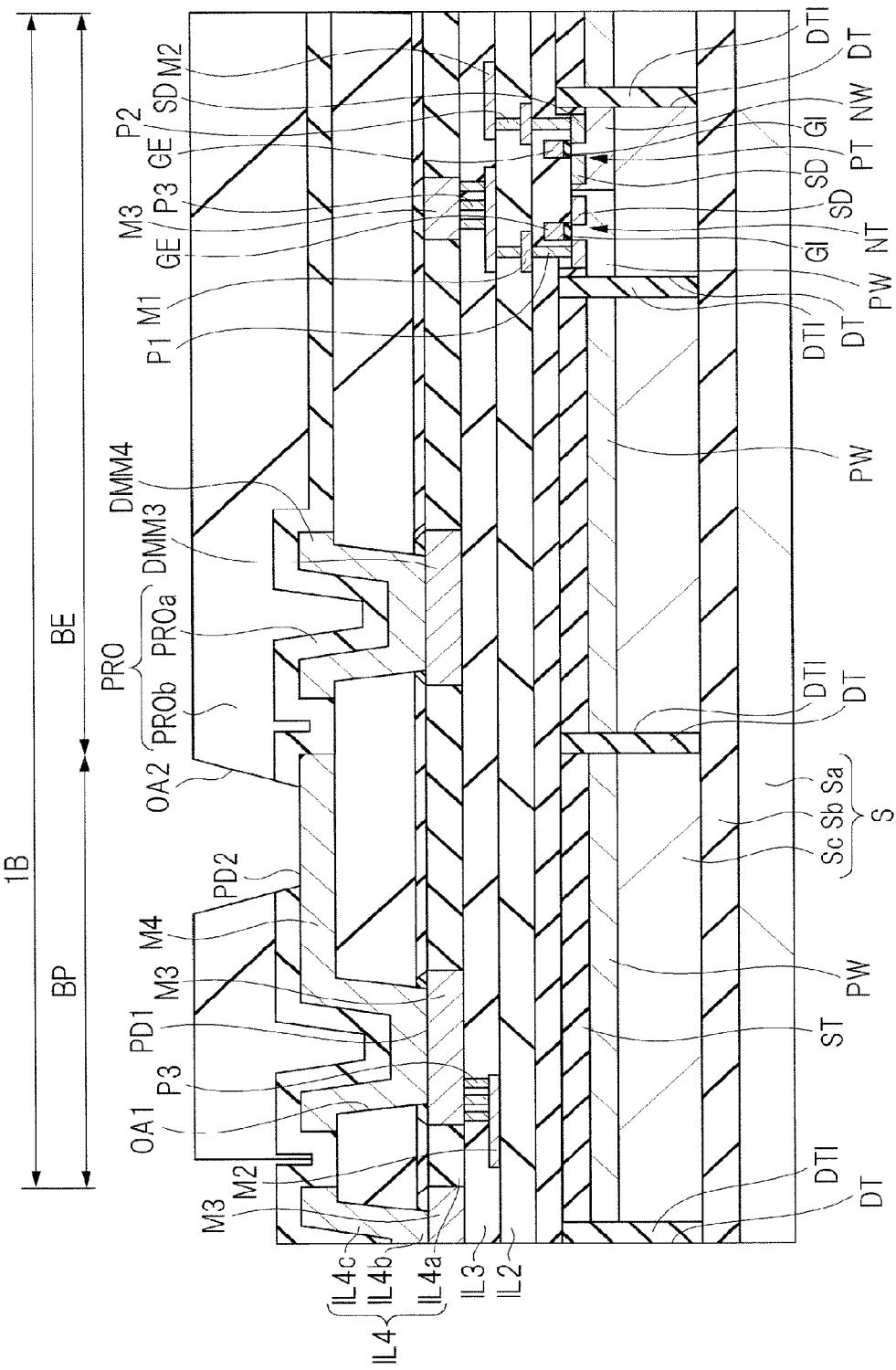
FIG. 42 is a cross-sectional view illustrating another configuration of the semiconductor device of the fourth embodiment.

FIG. 42 is a cross-sectional view illustrating another configuration of the semiconductor device of the present embodiment. The semiconductor device shown in FIG. 42 is provided with stacked wirings composed of the dummy wiring DMM3 that is a wiring on the same layer as the wiring M3 and the dummy wiring DMM4 that is a wiring on the same layer as the wiring M4. By installing the dummy wirings (DMM3, DMM4) composed of stacked wirings, the entire interlayer insulator IL4 can be divided so that a film stress caused by the interlayer insulator IL4 formed with a comparatively thick thickness can be mitigated. The planar shape of the dummy wirings (DMM3, DMM4) composed of stacked wirings is not particularly limited, and is formed into, for example, a lattice shape shown in FIG. 41.

(Fifth Embodiment)

Figure 43:
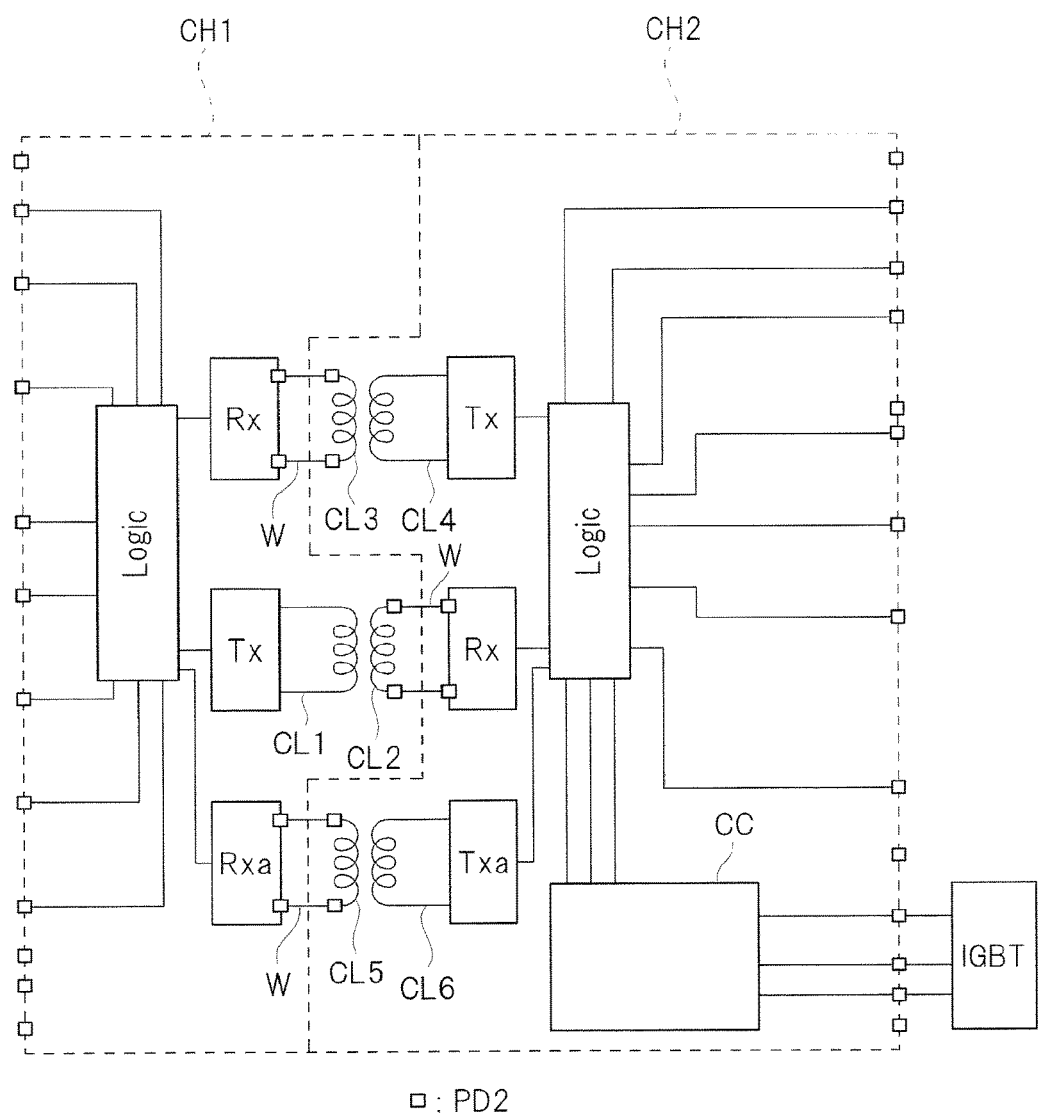
FIG. 43 is a block diagram illustrating a configuration of a semiconductor device in accordance with a fifth embodiment.

FIG. 43 is a block diagram illustrating a configuration of a semiconductor device in accordance with the present embodiment. FIG. 44 and FIG. 45 are plan views showing a configuration of the semiconductor device of the present embodiment. FIG. 44 shows a configuration in which the signal coil explained in the first embodiment is used, and FIG. 45 shows a configuration in which the twin coil explained in the third embodiment is used.

In the same manner as that in the second embodiment, in the semiconductor devices shown in FIG. 43 and FIG. 44 as well, the chip CH1 and the chip CH2 are formed into one package.

As shown in FIG. 43 and FIG. 44, the chip CH1 is provided with a transformer composed of a coil CL1 connected to a transmission circuit Tx and a coil CL2. The coil CL2 is connected to a receiving circuit Rx of the chip CH2 with the pad region PD2 and the wire W interposed therebetween.

Moreover, in the same manner as in the second embodiment, the chip CH1 is provided with the receiving circuit Rx and the logic circuit Logic. The logic circuit Logic is connected to the transmission circuit Tx and the receiving circuit Rx of the chip CH1, and the logic circuit Logic is connected to the plural pad regions PD2.

In the same manner as in the second embodiment, the chip CH2 is provided with a transformer composed of a coil CL4 connected to the transmission circuit Tx and a coil CL3. The coil CL3 is connected to a receiving circuit Rx of the chip CH1 with the pad region PD2 and the wire W interposed therebetween. Moreover, the chip CH2 is provided with the receiving circuit Rx and the logic circuit Logic. The logic circuit Logic is connected to the transmission circuit Tx and the receiving circuit Rx of the chip CH2, and the logic circuit Logic is connected to the plural pad regions PD2.

To the semiconductor device of the present embodiment, a function for transmitting and receiving a temperature control signal is added, and transformers (CL5, CL6), a receiving circuit Rxa and a transmission circuit Txa are installed. Additionally, since the other configurations are the same as those of the second embodiment, the detailed description thereof will be omitted.

That is, to the chip CH2, a transformer composed of the coil CL6 connected to the transmission circuit Txa and the coil CL5 is further added. Moreover, the transmission circuit Txa is further added to the chip CH2. The transmission circuit transmits a temperature control signal.

In this manner, in the present embodiment, two transformers are installed on the chip CH2 on a high voltage region HC side, and one transformer (CL1, CL2) is installed on the chip CH1 on a low voltage region LC side. The chip CH2 is larger than the chip CH1.

In the present embodiment, in the chip CH1, one transformer is disposed substantially in the center portion along the long side of the chip CH1, and a receiving circuit Rx of the chip CH2 to be connected to the transformer is disposed substantially in the center portion along the long side of the chip CH2. Moreover, the two transformers of the chip CH2 are disposed on the both sides of the receiving circuit Rx disposed substantially in the center portion along the long side of the chip CH2. Moreover, on the both sides of the transformer disposed substantially in the center portion along the long side of the chip CH1, two receiving circuits Rx and Rxa are disposed. The two transformers of the chip CH2 and the two receiving circuits Rx and Rxa of the chip CH1 are disposed so as to be made face to face with each other.

As shown in FIG. 43, for example, a temperature control signal outputted from the temperature sensor of an IGBT circuit is inputted to the chip CH2 through the pad region PD2. This temperature control signal is inputted to a logic circuit Logic through a control circuit CC, and further transmitted to the transmission circuit TXa. Moreover, the temperature control signal is inputted to the receiving circuit Rxa of the chip CH2 through the transformer composed of the coils CL5 and CL6.

In this manner, in the case when the three transformers are provided, the pad region PD2 on the transmission side, that is, the pad region PD2 connected to the transformer, and the pad region PD2 on the receiving side, that is, the receiving circuit Rx, are disposed so as to be correspondingly combined with each other. Thus, wires W for use in connecting the pad region PD2 on the transmission side and the pad region PD2 on the receiving side are prevented from crossing each other and consequently prevented short circuits from occurring between the wires W, and the connection by the wires can be easily carried out. Moreover, the electrical connection can be made by using short wires W.

The same effect can be obtained in the case of using the twin coil shown in FIG. 45. That is, in the chip CH1, one transformer is disposed substantially in the center portion along the long side of the chip CH1, and the receiving circuit Rx of the chip CH2 to be connected to this transformer is disposed substantially in the center portion along the long side of the chip CH2. Moreover, the two transformers of the chip CH2 are disposed on the both sides of the receiving circuit Rx disposed substantially in the center portion along the long side of the chip CH2. Furthermore, the two receiving circuits Rx and Rxa are disposed on the both sides of the transformer disposed substantially in the center portion along the long side of the chip CH1. The two transformers of the chip CH2 and the two receiving circuits Rx and Rxa of the chip CH1 are respectively disposed so as to be made face to face with each other. Even in the case of using the twin coil, by adopting the above-mentioned layout, it is possible to prevent the wires W from being disposed in a crossing manner, and consequently to make an electrical connection by using short wires W. Additionally, the use of the single coil is more advantageous than the use of the twin coil from the viewpoint of reducing the area of the semiconductor device.

For example, in the first embodiment, the wirings M1 to M3 are formed by using a patterning process; however, by using a so-called "damascene method" in which a conductive film is buried in wiring grooves formed in the interlayer insulating film, the wirings M1 to M3 may be formed.

Moreover, in first embodiment, explanations have been given by exemplifying the SOI substrate; however, a so-called "bulk substrate" may be used.

[Supplementary Note 1]

A semiconductor device including:

a substrate having a first region, a second region and a third region that surrounds the first region and the second region;

a first insulating film formed on the upper portion of the substrate;

a first coil and a first wiring formed on the first insulating film;

a second insulating film formed on the first coil and the first wiring;

a second wiring formed on the second insulating film;

a third insulating film formed on the second wiring; and a second coil and a third wiring formed on the third insulating film, in which the first coil and the second coil are formed in the first region, the second wiring and an active element connected to the second wiring are formed in the second region, and a first surrounding wiring which is formed into a shape so as to surround the first region and the second region and formed of a wiring formed as the same layer as the second wiring, is further prepared in the third region.

[Supplementary Note 2]

The semiconductor device according to Supplementary Note 1, further including: a second surrounding wiring which is formed on the first surrounding wiring, and is formed on the third region into a shape so as to surround the first region and the third region, and formed of a wiring formed as the same layer as the third wiring.

[Supplementary Note 3]

A semiconductor device including: a first semiconductor chip and a second semiconductor chip, in which the first semiconductor chip includes:
a first transmission circuit;
a first transformer having a first coil connected to the first transmission circuit and a second coil;
a first receiving circuit;
a first receiving pad connected to the first receiving circuit;
a second receiving circuit; and
a second receiving pad connected to the second receiving circuit, and the second semiconductor chip comprises:
a third receiving circuit;
a third receiving pad connected to the third receiving circuit;
a second transmission circuit;
a second transformer having a third coil connected to the second transmission circuit and a fourth coil;
a third transmission circuit; and
a third transformer having a fifth coil connected to the third transmission circuit and a sixth coil, and
in the semiconductor device, the first receiving pad and the second receiving pad are disposed on the both sides of the second coil of the first semiconductor chip, the fourth coil and the sixth coil are disposed on the both sides of the third receiving pad of the second semiconductor chip, with the second coil and the third receiving pad being electrically connected to each other through a first conductive connecting member, with the fourth coil and the first receiving pad being electrically connected to each other through a second conductive connecting member, and with the sixth coil and the second receiving pad being electrically connected to each other through a third conductive connecting member, so that the first connecting member, the second connecting member and the third connecting member are prevented from crossing one after another.

1A Transformer formation region
1B Peripheral circuit formation region
1C Seal ring formation region
BA Block area
BE Element formation region
BP Pad formation region
CC Control circuit
CH1 Chip
CH2 Chip
CL1 Coil
CL2 Coil
CL3 Coil
CL4 Coil
CL5 Coil
CL6 Coil
DM3 Distance
DMM3 Dummy wiring
DMM4 Dummy wiring
DP1 Die pad
DP2 Die pad
DM4 Distance
DT Groove
DT1 Deep trench isolation film
GE Gate electrode
GI Gate insulating film
HC High voltage region
IL1 Interlayer insulator
IL2 Interlayer insulator
IL3 Interlayer insulator
IL4 Interlayer insulator
IL4a HDP film
IL4b P-TEOS film
IL4c P-TEOS film
L1 Line
L2 Line
LC Low voltage region
M1 Wiring
M2 Wiring
M3 Wiring
M4 Wiring
NT MISFET
NW n-type well
OA Opening
OA1 Opening
OA2 Opening
P1 Plug
P2 Plug
P3 Plug
PC Peripheral circuit
PD1 Pad region
PD2 Pad region
PL p-type semiconductor region
PRO Protective film
PROa Silicon nitride film
PROb Polyimide film
PT MISFET
Rx Receiving circuit
Rxa Receiving circuit
PW p-type well
S Substrate
Sa support substrate
Sb Insulating layer
Sc Silicon layer
SD Source-drain region
ST Device isolation region
TP Tapered face
Tx Transmission circuit
Txa Transmission circuit
W Wire

What is claimed is:

1. A semiconductor device comprising:
a substrate having a main surface and a rear surface opposite the main surface;
a first insulating film formed on the main surface of the substrate;
a first coil and a first wiring formed on the first insulating film;
a second insulating film formed on the first coil and the first wiring;
a second wiring formed on the second insulating film;
a third insulating film formed on the second wiring;
a groove formed in the third insulating film and separating the third insulating film in a first portion of the third insulating film and a second portion of the third insulating film in a plan view;
a second coil formed on the first portion of the third insulating film; and
a third wiring formed on the second portion of the third insulating film and in the groove,
wherein the first coil is overlapped with the second coil in a cross section view,
wherein the first and second coils are not overlapped with the first, second, and third wirings,
wherein the groove surrounds the first and second coils in the plan view,
wherein the groove overlaps with the second wiring in the cross section view, and wherein the third wiring is connected to the second wiring in the groove in the cross section view.

2. The semiconductor device according to claim 1, wherein the second wiring surrounds the first and second coils in the plan view.

3. The semiconductor device according to claim 2, the first wiring is overlapped with the second wiring in the cross section view, and
wherein the first wiring is connected to the second wiring via a plug which is formed in the second insulating film in the cross section view.

4. The semiconductor device according to claim 3, wherein the first wiring surrounds the first and second coils in the plan view.

5. The semiconductor device according to claim 4, wherein the second wiring separates the third insulating film in a first portion of the third insulating film and a second portion of the third insulating film in the cross section view.

6. The semiconductor device according to claim 1, wherein a thickness of the second wiring is greater than a thickness of the first wiring in a thickness direction of the substrate in the cross section view.

7. The semiconductor device according to claim 6, wherein a thickness of the third wiring is greater than the thickness of the first wiring in the thickness direction of the substrate in the cross section view.

8. The semiconductor device according to claim 7, wherein a thickness of the third insulating film is greater than a thickness of the second insulating film in the thickness direction of the substrate in the cross section view, and
wherein a depth of the groove is greater than the thickness of the second wiring in the thickness direction of the substrate in the cross section view.

9. The semiconductor device according to claim 1, wherein each of the second insulating film and the third insulating film is formed of an inorganic insulating film.

10. A semiconductor device comprising:
a first semiconductor chip mounted on a first die pad;
a second semiconductor chip mounted side by side with the first semiconductor chip on a second die pad;
a plurality of leads arranged outside the first and the second die pads;
the plurality of leads including a plurality of first leads which are arranged closer to the first semiconductor chip than the second semiconductor chip, and a plurality of second leads which are arranged closer to the second semiconductor chip than the first semiconductor chip and which are arranged opposite to the first leads;
a plurality of bonding wires including a plurality of first wires which connect the first leads and the first semiconductor chip, a plurality of second wires which connect the second leads and the second semiconductor chip, and a plurality of third wires which connect the first and the second semiconductor chips; and
a resin sealing the first and the second semiconductor chips, the first and the second die pads, the bonding wires, and a portion of each of the leads,
wherein the first die pad is not electrically connected with the second die pad,
wherein the first semiconductor chip comprises:
a substrate having a main surface and a rear surface opposite the main surface;
a first insulating film formed on the main surface of the substrate;
a first coil and a first wiring formed on the first insulating film;
a second insulating film formed on the first coil and the first wiring;
a second wiring formed on the second insulating film;
a third insulating film formed on the second wiring;
a groove formed in the third insulating film and separating the third insulating film in a first portion of the third insulating film and a second portion of the third insulating film in a plan view;
a second coil formed on the first portion of the third insulating film; and
a third wiring formed on the second portion of the third insulating film and in the groove,
wherein the first coil is overlapped with the second coil in a cross section view,
wherein the first and second coils are not overlapped with the first, second, and third wirings,
wherein the groove surrounds the first and second coils in the plan view,
wherein the groove overlaps with the second wiring in the cross section view, and
wherein the third wiring is connected to the second wiring in the groove in the cross section view.

11. The semiconductor device according to claim 10, wherein the second wiring surrounds the first and second coils in the plan view.

12. The semiconductor device according to claim 11, wherein the first wiring is overlapped with the second wiring in the cross section view, and
wherein the first wiring is connected to the second wiring via a plug which is formed in the second insulating film in the cross section view.

13. The semiconductor device according to claim 12, wherein the first wiring surrounds the first and second coils in the plan view.

14. The semiconductor device according to claim 13, wherein the second wiring separates the third insulating film in a first portion of the third insulating film and a second portion of the third insulating film in the cross section view.

15. The semiconductor device according to claim 10, wherein a thickness of the second wiring is greater than a thickness of the first wiring in a thickness direction of the substrate in the cross section view.

16. The semiconductor device according to claim 15, wherein a thickness of the third wiring is greater than the thickness of the first wiring in the thickness direction of the substrate in the cross section view.

17. The semiconductor device according to claim 16, wherein a thickness of the third insulating film is greater than a thickness of the second insulating film in the thickness direction of the substrate in the cross section view, and
wherein a depth of the groove is greater than the thickness of the second wiring in the thickness direction of the substrate in the cross section view.

18. The semiconductor device according to claim 10, wherein each of the second insulating film and the third insulating film is formed of an inorganic insulating film.

* * * * *